（12）United States Patent
Ohta et al.

(10) Patent No.: US 9,533,888 B2
(45) Date of Patent: Jan. 3, 2017

(54) GRAPHITE FILM

(75) Inventors: Yusuke Ohta, Settsu (JP); Takashi Inada, Settsu (JP); Makoto Kutsumizu, Settsu (JP); Yasushi Nishikawa, Settsu (JP); Satoshi Katayama, Settsu (JP)

(73) Assignee: KANEKA CORPORATION, Osaka-Shi (JP)

( * ) Notice: Subject to any disclaimer, the term of this patent is extended or adjusted under 35 U.S.C. 154(b) by 198 days.

(21) Appl. No.: 14/240,221

(22) PCT Filed: Aug. 17, 2012

(86) PCT No.: PCT/JP2012/070890
§ 371 (c)(1),
(2), (4) Date: Mar. 24, 2014

(87) PCT Pub. No.: WO2013/027667
PCT Pub. Date: Feb. 28, 2013

(65) Prior Publication Data
US 2014/0220308 A1    Aug. 7, 2014

(30) Foreign Application Priority Data

Aug. 24, 2011   (JP) .................................. 2011-182654
Aug. 24, 2011   (JP) .................................. 2011-182655
Nov. 30, 2011   (JP) .................................. 2011-262458

(51) Int. Cl.
*C01B 31/04* (2006.01)
*H01L 23/373* (2006.01)
(Continued)

(52) U.S. Cl.
CPC ............ *C01B 31/04* (2013.01); *C04B 35/522* (2013.01); *C04B 35/524* (2013.01); (Continued)

(58) Field of Classification Search
CPC .................. C01B 31/04; C04B 35/522; H01L 2924/0002; H01L 23/373; Y10T 428/24628; Y10T 428/24653
(Continued)

(56) References Cited

U.S. PATENT DOCUMENTS 5,091,025 A    2/1992 Murakami et al.
5,198,063 A    3/1993 Howard et al.
(Continued)

FOREIGN PATENT DOCUMENTS

CN    101687647 A    3/2010
JP    3-75211 A    3/1991
(Continued)

OTHER PUBLICATIONS

Machine translation into English of WO 2010150300.*
(Continued)

*Primary Examiner* — Joanna Pleszczynska
(74) *Attorney, Agent, or Firm* — Birch, Stewart, Kolasch & Birch, LLP

(57) ABSTRACT

It is possible to obtain a graphite film with its shape controlled, by performing a sag controlling step of controlling temperatures of a polymer film at both widthwise ends and a temperature of the polymer film in a widthwise middle portion within a temperature range from a starting temperature of thermal decomposition of the polymer film to a sag controlling temperature of the polymer film.

2 Claims, 38 Drawing Sheets

(51) Int. Cl.
  *C04B 35/52* (2006.01)
  *C04B 35/524* (2006.01)
  *C04B 35/622* (2006.01)

(52) U.S. Cl.
  CPC ...... *C04B 35/62218* (2013.01); *H01L 23/373* (2013.01); *C04B 2235/6562* (2013.01); *H01L 2924/0002* (2013.01); *Y10T 428/24628* (2015.01); *Y10T 428/24653* (2015.01)

(58) Field of Classification Search
  USPC .................. 428/174, 408, 220, 177; 423/448
  See application file for complete search history.

(56) References Cited

U.S. PATENT DOCUMENTS

| | | | |
|---|---|---|---|
| 5,830,809 | A | 11/1998 | Howard et al. |
| 2010/0196716 | A1 | 8/2010 | Ohta et al. |
| 2011/0165379 | A1 | 7/2011 | Ohta et al. |
| 2012/0107222 | A1 | 5/2012 | Yuki et al. |
| 2012/0121880 | A1 | 5/2012 | Ohta et al. |
| 2013/0001350 | A1 | 1/2013 | Ohta et al. |
| 2013/0119571 | A1 | 5/2013 | Ohta et al. |
| 2013/0189180 | A1 | 7/2013 | Ohta et al. |

FOREIGN PATENT DOCUMENTS

| | | |
|---|---|---|
| JP | 6-24872 A | 2/1994 |
| JP | 2006-327907 A | 12/2006 |
| TW | 201121886 A1 | 7/2011 |
| WO | 2010/150300 A1 | 12/2010 |
| WO | 2011/102107 A1 | 8/2011 |
| WO | 2011/148581 A1 | 12/2011 |

OTHER PUBLICATIONS

International Preliminary Report on Patentability and English translation of the Written Opinion of the International Searching Authority (Forms PCT/IB/338, PCT/IB/373 and PCT/ISA/237), dated Mar. 6, 2014, for International Application No. PCT/JP2012/070890.
International Search Report issued in PCT/JP2012/070890 mailed Oct. 23, 2012.
Written Opinion of the International Searching Authority issued in PCT/JP2012/070890 mailed Oct. 23, 2012.

* cited by examiner

GRAPHITE FILM

TECHNICAL FIELD

The present invention relates to a graphite film and a method for producing a graphite film.

BACKGROUND ART

Graphite films are classified into: graphite films (also referred to as "natural graphite sheets") produced by an expanding method; and graphite films (also referred to as "fired polymer-based graphite film") produced by polymer thermal decomposition.

Fired Polymer-based graphite films are used as heat dissipation components for dissipating heat from components that generate heat, e.g., for semiconductor elements that are mounted in various electronic or electric apparatuses such as computers. As an example of the fired polymer-based graphite film, a graphite film having an excellent mechanical strength and having flexibility is disclosed in Patent Literature 1. According to Patent Literature 1, such a graphite film is obtained by raising the temperature of a polymer film of 75 μm in thickness up to 1000° C. in a nitrogen gas, heating a carbonized film thus obtained up to 3000° C. in an atmosphere of argon, and then subjecting a graphitized film thus obtained to a rolling process.

In addition, graphite films have the characteristics of having a lower tearing strength, as compared to typical plastic films and other films. Particularly, in the case of the fired polymer-based graphite films, their molecular structures are such that the molecules of graphite are more uniformly oriented in parallel to its planar direction. Thus, the fired polymer-based graphite films have the tendency to show low resistance to shearing stress, i.e., the tendency to show low tearing strength (average tearing force).

Patent Literature 2 discloses a method for reinforcing a pulling strength of a flexible graphite sheet (equivalent to a natural graphite sheet). According to this method, a flexible graphite sheet (natural graphite sheet) and a thin film of thermoplastic polymer having a given softening temperature are laminated to each other as they are supplied between temperature-controlled two calender rolls.

Further, heat dissipation components are used to dissipate heat from components that generate heat, e.g., for semiconductor elements that are mounted in various electronic or electric apparatuses such as computers. When a graphite film is used for large products among the heat dissipation components, the graphite film is preferably a long and large-area graphite film wound in roll form and made from a polymer film. Studies for producing such a graphite film have been made.

For example, there has been proposed a method of heat-treating a 30 m wide and 250 mm long polymer film wound around a carbonaceous cylindrical inner core having an outer diameter of 150 mm. This method makes it possible to obtain a long and large-area graphite film whose cylindrical hysteresis can easily be extended (Patent Literature 3).

CITATION LIST

Patent Literatures

Patent Literature 1
Japanese Patent Application Publication, Tokukaihei, No. 3-75211 A Patent Literature 2
Japanese Patent Application Publication, Tokukaihei, No. 6-24872 A Patent Literature 3
Japanese Patent Application Publication, Tokukai, No. 2006-327907 A

SUMMARY OF INVENTION

Technical Problem

However, the method described in Patent Literature 1 had difficulty in controlling sagging of a fired polymer-based graphite film. In particular, there is a tendency that it is more difficult to control sagging of a fired polymer-based graphite film having a longer length (for example, a length of not less than 700 mm) than to control sagging of a fired polymer-based graphite film having a shorter length.

Further, in a case where the method described in Patent Literature 2 is applied to a fired polymer-based graphite film, the fired polymer-derived graphite film is torn at the edges thereof, as shown in FIG. 1, before supplied between the two rolls. This results in the failure to laminate with a thin film of thermoplastic polymer.

In addition, graphite films can be processed with, e.g., self-adhesive material layers, insulating films, and other protective films into composite products. In this case, as in the above case, graphite films suffered from a defect such as tearing. Such a defect tends to more significantly occur on a fired polymer-based graphite film having a longer length (for example, a length of not less than 700 mm) than on a fired polymer-based graphite film having a shorter length.

Further, the conventional method as described in Patent Literature 3 caused a deep sag Zgs as shown in FIG. 23. It was impossible to produce a graphite film excellent in flatness by suppressing such a deep sag. Such a conventional graphite film had the problem that it tends to suffer from a defect when laminated with an adhesive tape such as a copper foil tape (see FIG. 24).

Solution to Problem

The present invention encompasses the following inventions:

(1) A method for producing a graphite film, comprising: a sag controlling step of controlling (i) temperatures of a polymer film at both widthwise ends and (ii) a temperature of the polymer film in a widthwise middle portion within a temperature range from a starting temperature of thermal decomposition of the polymer film to a sag controlling temperature of the polymer film; and a step of treating the film obtained in the sag controlling step with heat at a temperature of 2000° C. or higher after the sag controlling step.

(2) The method according to (1), wherein the sag controlling step comprises treating the polymer film with heat so that the temperatures (i) are higher than the temperature (ii) within the temperature range from the starting temperature of thermal decomposition of the polymer film to the sag controlling temperature of the polymer film and so that a temperature gradient over an area extending from the both widthwise ends of the polymer film toward the widthwise middle portion of the polymer film is not less than 2.5° C./m, and the film obtained in the sag controlling step is treated with heat at a temperature of 2000° C. or higher after the sag controlling step.

(3) The method according to (2), wherein in the sag controlling step, the polymer film is treated with heat while being moved through a heat treatment apparatus.

(4) The method according to (2) or (3), wherein the sag controlling step treats the polymer film with heat under a condition that the temperature gradient over an area extending from the both widthwise ends of the polymer film toward the widthwise middle portion of the polymer film is not less than 2.5° C./m and not more than 100° C./m.

(5) The method according to any one of (2) through (4), wherein a temperature gradient over an area extending from one of the both widthwise ends of the polymer film toward the widthwise middle portion of the polymer film is identical to a temperature gradient over an area extending from the other of the both widthwise ends of the polymer film toward the widthwise middle portion of the polymer film.

(6) The method according to any one of (2) through (4), wherein a temperature gradient over an area extending from one of the both widthwise ends of the polymer film toward the widthwise middle portion of the polymer film is different from a temperature gradient over an area extending from the other of the both widthwise ends of the polymer film toward the widthwise middle portion of the polymer film.

(7) A graphite film having a sag resulting from different lengthwise lengths of the graphite film across a width of the graphite film, the sag being formed in a shape such that areas extending from a widthwise middle portion of the graphite film toward both widthwise ends of the graphite film are bilaterally symmetric with respect to the widthwise middle portion of the graphite film.

(8) A graphite film having sag resulting from different lengthwise lengths of the graphite film across a width of the graphite film, the sag being formed in a shape such that areas extending from a widthwise middle portion of the graphite film toward both widthwise ends of the graphite film are bilaterally asymmetric with respect to the widthwise middle portion of the graphite film.

(9) The method according to (1), wherein the sag controlling step comprises treating the polymer film with heat so that the temperatures (i) are lower than the temperature (ii) and so that a temperature gradient over an area extending from the both widthwise ends of the polymer film toward the widthwise middle portion of the polymer film is not more than −2.5° C./m.

(10) The method according to (9), wherein in the sag controlling step, the polymer film is treated with heat so that a temperature gradient over an area extending from the both widthwise ends of the polymer film toward the widthwise middle portion of the polymer film is not less than −100° C./m.

(11) A graphite film having a sag resulting from different lengthwise lengths of the graphite film across a width of the graphite film, the sag lying in a widthwise middle portion of the graphite film.

(12) The graphite film according to (11), wherein
a b-value of the sag in the widthwise middle portion of the graphite film is not less than 5 mm.

(13) The method according to (1), wherein the sag controlling step treats the polymer film with heat so that a temperature gradient over an area extending from the both widthwise ends of the polymer film toward the widthwise middle portion of the polymer film is not less than −2.4° C./m and not more than 2.4° C./m.

(14) A graphite film having a sag of 20.0 mm or less as determined by a method of film windability evaluation in accordance with JIS C2151.

(15) A graphite film having a sag of 4.9 mm or less as determined by a method of film windability evaluation in accordance with JIS C2151.

(16) The method according to (1), wherein in the sag controlling step, the polymer film is treated with heat so that Temperature A≥Temperature B≥Temperature C and Temperature A≠Temperature C (where Temperature A is a temperature of the polymer film at one of the both widthwise ends, Temperature B is a temperature of the polymer film in the widthwise middle portion, and Temperature C is a temperature of the polymer film at the other of the both widthwise ends) and so that a temperature gradient from Temperature A to Temperature C is not less than 2.5° C./m.

(17) A graphite film having a sag resulting from different lengthwise lengths of the graphite film across a width of the graphite film, the sag lying at one widthwise end of the graphite film.

(18) The graphite film according to (17), wherein the graphite film has camber of not less than 11 mm.

(19) The method according to any one of (1), (9), (10), (13), and (16), wherein in the sag controlling step, the polymer film is treated with heat while being moved through a heat treatment apparatus.

(20) A method for producing a graphite film, comprising: a straightening process step of treating a raw graphite film with heat up to a temperature of 2000° C. or higher while applying a pressure to the raw graphite film, wherein the raw graphite film is treated with heat in a state such that the raw graphite film is wound around an inner core having diameter accuracy of less than 0.0426%.

(21) The method according to (20), wherein the raw graphite film as employed in the straightening process step is obtained by treating a polymer film with heat of 2000° C. or higher, and the raw graphite film is cooled at least once to a temperature of lower than 2000° C. before subjected to the straightening process step.

(22) The method according to (20) or (21), wherein the diameter accuracy of the inner core is less than 0.0027%.

Advantageous Effects of Invention

According to a graphite film or a method for producing a graphite film in accordance with the above (1), (9) through (13), and (15) through (19), it is possible to control sagging of a graphite film.

Further, according to a graphite film or a method for producing a graphite film in accordance with the above (2) through (8), it is possible to control sagging of a graphite film, thereby obtaining a graphite film that resists tearing.

Still further, according to a graphite film or a method for producing a graphite film in accordance with the above (14) and (20) through (22), it is possible to obtain a graphite film excellent in flatness.

DESCRIPTION OF EMBODIMENTS

The present invention relates to a graphite film and a method for producing a graphite film. Specifically, the present invention relates to, for example, a graphite film with controlled sag and a method for producing a graphite film in which method sag of the graphite film is controlled. In another embodiment, the present invention relates to a graphite film having a specific sag and a method for producing a graphite film in which method a specific sag occurs on the graphite film. In still another embodiment, a graphite film improved in flatness, a method for producing a graphite film improved in flatness, and a method for improving flatness of a graphite film.

The following will describe embodiments of the present invention. All of the academic literatures and patent literatures listed herein are incorporated by reference herein. Unless otherwise specified herein, the expression indicating a numerical range, i.e., "A to B" means "not less than A (including A and more than A) and not more than B (including B and less than B", and "%" and "parts" means "% by mass" and "parts by mass", respectively.

1. First Embodiment of the Present Invention

Figure 1:
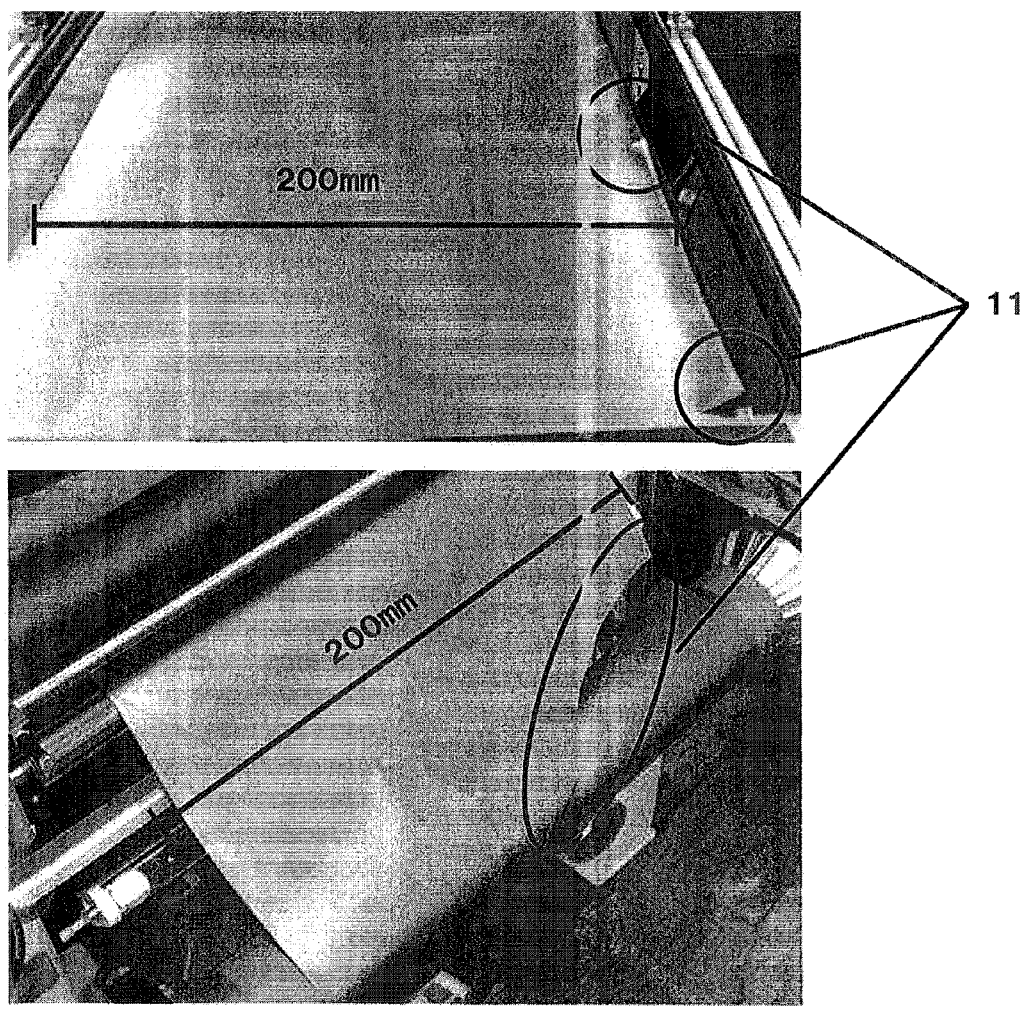
FIG. 1 is a photograph showing an appearance of a tear of a graphite film.
Figure 2:
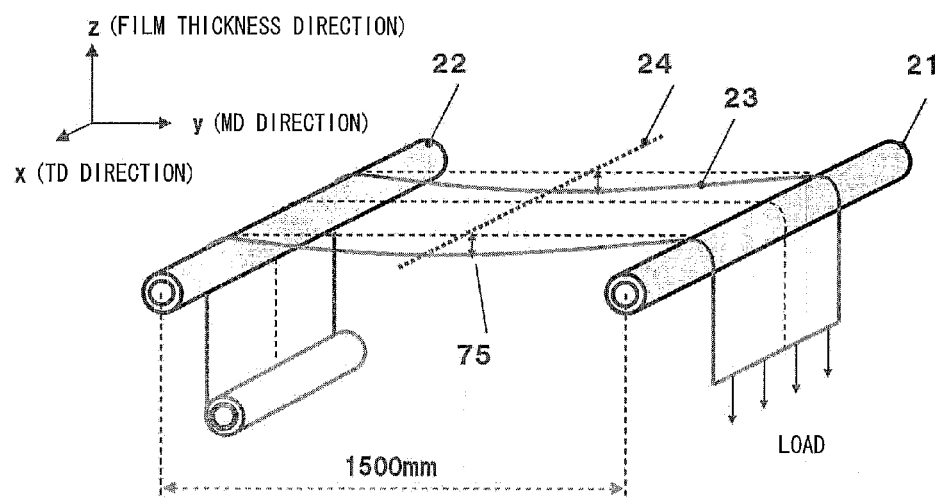
FIG. 2 is a schematic view showing sag measurement described in JIS C2151.
Figure 2:
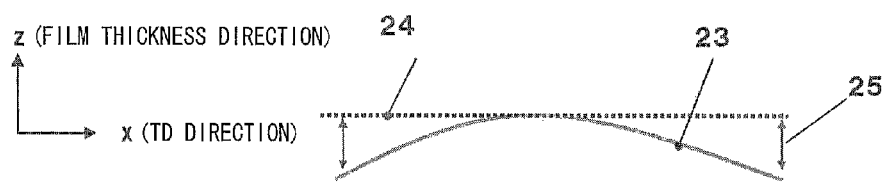
Figure 3:
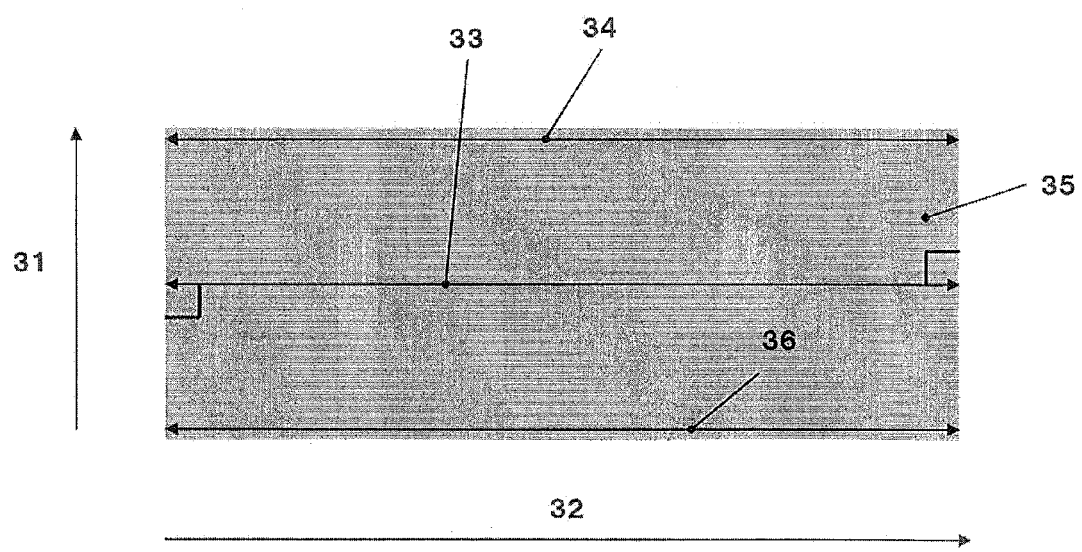
FIG. 3 illustrates a mechanism for forming a sag.

"Sag" of a graphite film refers to "distortion" that appears on the film, as determined by a method of film windability evaluation in accordance with JIS C2151. A film in a certain length is wound off and placed between two parallel sticks in a direction at right angles to the sticks under prescribed conditions, as illustrated in FIG. 2. Then, a deviation from a uniform suspended line is measured. A film having "sag" can be confirmed as follows. When the film is stretched, part of the film sags to a height lower than a normal height of the part of the film. As illustrated in FIG. 3, the sag appears due to differences between the lengths of a film along a lengthwise direction 32 (also referred to as "long side direction" and "MD direction" in the present application) across a widthwise direction 31 (also referred to as "short side direction" and "TD direction" in the present application) of the film. For example, the sag occurs due to differences between a length 33 of a middle portion of the film and respective lengths 34 and 36 of both ends of the film.

Figure 4:
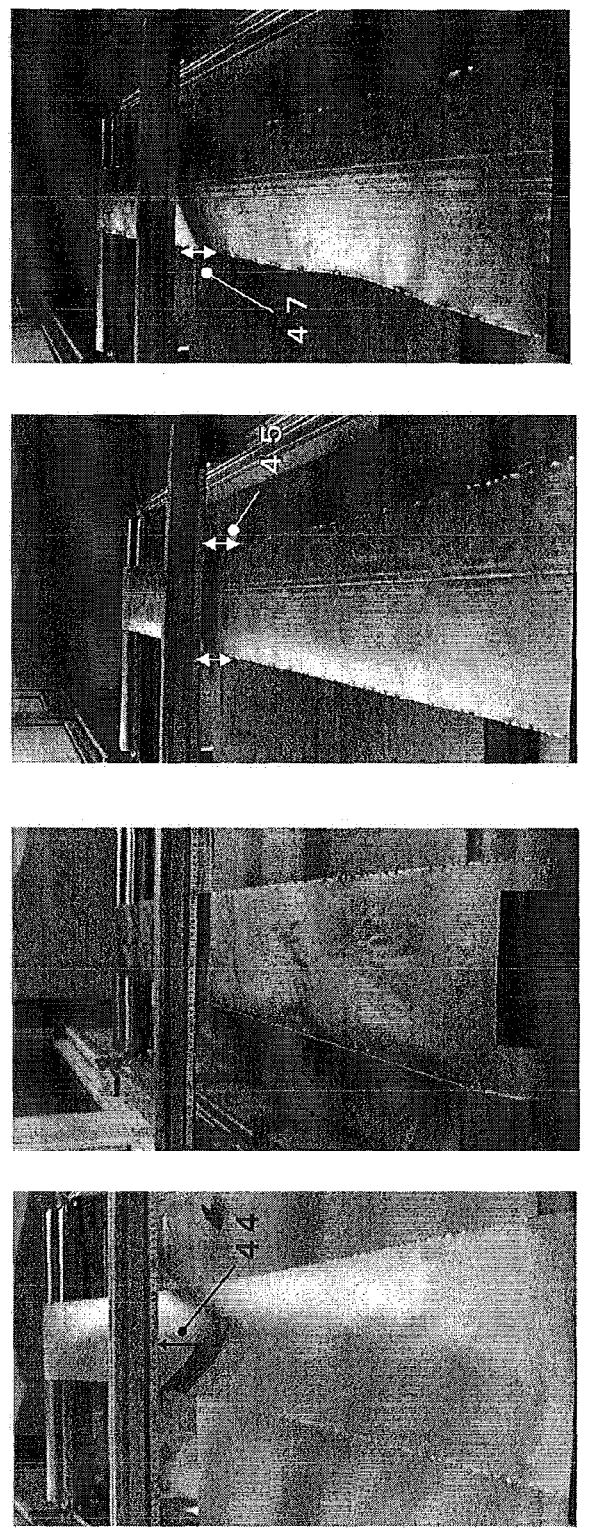
FIG. 4 is photographs each showing a graphite film having a sag.

The inventors of the present application found that there is a correlation between such a sag and the ease of tearing of a graphite film. For example, a graphite film 41 having a sag in a widthwise middle portion thereof as shown in FIG. 4 is more likely to tear when tensioned in a lengthwise direction of the film. This is because load tends to concentrate on the ends of the graphite film 41. Also, a graphite film 42 having a sag of less than 5 mm can tear because even a slight deviation of a shaft causes concentration of load on the ends of the graphite film 42. Meanwhile, a graphite film 43 having sags at both widthwise ends thereof as shown in FIG. 4 is hardly torn because load is less likely to be applied to the ends of the graphite film 43 (a cause of tearing is less likely to occur).

The first embodiment of the present invention relates to a production method for producing a graphite film having a sag. In the first embodiment of the present invention, the inventors of the present invention found that in order to obtain a sag of a graphite film, it is important to treat a polymer film with heat under a condition such that the temperatures of the polymer film at both widthwise ends are higher than the temperature of the polymer film in a widthwise middle portion within the temperature range from a starting temperature of thermal decomposition of the polymer film to a sag controlling temperature of the polymer film and a condition such that a temperature gradient over an area extending from the both widthwise ends of the polymer film toward the widthwise middle portion of the polymer film is not less than 2.5° C./m (hereinafter, such a heat treatment step is referred to as "sag controlling step"). That is, a graphite film of the first embodiment of the present invention is obtained by subjecting a polymer film to the sag controlling step and then treating the film obtained in the sag controlling step with heat at a temperature of 2000° C. or higher. The first embodiment of the present invention is an embodiment to obtain a tear-resistant graphite film having sags at ends thereof, by controlling sag of the graphite film by subjecting the polymer film to a special heat treatment at a temperature in a particular temperature range in an early stage of decomposition of the polymer film.

A mechanism of the development of the effect of the sag controlling step according to the first embodiment of the present invention is as follows. First, in the early stage of thermal decomposition of a polymer film, the polymer film is treated with heat at temperatures such that both widthwise ends of the polymer film are relatively higher in temperature than a widthwise middle portion of the polymer film. The polymer film thus given a thermal hysteresis which varies across the width varies in progress of graphitization of the polymer film in the graphitization step that follows the carbonization step (i.e. varies in degree of orientation of graphite crystallites). This results in a graphite film such that lengthwise lengths of the graphite film at both ends are longer than a lengthwise length of the graphite film in the middle portion. Thus, when such a graphite film is observed in the widthwise direction thereof, the appearance of sags of the graphite film is confirmed at the both ends of the graphite film, wherein the lengthwise lengths of the graphite film at the both ends are longer than the length of the graphite film at their peripheral portions.

Examples of a production method for obtaining a graphite film from a typical polymer film encompasses a method including: a carbonization step of generally heating the polymer film at a temperature of up to around 1000° C.; and a graphitization step of heating a carbonized film thus obtained in the carbonization step at a temperature of 2600° C. or higher. The sag controlling step according to the first embodiment of the present invention serves to control a widthwise temperature distribution of a polymer film in the temperature range in a comparatively early stage of the carbonization step.

Examples of a method for producing a graphite film that involves the execution of the sag controlling step according to the first embodiment of the present invention encompass: a method of performing the sag controlling step and a temperature decreasing step in succession and then performing the carbonization step and the graphitization step; and a method of performing both the sag controlling step and the carbonization step in one process (performing the sag controlling step and subsequently performing the carbonization step, without a temperature decrease intervening between the sag controlling step and the carbonization step) and then performing the graphitization step.

<Definitions of Ends and Middle Portions of Polymer Film and of Graphite Film>

Figure 5:
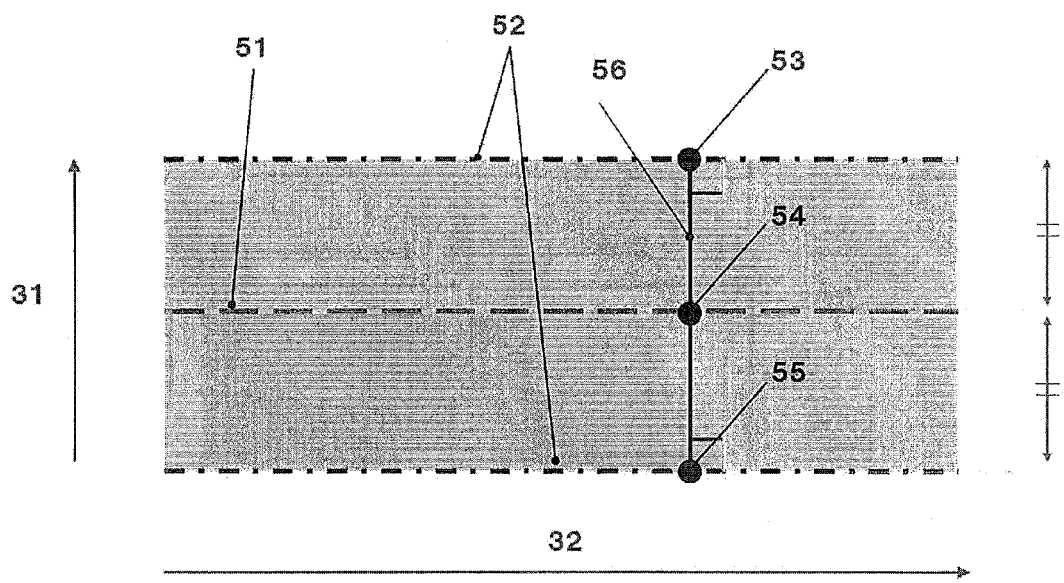
FIG. 5 is an explanatory view of the definitions of ends of a film and a middle portion of the film.

The ends of both a polymer film and a graphite film are each defined as edge portions of both the polymer film and the graphite film which edge portions are parallel to the lengthwise direction thereof when each of the films is spread out, as indicated by reference numeral 52 in FIG. 5. Further, the middle portions of both the polymer film and the graphite film are each defined as a center of the film, as indicated by reference numeral 51 in FIG. 5, which center is located at an equal distance from both of the ends of the film.

<Widthwise Temperature Gradient in the Sag Controlling Step>

A graphite film that is sagging at both ends of the graphite film and is hardly torn is obtained by (a) treating a polymer film with heat at temperatures such that temperatures of the polymer film at both ends are relatively higher than a temperature of the polymer film in the middle portion within a temperature range from a starting temperature of thermal decomposition to a sag controlling temperature and then (b) executing the graphitization step. In this regard, a graphite film sagging at both ends can also be obtained by arbitrarily setting the widthwise temperature gradient and/or temperature distribution of the film over an area extending from both ends of the film to the middle portion of the film in a temperature range over the sag controlling temperature.

A temperature gradient over an area extending from the ends of a film to the middle portion of the film according to the first embodiment of the present invention is expressed, with use of respective temperatures of an end and a middle portion on a given straight line perpendicular to the lengthwise direction of the film and the width of the film as shown in FIG. 5, by the following equation:

$$\text{Temperature Gradient} = (\text{Temperature of Film at Both Ends} - \text{Temperature of Film in Middle Portion})/(\text{Width of Film}/2) \times 100.$$

The temperatures of the film at the both ends and in the middle portion across a given width are values measured at the same time. According to the first embodiment of the present invention, a temperature gradient over an area extending from the both ends to the middle portion (temperature gradient over an area extending from an end 1 to the middle portion and temperature gradient over an area extending from an end 2 (the other end different from the end 1) to the middle portion) is not less than 2.5° C., preferably not less than 5° C., and more preferably not less than 10° C. An upper limit of the temperature gradients from the both ends to the middle portion, which is not particularly limited, is preferably not more than 100° C., more preferably not more than 50° C., or even more preferably not more than 25° C. It is preferable that each of the temperature gradients over an area extending from one of the both ends to the middle portion and over an area extending from the other of the both widthwise ends to the widthwise middle portion is not less than 2.5° C./m, because it realizes a tear-resistant graphite film sufficiently sagging at the both ends thereof. Further, it is preferable that each of the temperature gradients over an area extending from one of the both ends to the middle portion and over an area extending from the other of the both widthwise ends to the widthwise middle portion is not more than 100° C., because it realizes a graphite film so adequately sagging at the both ends thereof as to obtain excellent lamination property when laminated with other medium in film form.

According to the first embodiment of the present invention, it is possible to obtain a bilaterally symmetric graphite film when the temperature gradient over an area extending from the end 1 to the middle portion and the temperature gradient over an area extending from the end 2 to the middle portion are the same as each other. Meanwhile, it is possible to obtain a bilaterally asymmetric graphite film when the temperature gradient over an area extending from the end 1 to the middle portion and the temperature gradient over an area extending from the end 2 to the middle portion are different from each other.

<Decomposition Reaction and Weight Loss Rate of Polymer Film in the Sag Controlling Step>

As a result of heat-treating a polymer film, substances not involving formation of a graphite skeleton, e.g., carbon, oxygen, hydrogen, and/or nitrogen are sequentially discharged as components of carbon dioxide gas, water, hydrogen gas, nitrogen gas, and/or tar, as the temperature of the heat treatment increases. As the decomposition of the polymer film progresses, the polymer film becomes blackened and vitrified. The term "weight loss rate of a polymer film during the sag controlling step" (also referred to as "weight loss rate") can be calculated by using an initial weight (a weight of the polymer film at 23° C. and 50% humidity before heat treatment is started) of the polymer film, which serves as the starting material, and a weight of the polymer film immediately after the sag controlling step, according to the following equation:

Weight loss rate (%)=[(Initial weight of polymer film−Weight of polymer film immediately after the sag controlling step)/Initial weight of polymer film]×100.

It should be noted that the weight of the polymer film is the weight as measured in an environment of 23° C. and 50% humidity after the polymer film has been allowed to stand for 24 hours in the same environment. The same applies to all of the embodiments and Examples.

<Method for Measuring Temperature of Film>

The first embodiment of the present invention makes it possible to control sag by treating a polymer film with heat while giving a desired temperature gradient across the width of the polymer film within a temperature range from a starting temperature of thermal decomposition of the polymer film to a sag controlling temperature of the polymer film.

The starting temperature of thermal decomposition of the polymer film and the sag controlling temperature are actual temperatures of the widthwise middle portion of the polymer film itself being heat-treated. The actual temperature of the polymer film itself can be measured by using a 0.5 mm-diameter sheathed type K thermocouple brought into contact with the polymer film.

Note that in the first embodiment of the present invention, there are no particular limitations to temperature ranges in any steps other than the sag controlling step, more specifically, a condition for heat treatment performed at a temperature lower than the starting temperature of thermal decomposition of the polymer film and a condition for heat treatment performed at a temperature higher than the sag controlling temperature after the sag controlling step is once performed.

Further, the sag controlling step may be followed by cooling to room temperature, before the subsequent heat treatment steps (the carbonization step and the graphitization step) are performed. Alternatively, the sag controlling step may be followed by a subsequent heat treatment, without a temperature decrease intervening between the sag controlling step and the heat treatment. The carbonization step can be omitted provided that the subsequent heat treatment is performed at a temperature of preferably up to not less than 700° C., more preferably up to not less than 800° C., or even more preferably up to not less than 900° C.

<Starting Temperature of Thermal Decomposition of Polymer Film and Sag Controlling Temperature>

According to the first embodiment of the present invention, the starting temperature of thermal decomposition of a polymer film is defined as a temperature at which a polymer film, as a result of heat treatment, loses 1.0% of its initial weight which has been measured at room temperature (23° C., 50% humidity) before the heat treatment is started. More specifically, the starting temperature of thermal decomposition of a polymer film according to the first embodiment of the present invention is a temperature at which a 10 mg sample of the polymer film loses 1.0% of its weight as a result of heat treatment performed at a temperature rise rate of 10° C./min from room temperature (23° C.) to 1000° C. under a flowing nitrogen atmosphere (200 mL per minute) by means of a thermal analysis system EXSTAR6000 and a thermogravimetric apparatus TG/DTA 220U (both manufactured by SII Nanotechnology Inc.). The starting temperature of thermal decomposition according to the first embodiment of the present invention is specifically measured as follows. That is, a 10 mg sample of a polymer film is heat-treated at a temperature rise rate of 10° C./min from room temperature (23° C.) to 1000° C. under a flowing nitrogen atmosphere (200 mL per minute) by means of a thermal analysis system EXSTAR6000 and a thermogravimetric apparatus TG/DTA 220U (both manufactured by SII Nanotechnology Inc.). A temperature at which the polymer film loses 1.0% of its weight is defined as the starting temperature of thermal decomposition of the polymer film.

The sag controlling temperature according to the first embodiment of the present invention is a temperature at which a polymer film, as a result of heat treatment, loses not less than 1.1%, preferably not less than 1.2%, more preferably not less than 2.8%, even more preferably not less than 10.0%, especially preferably not less than 15.0%, or most preferably 20.0%, of its initial weight which has been measured at room temperature (23° C., 50% humidity) before the heat treatment is started. Such a temperature is determined based on a result of the measurement of a weight loss of a polymer film heat-treated at a temperature rise rate of 10° C./min from room temperature (23° C.) to 1000° C. under a flowing nitrogen atmosphere (200 mL per minute) by means of a thermal analysis system EXSTAR6000 and a thermogravimetric apparatus TG/DTA 220U (both manufactured by SII Nanotechnology Inc.). The sag controlling temperature which causes a weight loss rate of not less than 1.1% enables developing the effect of sag control. Further, a higher setting of the sag control enables enhancing the effect of sag control. In a case where the sag controlling temperature is a temperature at which a weight loss rate of a polymer film does not exceed 20.0% (upper limit value to the sag control), the sag controlling step may be a single-stage sag controlling step or a multi-stage sag controlling step. Alternatively, the sag controlling step may be performed two or more times. By all these sag controlling steps, sag amplification can be realized. In such a case, the temperatures of widthwise ends of a film are set higher than the temperature of a widthwise middle portion of the film until the sag controlling temperature reaches a temperature at which the weight loss rate of the film exceeds 20%. In a temperature range in which a weight loss rate exceeds 20.0%, there is no difference between a sag of a graphite film obtained as a final product under the condition that the temperatures of widthwise ends of a film are set higher than the temperature of a widthwise middle portion of the film and a sag of a graphite film obtained as a final product without such a condition.

A temperature at which a polymer film shows a weight loss rate of 20%, as the most preferable sag controlling temperature according to the first embodiment of the present invention, is specifically measured as follows. That is, a weight loss of a 10 mg sample of a polymer film as a result of heat treatment performed at a temperature rise rate of 10° C. per minute from room temperature (23° C.) to 1000° C. under a flowing nitrogen atmosphere (200 mL per minute) is measured by means of a thermal analysis system EXSTAR6000 and a thermogravimetric apparatus TG/DTA 220U (both manufactured by SII Nanotechnology Inc.). Based on a result of the measurement, a temperature at which the polymer film showed 20% weight loss is determined as the sag controlling temperature. Similarly, a temperature at which a polymer film shows a weight loss rate of 1.1%, which temperature is a lower limit to the sag controlling temperature, is determined as follows. That is, a weight loss of a 10 mg sample of a polymer film as a result of heat treatment performed at a temperature rise rate of 10° C. per minute from room temperature (23° C.) to 1000° C. under a flowing nitrogen atmosphere (200 mL per minute) is measured by means of a thermal analysis system EXSTAR6000 and a thermogravimetric apparatus TG/DTA 220U (both manufactured by SII Nanotechnology Inc.). Based on a result of the measurement, a temperature at which the polymer film showed 1.1% weight loss is determined as the temperature at which the polymer film shows a weight loss rate of 1.1%.

In the case where the sag controlling step is followed by a temperature decrease before another step is performed, the handleability of the film obtained through the sag controlling step is important. In that case, when the sag controlling temperature is set so that the polymer film shows a weight loss rate of preferably not more than 20.0%, more preferably not more than 15.0%, even more preferably not more than 10.0%, or especially preferably not more than 2.8%, the polymer film is not completely carbonized and therefore has the nature of a polymer remained therein, thus being hardly cracked and having good handleability. Further, in such the case, an amount that the polymer film shrinks is small, with the result that the polymer film hardly gets wrinkles.

<Starting Temperature of Thermal Decomposition of Polymer Film as Used in Examples of First embodiment of the Present Invention and Sag Controlling Temperature of the Polymer Film>

For polyimide films as used in Examples of the first embodiment of the present invention (polyimide films manufactured by Kaneka Corporation: Apical AH of 75 μm in thickness; and Apical NPI of 75 μm in thickness), the starting temperature of thermal decomposition of these polyimide films and the sag controlling temperature thereof are as follows. The starting temperature of thermal decomposition is 500° C. (weight loss rate of 1.0%). The sag controlling temperature is 520° C. (weight loss rate of 1.1%) or more, preferably 550° C. (weight loss rate of 1.2%) or more, more preferably 580° C. (weight loss rate of 2.8%) or more, even more preferably 600° C. (weight loss rate of 10.0%) or more, especially preferably 630° C. (weight loss rate of 15.0%) or more, or most preferably 655° C. (weight loss rate of 20.0%) or more. When the sag controlling temperature is 520° C. or more, it is possible to obtain the effect attained by the sag controlling step. The higher the sag controlling temperature, the further the effect attained by the sag controlling step is enhanced. In a case where the sag controlling temperature does not exceed 655° C. (upper limit to the sag control), the sag controlling step may be a single-stage sag controlling step or a multi-stage sag controlling step. Alternatively, the sag controlling step may be performed two or more times. By all these sag controlling steps, sag amplification can be realized. In this case, the temperatures of widthwise ends of a film are set higher than the temperature of a widthwise middle portion of the film until the sag controlling temperature reaches a temperature exceeding 655° C. In a temperature range exceeding 655° C., there is no difference between a sag of a graphite film obtained as a final product under the condition that the temperatures of widthwise ends of a film are set higher than the temperature of a widthwise middle portion of the film and a sag of a graphite film obtained as a final product without such a condition.

<Method for Performing the Sag Controlling Step>

Figure 6:
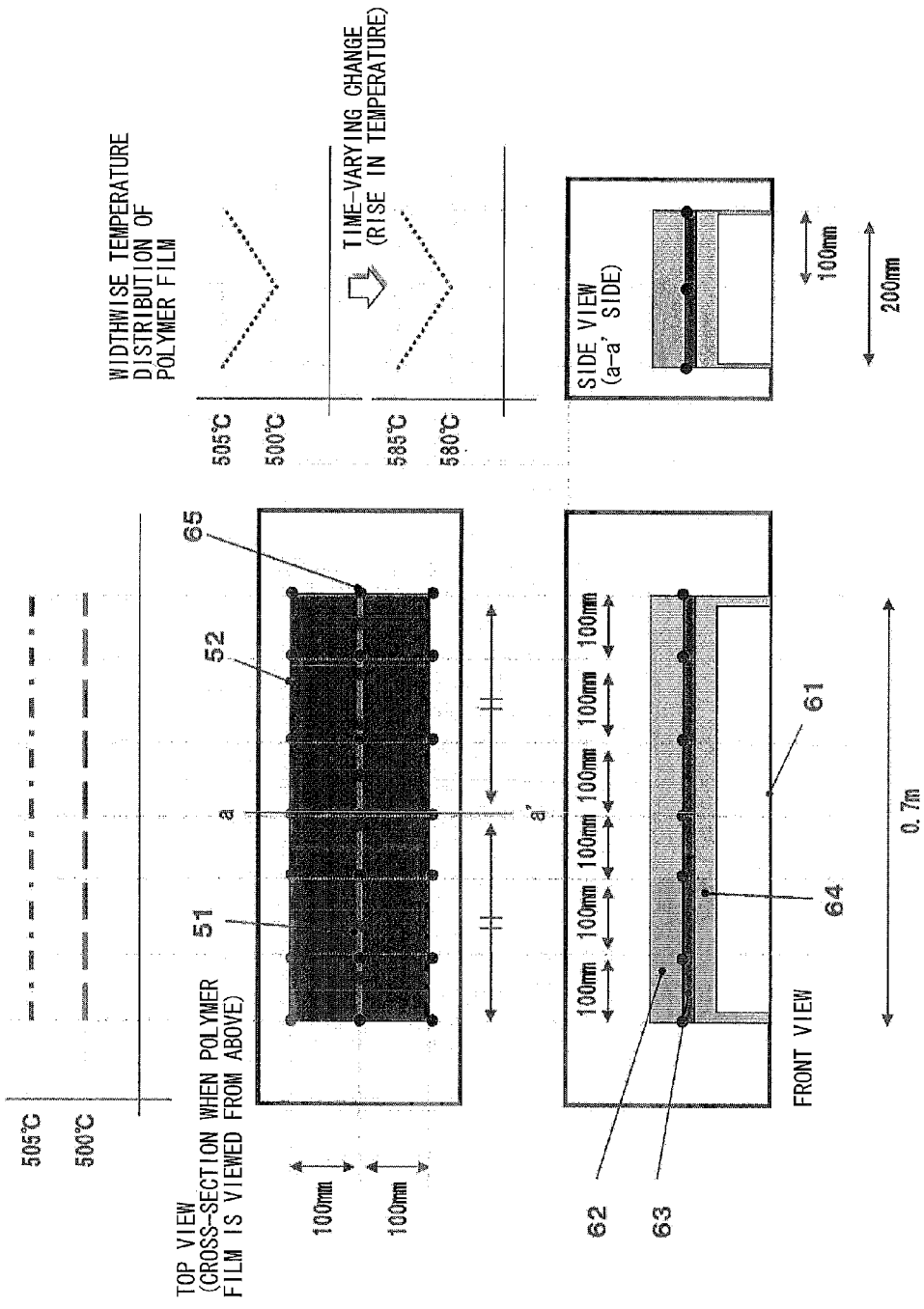
FIG. 6 is a schematic view showing a sag controlling step carried out by a sheet batch method.
Figure 7:
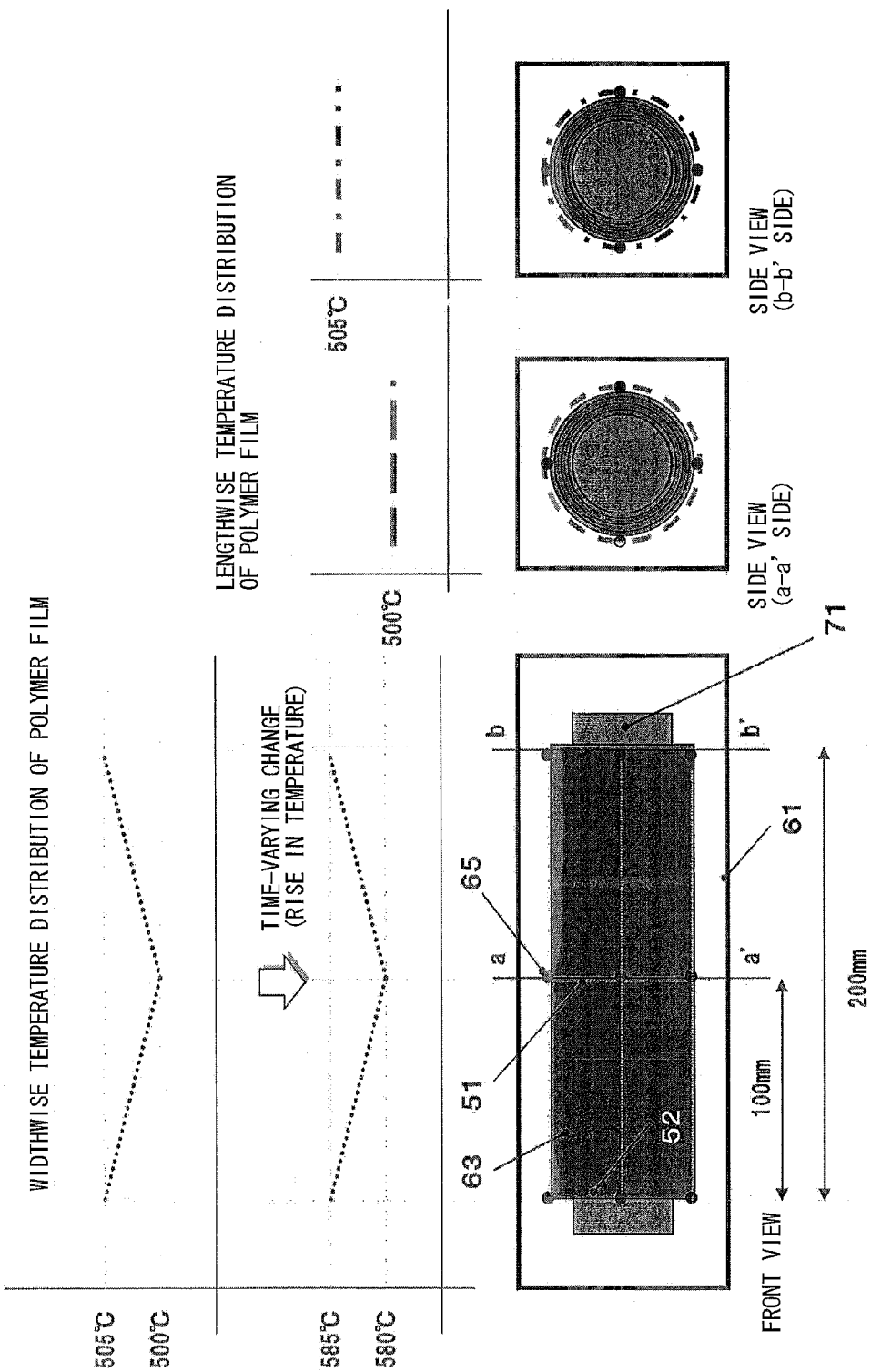
FIG. 7 is a schematic view showing a sag controlling step carried out by a cylindrical batch method.
Figure 8:
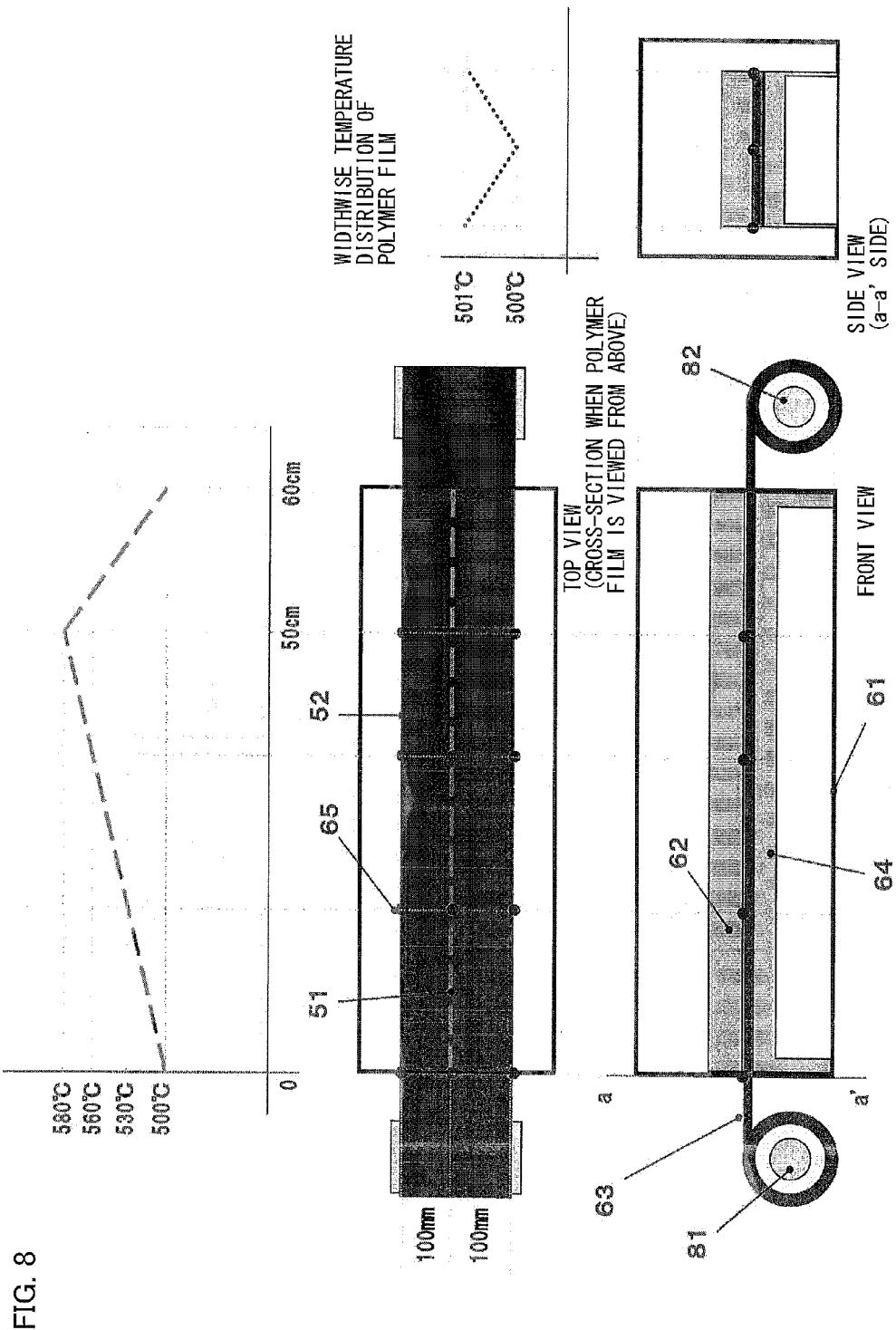
FIG. 8 is a schematic view showing a sag controlling step carried out by a continuous long film processing method.

In the sag controlling step, any method may be employed, without particular limitation, as a method of treating a polymer film with heat while giving a temperature gradient to the polymer film across the width of the polymer film. One example of such a method is a method of holding a sheet-type polymer film (which means "one or more polymer films in sheet form") by inserting the polymer film into a graphite jig within a heat treatment apparatus, and then heat-treating the polymer film batchwise (sheet batch method), as shown in FIG. 6. The other example is a method of holding a polymer film by wrapping around a graphite cylindrical container, and then heating the polymer film batchwise with heat (cylindrical batch method), as shown in FIG. 7. Another example is a method of subjecting a long polymer film to heat treatment while continuously supplying the long polymer film into the heat treatment apparatus (continuous processing method or continuous long film processing method), as shown in FIG. 8. Note that the widthwise direction according to the first embodiment of the present invention is a direction along which a difference in temperature is given in the sag controlling step. In a case where a long film is to be employed, the widthwise direction thereof, which is not particularly limited, is preferably a short side of the film (a direction vertical to the lengthwise direction), from a viewpoint of enabling a further development of the effect of sagging. From a similar viewpoint, in a case where a continuous long film processing method is to be employed, it is preferable that the widthwise direction is preferably a TD direction rather than a MD direction.

In a case where the sag controlling step is performed in the sheet batch method, widthwise temperature control of a polymer film is carried out by increasing temperatures of the polymer film within a temperature range from the starting temperature of thermal decomposition of the polymer film to the sag controlling temperature thereof in such a state that a difference in temperature is given between the widthwise ends of the polymer film and the middle portion thereof (see one example of widthwise temperature distribution of a polymer film shown in FIG. 6). In this case, the temperature range from the starting temperature of thermal decomposition of the polymer film to the sag controlling temperature needs to satisfy a condition such that the temperatures of the polymer film at the both widthwise ends are set higher than the temperature of the polymer film in the widthwise middle portion and a condition that a temperature gradient over an area extending from the both widthwise ends to the widthwise middle portion of the polymer film is not less than 2.5° C./m. Particularly, it is preferable that, at the sag controlling temperature, temperature measurement points in the sag controlling step satisfy such a condition that the temperature gradient over an area extending from the both widthwise ends of the polymer film to the widthwise middle portion of the polymer film is not less than 2.5° C./m. Further, it is preferable that at least 70% of the temperature measurement points in the sag controlling step satisfy such a condition that the temperature gradient over an area extending from the both widthwise ends of the polymer film to the widthwise middle portion of the polymer film is not less than 2.5° C./m. Although it is particularly preferable that the difference in temperature constantly fall within a certain range, the difference in temperature may vary within a range yielding the effect of the first embodiment of the present invention.

The measurement of temperatures of a polymer film is performed, as shown in FIG. 6, by means of 0.5 mm-diameter sheathed type K thermocouples placed in contact with the both ends of the polymer film and the middle portion of the polymer film at intervals of 100 mm along the lengthwise direction of the polymer film.

In the temperature range from the starting temperature of thermal decomposition to the sag controlling temperature, time-varying changes in temperature at the ends of the film and in the middle portion of the film are also measured at 30° C. intervals (at the points of time, 500° C., 530° C., 560° C., and 580° C., in a case where the starting temperature of thermal decomposition in the widthwise middle portion of the film and the sag controlling temperature are 500° C. and 580° C., respectively) starting from the starting temperature of the widthwise middle portion of the film. Such measurement is performed to confirm that at least one of the four measured temperatures, preferably all these four measured temperatures, satisfy such a condition that the temperature gradient over an area extending from the both ends to the middle portion is not less than 2.5° C./m.

As in the case where the sag controlling step is performed in the sheet batch method, in a case where the sag controlling step is performed in the cylindrical batch method, widthwise temperature control of a polymer film is carried out by increasing temperatures of the polymer film within a temperature range from the starting temperature of thermal decomposition of the polymer film to the sag controlling temperature thereof in such a state that a difference in temperature is given between the widthwise ends of the polymer film and the middle portion thereof (see one example of widthwise temperature distribution of a polymer film shown in FIG. 7). In this case, the temperature range from the starting temperature of thermal decomposition of the polymer film to the sag controlling temperature thereof needs to satisfy a condition such that the temperatures of the polymer film at the both widthwise ends are set higher than the temperature of the polymer film in the widthwise middle portion and a condition such that a temperature gradient over an area extending from the both widthwise ends of the polymer film to the widthwise middle portion of the polymer film is not less than 2.5° C./m. Particularly, it is preferable that, at the sag controlling temperature, temperature measurement points in the sag controlling step satisfy such a condition that the temperature gradient over an area extending from the both widthwise ends of the polymer film to the widthwise middle portion of the polymer film is not less than 2.5° C./m. Further, it is preferable that at least 70% of the temperature measurement points in the sag controlling step satisfy such a condition that the temperature gradient over an area extending from the both widthwise ends to the widthwise middle portion of the polymer film is not less than 2.5° C./m. Although it is particularly preferable that the difference in temperature constantly fall within a certain range, the difference in temperature may vary within a range yielding the effect of the first embodiment of the present invention.

The measurement of temperatures of a polymer film is performed, as shown in FIG. 7, by means of 0.5 mm-diameter sheathed type K thermocouples placed in contact with the both ends of the polymer film and the middle portion of the polymer film at the respective points circumferentially provided at 90-degree intervals.

In the temperature range from the starting temperature of thermal decomposition to the sag controlling temperature, time-varying changes in temperature at the ends of the film and in the middle portion of the film are also measured at 30° C. intervals (at the points of time, 500° C., 530° C., 560° C., and 580° C., in a case where the starting temperature of thermal decomposition in the widthwise middle portion of the film and the sag controlling temperature are 500° C. and 580° C., respectively) starting from the starting temperature of the widthwise middle portion of the film. Such measurement is performed to confirm that at least one of the four measured temperatures, preferably all these four measured temperatures, satisfy such a condition that the temperature gradient over an area extending from the both ends to the middle portion is not less than 2.5° C./m.

The following will describe widthwise temperature control of a polymer film in a case where the sag controlling step is performed in the continuous processing method. As shown in FIG. 8, a polymer film is passed through a heat treatment apparatus which has been set so that a temperature gradient is given to the film in a lengthwise direction of the film (in this case, corresponding to the MD direction as well) within a temperature range from the starting temperature of thermal decomposition to the sag controlling temperature. As a result, the polymer film receives a thermal hysteresis within the temperature range from the starting temperature of thermal decomposition to the sag controlling temperature. In this case, the sag controlling step can be performed by subjecting a polymer film passing through the above heat treatment apparatus to heat treatment with a temperature difference given between the widthwise ends of the polymer film and the widthwise middle portion of the polymer film.

In the temperature range from the starting temperature of thermal decomposition to the sag controlling temperature, temperatures at the ends of the film and in the middle portion of the film are measured, by means of 0.5 mm-diameter sheathed type K thermocouples placed in contact with the both ends of the film and the middle portion of the film, at 30° C. intervals (see FIG. 8; at the points of time, 500° C., 530° C., 560° C., and 580° C., in a case where the starting temperature of thermal decomposition in the widthwise middle portion of the film and the sag controlling temperature are 500° C. and 580° C., respectively) starting from the starting temperature of the widthwise middle portion of the film. Such measurement is performed to confirm that at least one of the four measured temperatures, more preferably all these four measured temperatures, satisfy such a condition that the temperature gradient over an area extending from the both ends to the middle portion is not less than 2.5° C./m.

The temperature range from the starting temperature of thermal decomposition of the polymer film to the sag controlling temperature needs to satisfy a condition such that the temperatures of the polymer film at the both widthwise ends are set higher than the temperature of the polymer film in the widthwise middle portion and a condition such that a temperature gradient over an area extending from the both widthwise ends to the widthwise middle portion of the polymer film is not less than 2.5° C./m. Particularly, it is preferable that, at the sag controlling temperature, temperature measurement points in the sag controlling step satisfy such a condition that the temperature gradient over an area extending from the both widthwise ends of the polymer film to the widthwise middle portion of the polymer film is not less than 2.5° C./m. Further, it is more preferable that at least 70% of the temperature measurement points in the sag controlling step satisfy such a condition that the temperature gradient over an area extending from the both widthwise ends of the polymer film to the widthwise middle portion of the polymer film is not less than 2.5° C./m. Although it is particularly preferable that the difference in temperature constantly fall within a certain range, the difference in temperature may vary within a range yielding the effect of the first embodiment of the present invention.

In terms of productivity, the sag controlling step according to the first embodiment of the present invention is preferably performed by the continuous long film processing method. Also, from the viewpoint of facilitating widthwise temperature control of the polymer film, the sag controlling step according to the first embodiment of the present invention is preferably performed by the continuous long film processing method.

Examples of a method of giving a difference in temperature between the widthwise ends of the polymer film and the middle portion of the polymer film include: a method of controlling the temperatures of the widthwise ends of the polymer film and the temperature of the middle portion of the polymer film by independently controlling separate heaters which are respectively placed close to the side of the widthwise ends of the polymer film and the side of the middle portion of the polymer film; and a method of giving a desired difference in temperature with use of a heat insulator or the like. These methods are not the only possibilities, and any method may be employed.

<Graphite Film>

The graphite film can be produced by heat-treating a polymer film serving as a raw material film. The polymer film suitable for production of a graphite film is exemplified by a polymer film made of at least one type of resin selected from the group consisting of polyimide, polyamide, polyoxadiazole, polybenzothiazole, polybenzobisazole, polybenzooxazole, polybenzobisoxazole, polyparaphenylenevinylene, polybenzoimidazole, polybenzobisimidazole, and polythiazole.

Among those named above, the polyimide film is an especially favorable polymer film, because the polyimide film is more likely to develop a layer structure of graphite through carbonization and graphitization than any other polymer film that is made from an organic material.

Note that the term "polymer film" of the present invention encompasses a heat-treated film obtained by treating a polymer film with heat. Further, the term "heat-treated film" means a film that is obtained as a result of heat treatment to a polymer film and shows weight loss of above 0% and not more than 40%. Note that a film obtained as a result of heat treatment to the polymer film or the heat-treated film and showing weight loss of more than 40% is defined as a "carbonized film". Further, a film obtained by heat-treating any film selected from the following films: the polymer film; the heat-treated film; and the carbonized film at a temperature of 2000° C. or higher is defined as a "graphite film".

Weight measurement is performed in a manner as described in Examples; a film is allowed to stand for 24 hours in an environment having a temperature of 23° C. and a humidity of 50%, and a value of the weight of the film is measured in an environment having a temperature of 23° C. and a humidity of 50%.

There is no particular limitation on the thickness of the polymer film. Although a polymer film of a desired thickness can be employed, it is preferable that the thickness of the polymer film be, for example, in the range from 50 to 125 µm. There is a tendency that the smaller the thickness of the polymer film, the lesser the depth of the sag and the better reproducibility of the sag.

Further, there is no particular limitation on the width of the polymer film. However, it is preferable that a polymer film having a width, for example, in the range from 50 to 300 mm be employed. There is a tendency that the smaller the width of the polymer film, the smaller the sag.

Further, the carbonization step for the polymer film is not essential. As indicated in Examples described later, even in a case where the carbonization step is not carried out, the sag control technique of the present invention can be utilized without any problem.

<Method for Producing Graphite Film>

Examples of a method for producing a graphite film from a polymer film encompass a method undergoing a carbonization step, a graphitization step, and a pressurizing step, to obtain a graphite film. In such a method, for example, in the carbonization step, a polymer film serving as a starting material is carbonized by heat-treating the polymer film either under reduced pressure or in an inert gas. In the carbonization step, heat treatment is performed usually at a temperature of approximately 1000° C. For example, in the case of preliminary heat treatment performed at a heating rate of 10° C. per minute from room temperature, it is desirable that heat treatment be performed with the temperature kept in a temperature range of 1000° C. for approximately 30 minutes. At the stage of the preliminary heat treatment, pressure may be applied to the polymer film in a direction parallel to a surface of the film so that the film does not lose its orientation.

For example, the graphitization step, which follows the carbonization step, is performed with the carbonized film set in an ultrahigh-temperature furnace. The graphitization step is performed either under a reduced pressure or in an inert gas. It is most appropriate to use argon as the inert gas, and it is more preferable that a small amount of helium be added to argon. In the graphitization step, heat treatment is performed preferably at a temperature of 2400° C. or higher, more preferably at a temperature of 2600° C. or higher, even more preferably at a temperature of 2800° C. or higher, or especially preferably at a temperature of 2900° C. or higher. Note that the graphitization step may be performed in succession following the carbonization step, or may alternatively be performed after cooling after the carbonization step.

A graphite film obtained through the carbonization step and the graphitization step is in a foamed state in which the graphite layer has been uplifted by the generation of internal gases such as $N_2$ and/or a filler (phosphoric acid filler), which does not involve formation of a graphite skeleton. In the case of a graphite film that is in a foamed state after the graphitization step, the folding endurance can be improved, for example, by performing the pressurizing step, such as compression treatment or rolling treatment.

<Environment and Other Conditions Inside Furnace in the Sag Controlling Step>

The sag controlling step of the first embodiment of the present invention may be performed in an inert gas (such as nitrogen or argon), an oxygen atmosphere, vacuum, or an atmosphere under a reduced pressure.

<Device for Controlling Tension>

In a case where the sag controlling step is performed through the continuous long film producing process of the first embodiment of the present invention, the polymer film may be heat-treated with a tension applied to the polymer film by using tension adjustment devices so mounted, for example, upstream and downstream of the heat treatment apparatus as to adjust the tension of the polymer film. Such an adjustment device for controlling tension is achieved, for example, through a method of applying torque to a rotating shaft of a wind-off device as indicated by reference numeral 81 in FIG. 8.

In the first embodiment of the present invention, in a case where the sag controlling step is carried out through the continuous long film producing process, a pulling strength applied to the polymer film is not less than 5 kgf/cm$^2$ and not more than 500 kgf/cm$^2$, preferably not less than 10 kgf/cm$^2$ and not more than 300 kgf/cm$^2$, or more preferably not less than 20 kgf/cm$^2$ and not more than 100 kgf/cm$^2$. By performing the sag controlling step with a pulling strength of not less than 5 kgf/cm$^2$, it is possible to reduce the wrinkling of the polymer film which is caused by shrinkage of the polymer film through thermal composition. Further, by performing the sag controlling step with a pulling strength of not more than 500 kgf/cm$^2$, it is possible to prevent breakage of the polymer film which may occur due to an excess stress applied to the polymer film.

<Total Transmittances of Polymer Film and Polymer Film Having been Subjected to the Sag Controlling Step>

It is preferable that the total transmittances of a polymer film and a polymer film having been subjected to the sag controlling step are lower than the total transmittance of a polymer film in an initial stage (which refers to a state in room temperature (23° C., 50% humidity) before the heat treatment is started. A method of measuring the total transmittance of the polymer film having been subjected to the sag controlling step is described in Examples. The total transmittance of the polymer film having been subjected to the sag controlling step is preferably not more than 10.0, more preferably not more than 6.0, or even more preferably not more than 1.0.

<Load to be Applied to Polymer Film in its Thickness Direction>

In the first embodiment of the present invention, in a case where the sag controlling step is carried out through the continuous long film producing process, it is preferable that a load be applied to the polymer film in its thickness direction in the heat treatment apparatus. An example of a method for applying a load encompasses, but is not particularly limited to, a method in which as shown in FIG. 8, a polymer film moves along a hearth with a weight placed on the polymer film. A lower limit to the load that is applied to the polymer film in its thickness direction is preferably not less than 0.1 g/cm$^2$, more preferably not less than 0.5 g/cm$^2$, or even more preferably not less than 1 g/cm$^2$. An upper limit to the load applied to the polymer film in its thickness direction is preferably not more than 50 g/cm$^2$, more preferably not more than 20 g/cm$^2$, or even more preferably not more than 10 g/cm$^2$. With a load of not less than 0.1 g/cm$^2$, it is possible to reduce the wrinkling of the polymer film due to shrinkage of the polymer film through thermal decomposition. Further, with a load of not more than 50 g/cm$^2$, the polymer film can be prevented from breaking under excess tension.

<Line Speed>

In the first embodiment of the present invention, in a case where the sag controlling step is carried out through the continuous long film producing process, a line speed for the polymer film (hereinafter, also referred to as "line speed") means the speed at which the film is conveyed in the sag controlling step. The line speed is not less than 10 cm/min and not more than 500 cm/min, preferably not less than 20 cm/min and not more than 300 cm/min, or more preferably not less than 30 cm/min and not more than 150 cm/min. In terms of productivity, the line speed is preferably not less than 10 cm/min. Further, with a line speed of not more than 500 cm/min, it is possible to perform control of a temperature distribution in the heat treatment apparatus, thus enabling control of sag.

<Birefringence>

The term "birefringence" means a difference between (i) a refractive index of the film in any direction in a plane of the film and (ii) a refractive index of the film in its thickness direction. In the first embodiment of the present invention, there is no particular limitation on the birefringence of the polymer film. It is safe that a polymer film as employed has a birefringence of preferably not less than 0.08, more preferably not less than 0.10, even more preferably 0.12, or especially preferably not less than 0.14. Carbonization and graphitization of the polymer film having a birefringence of not less than 0.08 progress more easily, with the result that a graphite film having a graphite layer developed is more likely to be produced.

<Sag Controlling Step in Two or More Separate Stages>

The sag controlling step according to the first embodiment of the present invention may be performed in two or more separate stages. For example, assume that the sag controlling step is performed under the condition that the starting temperature of thermal decomposition is 500° C. and the sag controlling temperature is 655° C. In this case, the sag controlling step may be continuously performed in the temperature range from 500° C. to 655° C., in a constant temperature gradient set and maintained such that the temperatures of the widthwise ends of the film are higher than the temperature of the widthwise middle portion of the film. However, the sag controlling step may be performed in an alternative manner. That is, a first heat treatment is performed in a temperature range from 500° C. to 540° C., and a second heat treatment is performed in a temperature range from 540° C. to 655° C. (hereinafter, such a sag controlling step is referred to as "a separate sag controlling step".). In a case where the separate sag controlling step is performed, a temperature gradient such that the temperatures of the widthwise ends of the film are higher than the temperature of the widthwise middle portion of the film in a first sag controlling step may be varied from the temperature gradient in a second or subsequent sag controlling step, instead of being identical to the temperature gradient in the second or subsequent sag controlling step. In this case, it is possible to obtain a combined effect of the effect achieved by the first sag controlling step performed in the range from 500° C. to 540° C. and the effect achieved by the second sag controlling step performed in the range from 540° C. to 655° C.

<Difference in Lengthwise Length Between Widthwise Ends and Widthwise Middle Portion of Graphite Film>

A difference in lengthwise length between the widthwise ends and widthwise middle portion of a graphite film can be evaluated from a result of the measurement of lengths of graphite film strips into which a graphite film has been slit. More specifically, a graphite film is cut to be 500 mm in lengthwise length. In cutting the graphite film, a cut side of the graphite film should be vertical to the length 33 of the middle portion of the graphite film, as shown in FIG. 3. Further, the length of 500 mm is based on the measurement of the length 33 of the middle portion of the graphite film. Next, the middle portion 33 and the ends 34 and 36 of the graphite film are slit into 10 mm-wide strips. Subsequently, the lengths of the strips are measured, and a difference in length is then calculated from the lengths thus measured.

2. Second Embodiment of the Present Invention

The "sag" of a graphite film is the same as that in the first embodiment, and as such, is omitted here.

The second embodiment of the present invention relates to a graphite film with controlled sag and a production method for producing a graphite film with controlled sag. In the second embodiment of the present invention, the inventors of the present invention found that in order to obtain a sag of a graphite film, it is important to treat a polymer film with heat while controlling the temperatures of the polymer film at both widthwise ends and the temperature of the polymer film in a widthwise middle portion within the temperature range from a starting temperature of thermal decomposition of the polymer film to a sag controlling temperature of the polymer film (hereinafter, such a heat treatment step is referred to as "sag controlling step"). That is, a graphite film of the second embodiment of the present invention is obtained by subjecting a polymer film to the sag controlling step and then treating the film obtained in the sag controlling step with heat at a temperature of 2000° C. or higher. The second embodiment of the present invention is an embodiment to obtain a graphite film with controlled sag, by subjecting the polymer film to a special heat treatment at a temperature in a particular temperature range in an early stage of decomposition of the polymer film.

A graphite film obtained by a graphite film production method including the sag controlling step according to the second embodiment of the present invention has a shape controlled along the widthwise direction of the film. The film having such a controlled shape is classified into: 1) a graphite film having a sag in a middle portion thereof; 2) a flat graphite film having no sag; and 3) a graphite film having a sag at one end thereof.

The graphite films 1) through 3) each having a shape controlled along the widthwise direction of the film can be obtained by the following production methods.

1) Method for producing a graphite film having a sag in the middle portion thereof.

The inventors of the present invention found that a graphite film having a sag in the middle portion thereof is obtained by using a method for producing a graphite film including: a sag controlling step of treating a polymer film with heat so that the temperatures of the polymer film at both widthwise ends are lower than the temperature of the polymer film in a widthwise middle portion within a temperature range from a starting temperature of thermal decomposition of the polymer film to a sag controlling temperature of the polymer film and so that a temperature gradient over an area extending from the both widthwise ends of the polymer film toward the widthwise middle portion of the polymer film is not more than −2.5° C./m; and a step of treating the film obtained in the sag controlling step with heat at a temperature of 2000° C. or higher after the sag controlling step.

According to the second embodiment of the present invention, in order to obtain a graphite film having a sag in the widthwise middle portion thereof, a temperature gradient over an area extending from the both widthwise ends to the widthwise middle portion is not more than −2.5° C./m, preferably not more than −5° C./m, or more preferably not more than 10° C./m. Although being not particularly limited, an upper limit to the temperature gradient over an area extending from the both widthwise ends to the widthwise middle portion is preferably not less than −100° C./m, more preferably not less than −50° C./m, or even more preferably not less than −25° C./m. It is preferable that each of the temperature gradients over an area extending from one of the both widthwise ends to the widthwise middle portion and over an area extending from the other of the both widthwise ends to the widthwise middle portion is not more than −2.5° C./m, because it realizes a graphite film sufficiently sagging in the middle portion thereof. Further, it is preferable that each of the temperature gradients over an area extending from one of the both ends to the middle portion and over an area extending from the other of the both widthwise ends to the widthwise middle portion is not less than −100° C., because it realizes a graphite film hardly torn when a tension is applied to the graphite film along the lengthwise direction thereof.

Through this production method, a graphite film 41 having a sag in a widthwise middle portion thereof (for example, see FIG. 4) is obtained.

(Sag b-Value of Graphite Film in Middle Portion)

The degree of sag of a graphite film having a sag in a middle portion thereof can be evaluated from a result of the measurement of a sag b-value. The sag b-value refers to a sag that occurs in a widthwise middle portion of a graphite film, when the film is set in a similar state to that in the measurement of sag described in JIS C2151.

The b-value of the graphite film having a sag in the middle portion thereof, as obtained in the second embodiment of the present invention, is not less than 5 mm, preferably not less than 20 mm, and more preferably not less than 40 mm. Although being not particularly limited, an upper limit to the b-value is preferably not more than 120 mm, more preferably not more than 100 mm, or even more preferably not more than 80 mm. A graphite film having the b-value of not less than 5 mm is preferable because the graphite film is less likely to suffer from folding wrinkles at ends thereof when subjected to the rolling process. Meanwhile, a graphite film having the b-value of not more than 120 mm is preferable because the graphite film is less likely to be torn when stretched in the lengthwise direction thereof. A method for measuring the b-value will be described in detail in the section "Examples".

2) Method for Producing Flat Graphite Film Having No Sag

The inventors of the present invention found that a flat graphite film having no sag is obtained by using a method for producing a graphite film including: a sag controlling step of treating a polymer film with heat within a temperature range from a starting temperature of thermal decomposition of the polymer film to a sag controlling temperature of the polymer film so that a temperature gradient over an area extending from both widthwise ends of the polymer film toward a widthwise middle portion of the polymer film is not less than −2.4° C./m and not more than 2.4° C./m; and a step of treating the film obtained in the sag controlling step with heat at a temperature of 2000° C. or higher after the sag controlling step.

According to the second embodiment of the present invention, in order to obtain a flat graphite film that has no sag, it is preferable that the temperature gradient over an area extending from the both ends toward the middle portion be not less than −2.4° C./m and not more than 2.4° C./m, preferably not less than −2.0° C./m and not more than 2.0° C./m, or more preferably not less than −1.0° C./m and not more than 1.0° C./m. In order to obtain a flat graphite film having a small sag, it is preferable that each of the temperature gradients over an area extending from one of the both ends toward the middle portion and over an area extending from the other of the both ends toward the middle portion be not less than be −2.4° C./m and not more than 2.4° C./m.

Through this production method, a graphite film 42 that is flat and has no sag (for example, see FIG. 4) is obtained.

(Sag Described in JIS C2151)

The flatness of a graphite film that is flat and has no sag can be evaluated by measuring a sag described in JIS C2151.

In the second embodiment of the present invention, it is preferable that the sag of a graphite film that is flat and has no sag be not more than 4.9 mm, preferably not more than 4 mm, more preferably not more than 3 mm, even more preferably not more than 1 mm, or especially preferably 0.1 mm. There is no particular lower limit. In order for the resulting graphite film to be able to laminated to a copper foil tape without wrinkles, it is preferable that the sag be not more than 4.9 mm. A method for measuring a sag will be described in detail in the section "Examples".

3) Method for Producing Graphite Film Having Sag at One End.

The inventors of the present invention found that a graphite film that is flat with sag at one end thereof is obtained by using a method for producing a graphite film including: a sag controlling step of treating a polymer film with heat within a temperature range from a starting temperature of thermal decomposition of the polymer film to a sag controlling temperature of the polymer film so that Temperature A≥Temperature B≥Temperature C and Temperature A≠Temperature C (where Temperature A is the temperature of one widthwise end of the polymer film, Temperature B is the temperature of a widthwise middle portion of the polymer film, and Temperature C is the temperature of the other widthwise end of the polymer film) and so that a temperature gradient from Temperature A to Temperature C is not less than 2.5° C./m; and a step of treating the film obtained in the sag controlling step with heat at a temperature of 2000° C. or higher after the sag controlling step.

In the second embodiment of the present invention, it is preferable, for the purpose of obtaining a graphite film 46 with sag at one end, that the temperature gradient from Temperature A to Temperature C be not less than 2.5° C./m, preferably 5° C./m, or more preferably 10° C./m. It is preferable, for the purpose of obtaining a graphite film with sag at one end, that the temperature gradient from Temperature A to Temperature C be not less than 2.5° C./m.

Through this production method, a graphite film 46 with sag at one end (for example, see FIG. 4) is obtained.

(Camber Described in JIS C2151)

The degree of distortion of a graphite film with sag at one end can be evaluated by measuring camber described in JIS C2151.

In the second embodiment of the present invention, it is preferable that the camber of a graphite film with sag at one end be not less than 11 mm, preferably not less than 15 mm, or more preferably not less than 20 mm. Although there is no particular upper limit, it is preferable that such an upper limit be not more than 80 mm, more preferably not more than 70 mm, or even more preferably not more than 60 mm. With a camber of not less than 11 mm, the graphite film can be easily laminated to a curved plate. Meanwhile, with a camber of not more than 80 mm, in order for the resulting graphite film to be hardly torn when stretched lengthwise, it is preferable that the camber be not more than 80 mm. A method for measuring camber will be described in the section "Examples".

Further, a graphite film sagging in one half area thereof extending from a widthwise middle portion to either one end thereof can be obtained by executing a sag controlling step that involves heat treatment under the condition Temperature A=Temperature B≥Temperature C or under the condition Temperature A≥Temperature B=Temperature C.

4) Application of the Production Methods in the Second Embodiment of the Present Invention Utilization of the concepts in the second embodiment of the present invention makes it possible to obtain a graphite film 43 with sags at both widthwise ends and to, by combining these sags, obtain graphite films with various types of sags such as those in the shapes of the letters M and W.

For example, a graphite film 43 with sags at both widthwise ends is obtained by using a method for producing a graphite film including: a sag controlling step of treating a polymer film with heat within a temperature range from a starting temperature of thermal decomposition of the polymer film to a sag controlling temperature of the polymer film so that a temperature gradient over an area extending from both widthwise ends of the polymer film toward a widthwise middle portion of the polymer film is not less than 2.5° C./m; and a step of treating the film obtained in the sag controlling step with heat at a temperature of 2000° C. or higher after the sag controlling step.

For example, a graphite film with a sag in the shape of the letter M is obtained by using a method for producing a graphite film including: a sag controlling step of treating a polymer film with heat within a temperature range from a starting temperature of thermal decomposition of the polymer film to a sag controlling temperature of the polymer film so that both widthwise ends of the polymer film and a widthwise middle portion of the polymer film are higher in temperature than the other portions of the polymer film; and a step of treating the film obtained in the sag controlling step with heat at a temperature of 2000° C. or higher after the sag controlling step.

For example, a graphite film with sags in the shape of the letter W is obtained by using a method for producing a graphite film including: a sag controlling step of treating a polymer film with heat within a temperature range from a starting temperature of thermal decomposition of the polymer film to a sag controlling temperature of the polymer film so that both widthwise ends of the polymer film and a widthwise middle portion of the polymer film are lower in temperature than the other portions of the polymer film; and a step of treating the film obtained in the sag controlling step with heat at a temperature of 2000° C. or higher after the sag controlling step.

(Mechanism by which the Effect of the Sag Controlling Step is Developed)

The mechanism by which the effect of the sag controlling step is developed is described below by taking, as an example, the case of a graphite film with sag in a middle portion thereof.

First, in the early stage of thermal decomposition of a polymer film, the polymer film is treated with heat so that both widthwise ends of the polymer film are relatively lower in temperature than a widthwise middle portion of the polymer film. The polymer film thus given a thermal hysteresis which varies across the width varies across the width in progress of graphitization in the graphitization step that follows the carbonization step (i.e. varies in degree of orientation of graphite crystallites), so that the lengthwise length of the graphite film in the middle portion is greater than the lengthwise lengths of the graphite film at both ends. Thus, when such a graphite film is observed in the widthwise direction thereof, the appearance of sags of the graphite film is confirmed in the middle portion of the graphite film, wherein the lengthwise length of the graphite film in the middle portion is longer than the length of the graphite film at its peripheral portions.

(Relationship Between the Sag Controlling Step and Conventional Method for Producing GS)

A usual example of a method for producing a graphite film from a polymer film in general is a method including: the carbonization step of treating the polymer film with heat at a temperature of up to approximately 1000° C. and the graphitization step of treating a carbonized film thus obtained in the carbonization step at a temperature of 2600° C. or higher. The sag controlling step according to the present invention serves to control a widthwise temperature distribution of the polymer film in the temperature range in the comparatively-early stage of the carbonization step.

Example of a method for producing a graphite film that involves the execution of the sag controlling step according to the second embodiment of the present invention encompass: a method of performing the sag controlling step and a temperature decreasing step in succession and then performing the carbonization step and the graphitization step; and a method of performing both the sag controlling step and the carbonization step in one process (performing the sag controlling step and subsequently performing the carbonization step, without a temperature decrease intervening between the sag controlling step and the carbonization step) and then performing the graphitization step.

<Definitions of Ends and Middle Portions of Polymer Film and of Graphite Film>

Omitted here as they are the same as those in the first embodiment.

<Widthwise Temperature Gradient in the Sag Controlling Step>

A graphite film with controlled sag is obtained by (a) treating a polymer film with heat while controlling the temperatures of the polymer film at both widthwise ends of the polymer film and the temperature of the polymer film in a widthwise middle portion of the polymer film within a temperature range from a starting temperature of thermal decomposition of the polymer film to a sag controlling temperature of the polymer film and then (b) executing the graphitization step. In this regard, a graphite film with controlled sag can also be obtained by arbitrarily setting the widthwise temperature gradient and/or temperature distribution of the film in a temperature range over the sag controlling temperature.

Further, in the second embodiment of the present invention, the temperature gradient over an area extending from both ends toward a middle portion refers to a temperature gradient over an area extending from an end 1 toward the middle portion and a temperature gradient over an area extending from an end 2 (i.e. the other end that is different from the end 1) toward the middle portion. With use of the temperatures of a film at the both ends and in the middle portion on a given straight line perpendicular to the lengthwise direction of the film and the width of the film as shown in FIG. 5, the temperature gradient over an area extending from the both ends toward the middle portion is expressed by the following equation:

Temperature Gradient over Area Extending from Both Ends toward Middle Portion=(Temperature of Film at Both Ends−Temperature of Film in Middle Portion)/(Width of Film/2)×100.

The temperatures of the film at the both ends and in the middle portion across a given width are values measured at the same time. In the present invention, Temperature A, Temperature B, and Temperature C refer to those temperatures measured at the points 53, 54, and 55 shown in FIG. 5 or those temperatures measured at the points 55, 54, and 53 shown in FIG. 5, respectively. Further, in the present invention, the temperature gradient from Temperature A to Temperature C is expressed by the following equation:

Temperature Gradient from Temperature $A$ to Temperature $C$=(Temperature $A$−Temperature $C$)/(Width of Film/2)×100.

Temperatures A and C at a given width are values measured at the same time.

<Decomposition Reaction and Weight Loss Rate in the Sag Controlling Step>

Omitted here as they are the same as those in the first embodiment.

<Method for Measuring the Temperature of a Film>

The second embodiment of the present invention makes it possible to control sag by treating a polymer film with heat while controlling the temperature of the polymer film widthwise within a temperature range of a starting temperature of thermal decomposition of the polymer film to a sag controlling temperature of the polymer film. Specifically, the method for measuring the temperature of a film in the second embodiment is the same as that in the first embodiment, and as such, is omitted here.

<Starting Temperature of Thermal Decomposition of the Polymer Film and the Sag Controlling Temperature of the Polymer Film>

The starting temperature of thermal decomposition of a polymer film in the second embodiment of the present invention is the same as that in the first embodiment.

The sag controlling temperature of a polymer film in the second embodiment of the present invention, too, is the same as that in the first embodiment. In a case where the sag controlling temperature is a temperature at which a weight loss rate of a polymer film does not exceed 20.0% (upper limit value to the sag control), the sag controlling step may be a single-stage sag controlling step or a multi-stage sag controlling step. Alternatively, the sag controlling step may be performed two or more times. By all these sag controlling steps, sag amplification can be realized. In such a case, the temperatures of widthwise ends of a film are set at the desired temperature until the sag controlling temperature reaches a temperature at which the weight loss rate of the film exceeds 20%. In a temperature range in which a weight loss rate exceeds 20.0%, there is no difference between a sag of a graphite film obtained as a final product under the condition that the temperatures of widthwise ends of a film are set at the desired temperature and a sag of a graphite film obtained as a final product without such a condition.

A specific measurement of a temperature at which a polymer film shows a weight loss rate of 20%, as the most preferable sag controlling temperature according to the second embodiment of the present invention, too, is the same as that in the first embodiment, and as such, is not described here.

<Starting Temperature of Thermal Decomposition of Polymer Film as Used in Examples of Second Embodiment of the Present Invention and Sag Controlling Temperature of the Polymer Film>

For polyimide films as used in Examples of the second embodiment of the present invention (polyimide films manufactured by Kaneka Corporation: Apical AH of 75 µm in thickness; and Apical NPI of 75 µm in thickness), the starting temperature of thermal decomposition of these polyimide films and the sag controlling temperature thereof are the same as those in the first embodiment. In a case where the sag controlling temperature does not exceed 655° C. (upper limit to the sag control), the sag controlling step may be a single-stage sag controlling step or a multi-stage sag controlling step. Alternatively, the sag controlling step may be performed two or more times. By all these sag controlling steps, sag amplification can be realized. In this case, the temperatures of widthwise ends of a film are set at the desired temperature until the sag controlling temperature reaches a temperature exceeding 655° C. In a temperature range exceeding 655° C., there is no difference between a sag of a graphite film obtained as a final product under the condition that the temperatures of widthwise ends of a film are set at the desired temperature and a sag of a graphite film obtained as a final product without such a condition.

<Method for Performing the Sag Controlling Step>

Figure 18:
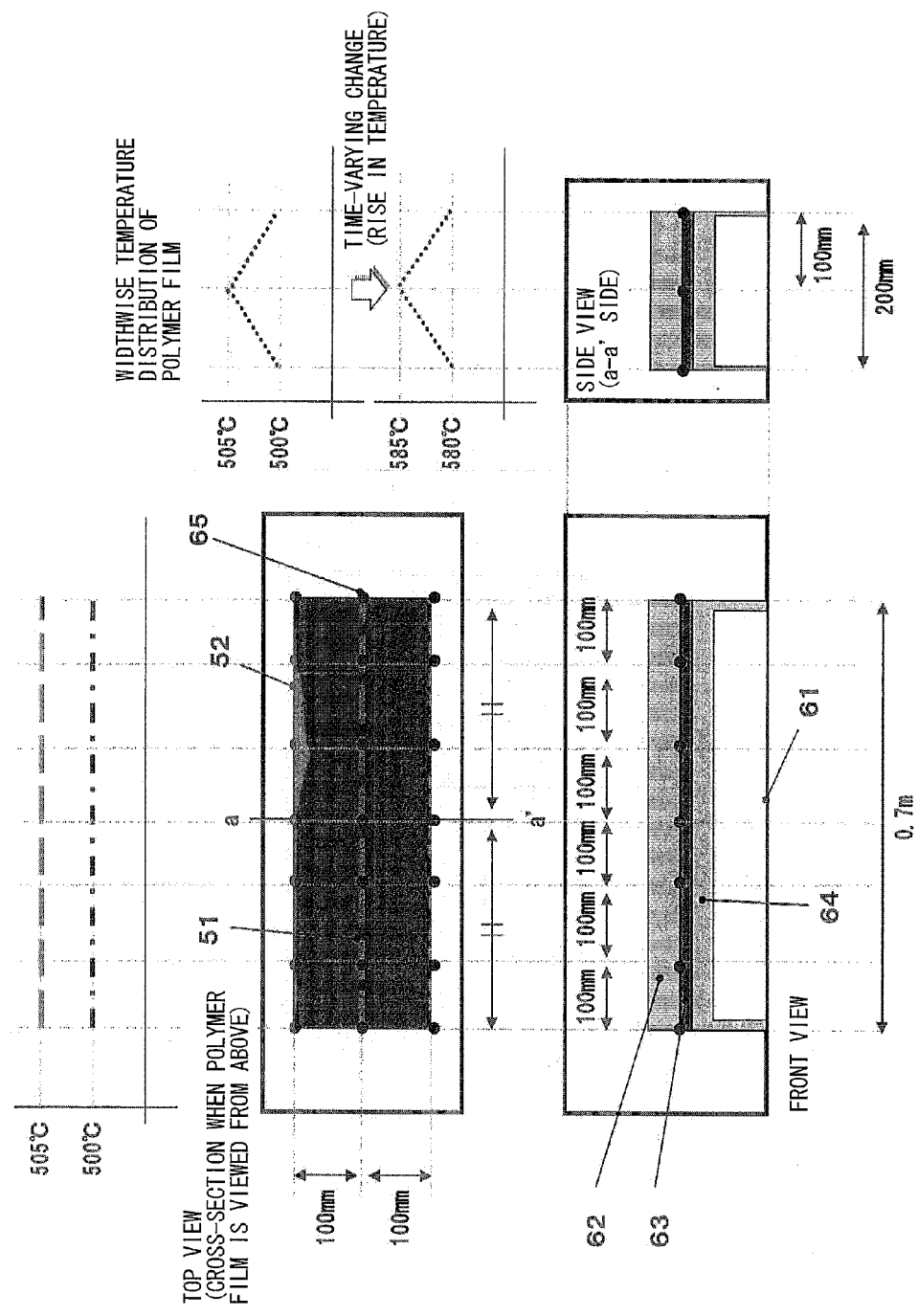
FIG. 18 is a schematic view showing a sag controlling step carried out by a sheet batch method.
Figure 19:
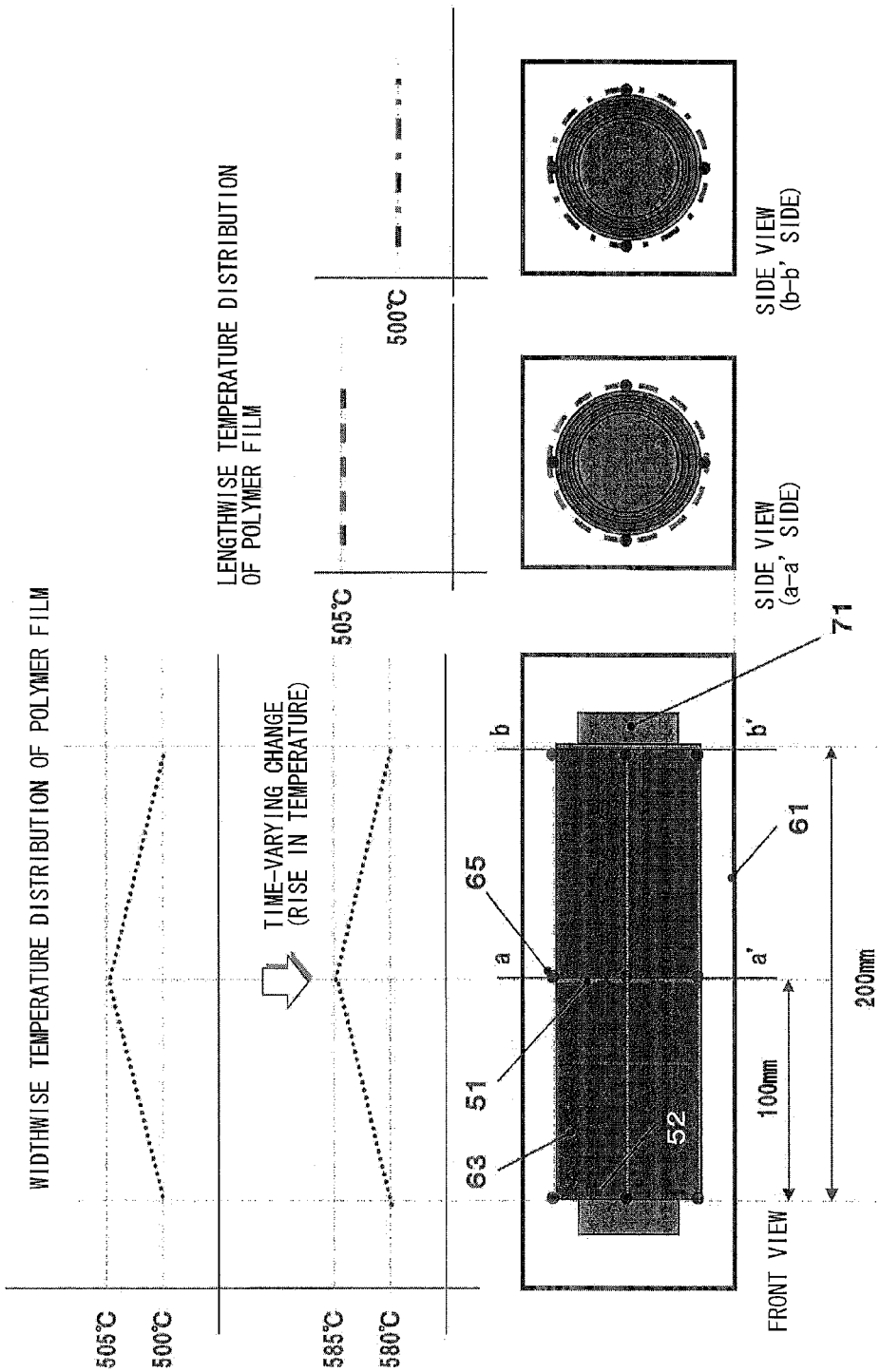
FIG. 19 is a schematic view showing a sag controlling step carried out by a cylindrical batch method.
Figure 20:
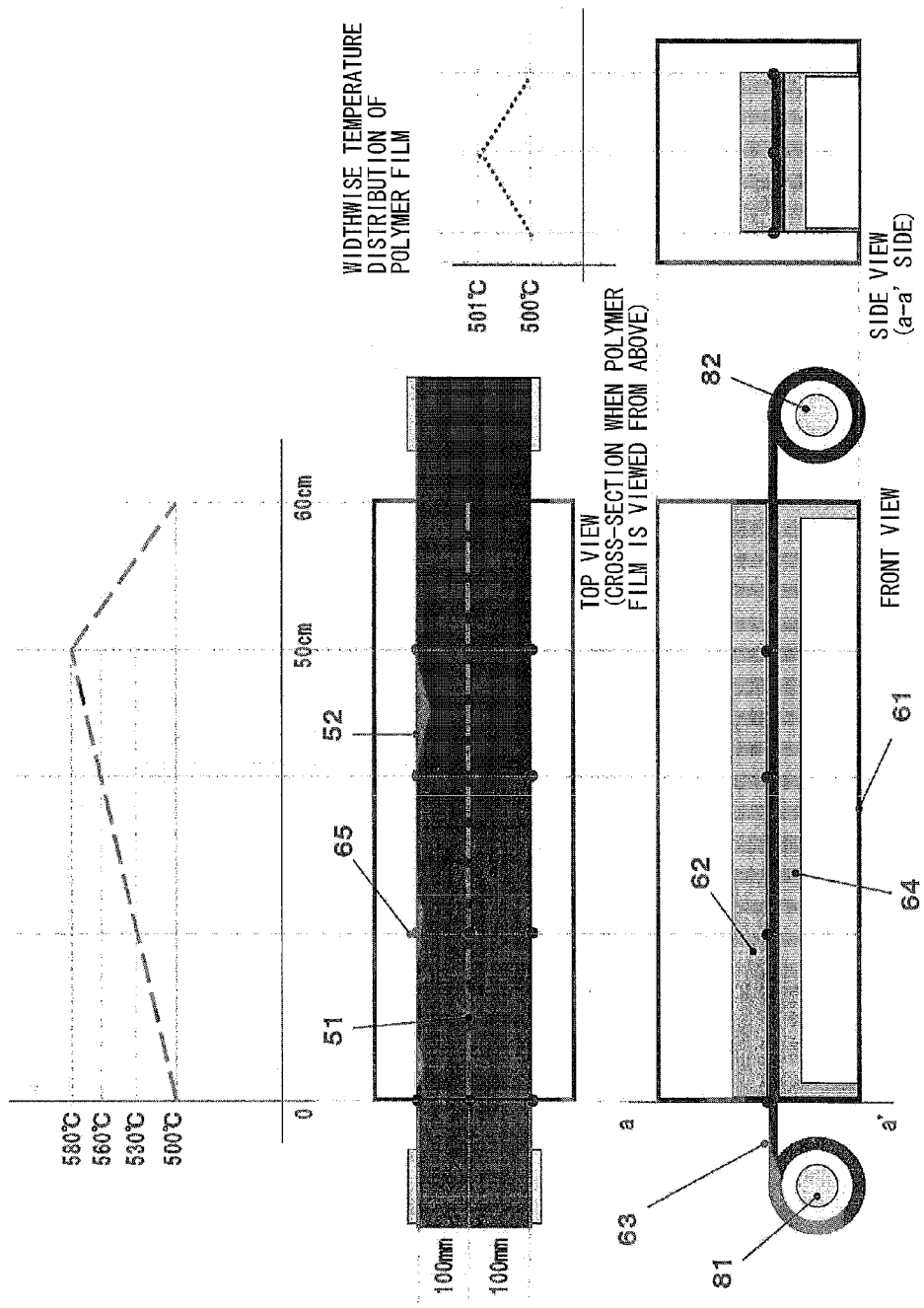
FIG. 20 is a schematic view showing a sag controlling step carried out by a continuous long film processing method.

In the sag controlling step, any method may be employed, without particular limitation, as a method of treating a polymer film with heat in a widthwise temperature gradient given to the polymer film. One example of such a method is a method of holding a sheet-type polymer film (which means "one or more polymer films in sheet form") by inserting the polymer film into a graphite jig within a heat treatment apparatus, and then heat-treating the polymer film batchwise (sheet batch method), as shown in FIG. 18. The other example is a method of holding a polymer film by wrapping around a graphite cylindrical container, and then heating the polymer film batchwise with heat (cylindrical batch method), as shown in FIG. 19. Another example is a method of subjecting a long polymer film to heat treatment while continuously supplying the long polymer film into the heat treatment apparatus (continuous processing method or continuous long film processing method), as shown in FIG. 20.

Note that the widthwise direction according to the second embodiment of the present invention is a direction along which a difference in temperature is given in the sag controlling step. In a case where a long film is to be employed, the widthwise direction thereof, which is not particularly limited, is preferably a short side of the film (a direction vertical to the lengthwise direction), from a viewpoint of enabling a further development of the effect of sagging. From a similar viewpoint, in a case where a continuous long film processing method is to be employed, it is preferable that the widthwise direction is preferably a TD direction rather than a MD direction.

In a case where the sag controlling step is performed in the sheet batch method, temperatures of the polymer film are increased within a temperature range from the starting temperature of thermal decomposition of the polymer film to the sag controlling temperature thereof in such a state that widthwise temperature control of a polymer film is carried of a polymer film shown in FIG. 18). In this case, the temperature range from the starting temperature of thermal decomposition of the polymer film to the sag controlling temperature needs to be controlled such that a difference in temperature across the width of the polymer film falls within the desired range. Particularly, it is preferable that, at the sag controlling temperature, temperature measurement points in the sag controlling step satisfy the desired condition for the difference in temperature across the widths of the polymer film. Further, it is preferable that at least 70% of the temperature measurement points in the sag controlling step satisfy the desired condition for the difference in temperature across the widths of the polymer film. Although it is particularly preferable that the difference in temperature constantly fall within a certain range, the difference in temperature may vary within a range yielding the effect of the present invention.

The measurement of temperatures of a polymer film is performed, as shown in FIG. 18, by means of 0.5 mm-diameter sheathed type K thermocouples placed in contact with the both ends of the polymer film and the middle portion of the polymer film at intervals of 100 mm along the lengthwise direction of the polymer film.

In the temperature range from the starting temperature of thermal decomposition to the sag controlling temperature, time-varying changes in temperature at the ends of the film and in the middle portion of the film are also measured at 30° C. intervals (at the points of time, 500° C., 530° C., 560° C., and 580° C., in a case where the starting temperature of thermal decomposition in the widthwise middle portion of the film and the sag controlling temperature are 500° C. and 580° C., respectively) starting from the starting temperature of the widthwise middle portion of the film. Such measurement is performed to confirm that for at least one of the four measured temperatures, preferably all these four measured temperatures, a difference in temperature across the width of the polymer film satisfies the desired condition.

As in the case where the sag controlling step is performed in the sheet batch method, in a case where the sag controlling step is performed in the cylindrical batch method, widthwise temperature control of a polymer film is carried out by increasing temperatures of the polymer film within a temperature range from the starting temperature of thermal decomposition of the polymer film to the sag controlling temperature thereof in such a state that a difference in temperature is given between the widthwise ends of the polymer film and the middle portion thereof (see one example of widthwise temperature distribution of a polymer film shown in FIG. 19). In this case, the temperature range from the starting temperature of thermal decomposition of the polymer film to the sag controlling temperature thereof needs to be controlled such that a difference in temperature across the width of the polymer film falls within the desired range. Particularly, it is preferable that, at the sag controlling temperature, temperature measurement points in the sag controlling step satisfy the desired condition for the difference in temperature across the widths of the polymer film. Further, it is preferable that at least 70% of the temperature measurement points in the sag controlling step satisfy the desired condition for the difference in temperature across the widths of the polymer film. Although it is particularly preferable that the difference in temperature constantly fall within a certain range, the difference in temperature may vary within a range yielding the effect of the present invention.

The measurement of temperatures of a polymer film is performed, as shown in FIG. 19, by means of 0.5 mm-diameter sheathed type K thermocouples placed in contact with the both ends of the polymer film and the middle portion of the polymer film at the respective points circumferentially provided at 90-degree intervals.

In the temperature range from the starting temperature of thermal decomposition to the sag controlling temperature, time-varying changes in temperature at the ends of the film and in the middle portion of the film are also measured at 30° C. intervals (at the points of time, 500° C., 530° C., 560° C., and 580° C., in a case where the starting temperature of thermal decomposition in the widthwise middle portion of the film and the sag controlling temperature are 500° C. and 580° C., respectively) starting from the starting temperature of the widthwise middle portion of the film. Such measurement is performed to confirm that for at least one of the four measured temperatures, preferably all these four measured temperatures, a difference in temperature across the width of the polymer film satisfies the desired condition.

The following will describe widthwise temperature control of a polymer film in a case where the sag controlling step is performed in the continuous processing method. As shown in FIG. 20, a polymer film is passed through a heat treatment apparatus which has been set so that a temperature gradient is given to a film in a lengthwise direction of the film (in this case, corresponding to the MD direction as well) within a temperature range from the starting temperature of thermal decomposition to the sag controlling temperature. As a result, the polymer film receives a thermal hysteresis within the temperature range from the starting temperature of thermal decomposition to the sag controlling temperature. In this case, the sag controlling step can be performed by subjecting a polymer film passing through the above heat treatment apparatus to heat treatment with a temperature difference given between the widthwise ends of the polymer film and the widthwise middle portion of the polymer film.

In the temperature range from the starting temperature of thermal decomposition to the sag controlling temperature, temperatures at the ends of the film and in the middle portion of the film are measured, by means of 0.5 mm-diameter sheathed type K thermocouples placed in contact with the both ends of the film and the middle portion of the film, at 30° C. intervals (see FIG. 8; at the points of time, 500° C., 530° C., 560° C., and 580° C., in a case where the starting temperature of thermal decomposition in the widthwise middle portion of the film and the sag controlling temperature are 500° C. and 580° C., respectively) starting from the starting temperature of the widthwise middle portion of the film. Such measurement is performed to confirm that for at least one of the four measured temperatures, preferably all these four measured temperatures, a difference in temperature across the width of the polymer film satisfies the desired condition.

The temperature range from the starting temperature of thermal decomposition of the polymer film to the sag controlling temperature needs to satisfy the desired condition for a difference in temperature across the width of the polymer film. Particularly, it is preferable that, at the sag controlling temperature, temperature measurement points in the sag controlling step satisfy the desired condition for the difference in temperature across the width of the polymer film. Further, it is more preferable that at least 70% of the temperature measurement points in the sag controlling step satisfy the desired condition for the difference in temperature across the width of the polymer film. Although it is particularly preferable that the difference in temperature constantly fall within a certain range, the difference in temperature may vary within a range yielding the effect of the second embodiment of the present invention.

In terms of productivity, the sag controlling step according to the second embodiment of the present invention is preferably performed by the continuous long film processing method. Also, from the viewpoint of facilitating widthwise temperature control of the polymer film, the sag controlling step according to the first embodiment of the present invention is preferably performed by the continuous long film processing method.

Examples of a method of controlling the temperature of the polymer film widthwise include: a method of controlling the temperatures of the widthwise ends of the polymer film and the temperature of the middle portion of the polymer film by independently controlling separate heaters which are respectively placed close to the side of the widthwise ends of the polymer film and the side of the middle portion of the polymer film; and a method of giving a desired difference in temperature with use of a heat insulator or the like. These methods are not the only possibilities, and any method may be employed.

<Graphite Film>

The graphite film in the second embodiment of the present invention is the same as that in the first embodiment.

<Method for Producing Graphite Film>

The method for producing a graphite film, too, is the same as that in the first embodiment.

<Environment and Other Conditions Inside Furnace in the Sag Controlling Step>

The sag controlling step of the second embodiment of the present invention may be performed in an inert gas (such as nitrogen or argon), an oxygen atmosphere, vacuum, or an atmosphere under a reduced pressure.

(Device for Controlling Tension>

In the second embodiment of the present invention, too, the tension adjustment device can be utilized in the same way as in the first embodiment.

<Total Transmittances of a Polymer Film and of Polymer Film Having been Subjected to the Sag Controlling Step>

The total transmittances of a polymer film and of a polymer film having been subjected to the sag controlling step are the same as those in the first embodiment.

<Load to be Applied to Polymer Film in its Thickness Direction>

A load to be applied to a polymer film in a thickness direction in the second embodiment of the present invention, too, is the same as that in the first embodiment.

<Line Speed>

The line speed in the second embodiment of the present invention, too, is the same as that in the first embodiment.

<Birefringence>

The birefringence in the second embodiment of the present invention, too, is the same as that in the first embodiment.

<Sag Controlling Step in Two or More Separate Stages>

The sag controlling step according to the second embodiment of the present invention may be performed in two or more separate stages. For example, assume that the sag controlling step is performed under the condition that the starting temperature of thermal decomposition is 500° C. and the sag controlling temperature is 655° C. In this case, the sag controlling step may be continuously performed in the temperature range from 500° C. to 655° C. such that the temperature of the film across the width is controlled. However, the sag controlling step may be performed in an alternative manner. That is, a first heat treatment is performed in a temperature range from 500° C. to 540° C., and a second heat treatment is performed in a temperature range from 540° C. to 655° C. (hereinafter, such a sag controlling step is referred to as "a separate sag controlling step".). In a case where the separate sag controlling step is performed, widthwise temperature control of the film in a first sag controlling step may be varied from widthwise temperature control of the film in a second or subsequent sag controlling step, instead of being identical to widthwise temperature control of the film in the second or subsequent sag controlling step. In this case, it is possible to obtain a combined effect of the effect achieved by the first sag controlling step performed in the range from 500° C. to 540° C. and the effect achieved by the second sag controlling step performed in the range from 540° C. to 655° C.

<Difference in Lengthwise Length Between Widthwise Ends and Widthwise Middle Portion of Graphite Film>

A difference in lengthwise length between the widthwise ends and widthwise middle portion of a graphite film in the second embodiment of the present invention is the same as that in the first embodiment.

3. Third Embodiment of the Present Invention

A third embodiment of the present invention relates to a graphite film with sag of 20.0 mm or less as evaluated according to the film windability evaluation under JIS C2151.

Further, the third embodiment of the present invention relates to a method for producing a graphite film including a straightening process step of heating treating a raw graphite film with heat up to not lower than 2000° C. while applying pressure to the raw graphite film, the straightening process step including treating the raw graphite film with heat with the raw graphite film wound around an inner core whose diameter accuracy is less than 0.0426%. By straightening the raw graphite film by using an inner core with high diameter accuracy, a flat graphite film with sag in a very small amount can be obtained.

The "sag" of a graphite film is the same as that in the first embodiment, and as such, is omitted here.

The sag of a graphite film in the third embodiment of the present invention is not more than 20 mm, preferably not more than 10 mm, more preferably not more than 5 mm, preferably not more than 4 mm, more preferably not more than 3 mm, even more preferably not more than 1 mm, or especially preferably not more than 0.1 mm. In order for the graphite film to be able to be laminated to a material, such as a copper foil tape, to which it has conventionally been difficult for a graphite film to be laminated, it is preferable that the sag be not more than 20 mm.

An example of the method for producing a graphite film in the third embodiment of the present invention is a method that involves the execution of a straightening-for-flatness step of treating the raw graphite film with heat up to not lower than 2000° C. while applying pressure to the raw graphite film. By using this straightening-for-flatness step to control the sagging of the raw graphite film, a graphite film with improved flatness can be produced.

<Raw Graphite Film>

The thermal diffusivity of the raw graphite film in the third embodiment of the present invention is preferably not less than 0.15 cm$^2$ per second, more preferably not less than 2.0 cm$^2$ per second, even more preferably not less than 4.0 cm$^2$ per second, or especially preferably not less than 7.0 cm$^2$ per second.

With a thermal diffusivity of not less than 0.15 cm$^2$ per second, there is only a small change in dimensions during the heat treatment sufficient progress of the graphitization, so that the straightening process can be easily executed. In particular, in a case where the straightening process is carried by utilizing a difference in thermal expansion between the inner core and the raw graphite film wound around the inner core, a small change in dimensions of the raw graphite film makes it easy for the raw graphite film to be pushed wide, so that the straightening effect is easily brought about. Since the raw graphite film has been turned into a film that is high in strength, flexible, and hard to tear, rewinding work, which will be described later, is easily carried out. Furthermore, with a thermal diffusivity of not less than 0.15 cm$^2$ per second, the raw graphite film is thermally migrates so smoothly that the straightening process can be uniformly carried out.

A method for measuring the thermal diffusivities of a raw graphite film and of a graphite film is described in section "Examples".

Further, in the third embodiment of the present invention, the number of times a raw graphite film is bent under MIT folding endurance test is preferably not less than 100 times, more preferably not less than 500 times, even more preferably not less than 5000 times, or especially preferably not less than 10000 times.

If the number of times the raw graphite film is folded is not less than 100 times, the resulting film will be high in strength, flexible, and hard to tear, so that the rewinding work, which will be described later, is easily carried out.

A method for evaluating a raw graphite film and a graphite film under MIT folding endurance test is described in the section "Examples".

The straightening process may be performed on a raw graphite film whose shape needs to be changed, or the straightening process step may be added to a process for producing a graphite film. Alternatively, a graphite film once subjected to the straightening process may be subjected again to the straightening process as a raw graphite film.

Further, in the third embodiment of the present invention, a raw graphite film obtained by treating a polymer film with heat at a temperature of 2000° C. or higher is cooled down at least once to a temperature condition of lower than 2000° C., and then the straightening process step is carried out, so that a graphite film straightened for flatness can be obtained. Going through a temperature condition of lower than 2000° C. means that a raw graphite film synthesized by heat treatment is cooled down once, which makes it easy to make preparations for the straightening process such as the rewinding step.

<Length and Width of Raw Graphite Film>

The width of a raw graphite film means the length of a shorter side of a continuous sheet of raw graphite film. The width of a raw graphite film in the third embodiment of the present invention is not particularly limited. However, with a greater width, the effect of sag control by the straightening process step can be remarkably exhibited, as a greater width makes it more difficult to control sag. The width of a raw graphite film in the third embodiment of the present invention is preferably not less than 100 mm, more preferably not less than 200 mm, or even more preferably not less than 400 mm. With a width of not less than 100 mm, the effect of sag control in the third embodiment of the present invention can be remarkably exhibited.

The length of a raw graphite film means the length of a longer side of a continuous sheet of raw graphite film. The length of a raw graphite film in the third embodiment of the present invention is not particularly limited. However, it is preferable to have a continuity of not less than 4.0 m, more preferably not less than 10.0 m, or even more preferably 20.0 m. A continuity of not less than 4.0 m makes it possible to obtain a long graphite film with controlled sag.

<Method for Applying Pressure in the Straightening-for-Flatness Step>

In the third embodiment of the invention, the method of straightening for flatness is a method in which the flatness of a poorly-flat raw graphite film with sag is improved by heating the raw graphite film with heat at a temperature of 2000° C. or higher while applying pressure to the raw graphite film.

Examples of methods for applying pressure include, but are not particularly limited to, (i) a method in which a load is applied onto a surface of a sheet of raw graphite film, (ii) a method in which a roll of raw graphite film is pushed wide from the inside, and (iii) a method in which a raw graphite film is stretched.

Figure 26:
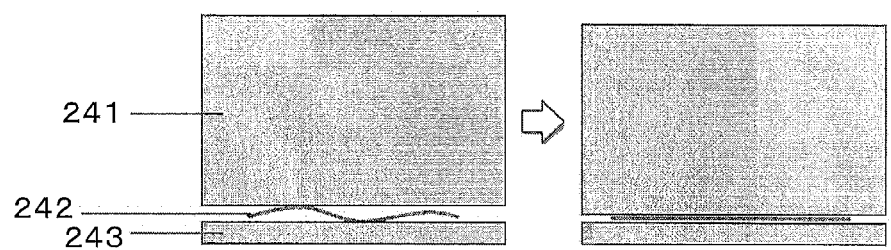
FIG. 26 is a view showing a method of applying a load to the surface of a raw graphite film in sheet form.

(i) According to the method in which a load is applied onto a surface of a sheet of raw graphite film, it is possible, as shown in FIG. 26, to place a weight on a film surface or to apply pressure by carrying out pressing during heat treatment. According to this method, the pressure required for straightening for flatness is not less than 5 g/cm$^2$, preferably not less than 5 g/cm$^2$, or more preferably not less than 100 g/cm$^2$. If the pressure required for straightening for flatness is not less than 5 g/cm$^2$, the straightening effect is brought about. An upper limit on the pressure needs only be such that the film is not damaged.

Figure 38:
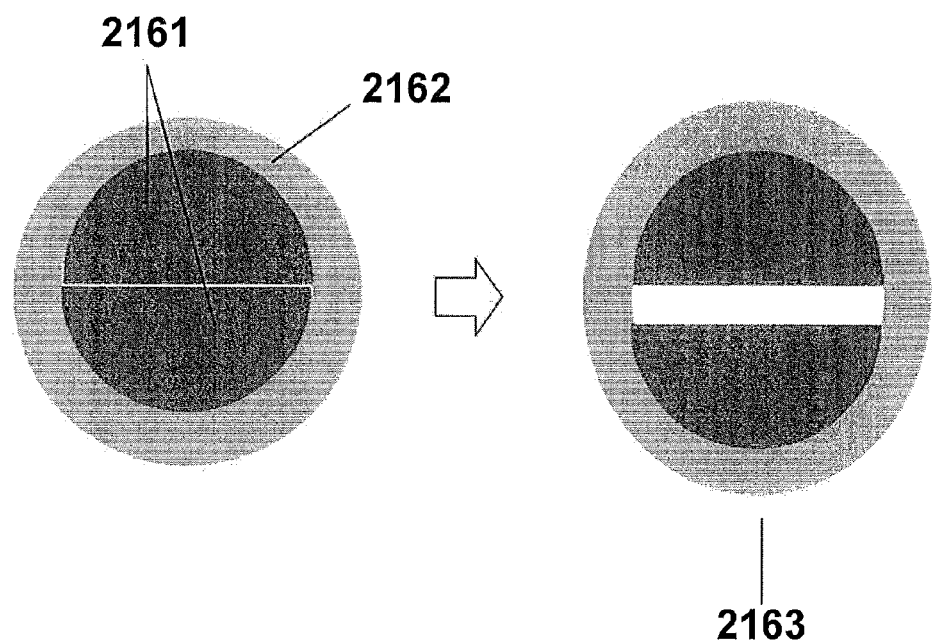
FIG. 38 is a view showing the straightening process with use of an expendable inner core.
Figure 39:
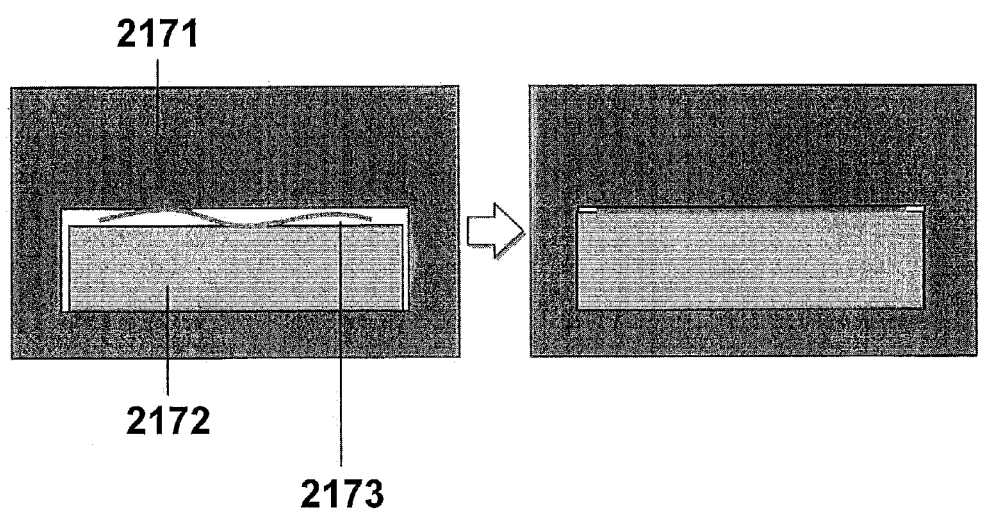
FIG. 39 shows a jig for straightening a film in sheet form by utilizing a difference in thermal expansion.

(ii) An example of the method in which a roll of raw graphite film is pushed wide from the inside is a method in which a raw graphite film is wound around an expandable inner core and pressure is applied from the inner core to the raw graphite film. FIG. 38 shows an example method in which a divided inner core pushes a raw graphite film wide outward.

According to this method, the pressure required for straightening for flatness may be 5 g/cm$^2$, preferably not less than 5 g/cm$^2$, or more preferably not less than 100 g/cm$^2$ from the inner core to the inner surface on the innermost circumference of the raw graphite film wound around the inner core. With a pressure of not less than 5 g/cm$^2$, the straightening effect is brought about. An upper limit on the pressure needs only be such that the film is not damaged.

Figure 27:
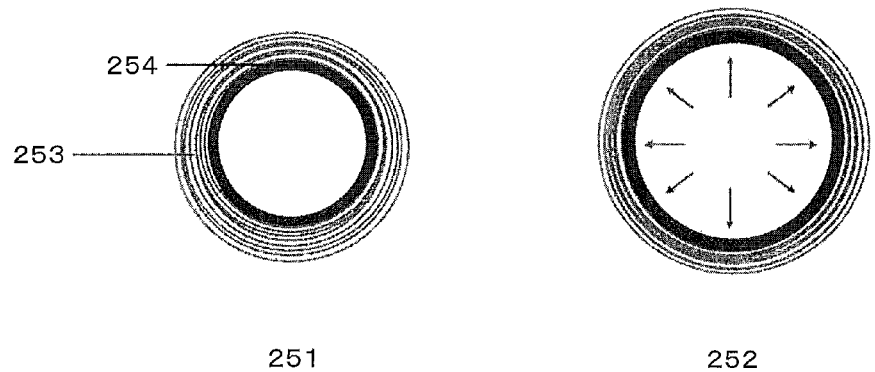
FIG. 27 shows a method of pushing wide a raw graphite film by utilizing thermal expansion of an inner core.

FIG. 27 shows an example method in which a raw graphite film is pushed wide by utilizing a thermal expansion of an inner core. This method is preferred because the straightening process can be easily carried out without providing a special mechanism in a furnace. A raw graphite film having sufficiently progressed in graphitization has its graphite crystallites highly oriented in the plane direction, and as such, is small in thermal expansion in the plane direction. When treated with heat while being wound around an inner core made of graphite, the raw graphite film is easily pushed wide by the inner core having thermally expanded with a great effect brought about by the straightening process step. It is preferable that the raw graphite film be treated while being wound around the inner core.

According to this method, the pressure required for straightening for flatness cannot be measured, and can instead be defined by the strength of tight winding in the rewinding step. The strength of tight winding in the rewinding step in the third embodiment of the present invention is not less than 1 N·m/m, preferably not less than 5 N·m/m, more preferably not less than 10 N·m/m, even more preferably not less than 100 N·m/m, or especially preferably not less than 200 N·m/m. With a strength of tight winding of not less than 1 N·m/m, sufficient pressure is applied in the straightening step from the inner core to the inner surface on the innermost circumference of the raw graphite film wound around the inner core, so that the straightening effect is brought about. An upper limit on the strength of tight winding needs only be such that the film is not damaged.

(iii) Straightening For Flatness can Also be Carried Out by Treating a Raw Graphite Film with Heat while Stretching the Raw Graphite Film.

According to this method, the pressure required for straightening for flatness can be defied as tension on the film. The tension required for straightening for flatness is not less than 5 g/cm, preferably 20 g/cm, or more preferably 50 g/cm. With a tension of not less than 5 g/cm, the straightening effect is brought about. An upper limit on the tension needs only be such that the film is not damaged.

The maximum temperature required for straightening for flatness is not lower than 2000° C., preferably not lower than 2200° C., more preferably not lower than 2400° C., even more preferably not lower than 2600° C., still even more preferably not lower than 2750° C., or especially preferably not lower than 2800° C. At not lower than 2000° C., a raw graphite film whose graphite crystallites has begun to rearrange themselves can be easily straightened. Further, in a case where the straightening process is carried by utilizing a difference in thermal expansion between the inner core and the raw graphite film wound around the inner core, a temperature of not lower than 2000° C. widens the difference in thermal expansion between the inner core and the raw graphite film, so that the raw graphite film is easily straightened.

Further, the method for producing a graphite film in the third embodiment of the present invention may include the straightening process step. The straightening process step is a method for straightening a raw graphite film for flatness by applying heat and pressure to the raw graphite film, and can be accompanied by rewinding and the like.

A raw graphite film in the third embodiment of the present invention may be a fired polymer-derived graphite film or a natural graphite film. A fired polymer-derived type of graphite film has its graphite crystallites better arranged that those of a natural graphite film, and as such, is small in coefficient of thermal expansion in the plane direction. A fired polymer-derived type of graphite film brings about a greater effect when the raw graphite film is straightened while being wound around the inner core than dose a natural graphite film.

<Example of a Step of Producing a Graphite Film in which a Carbonization Step and a Straightening Process Step are Included in a Series of Graphite Producing Steps>

An example of a step of producing a graphite film in which a carbonization step and a straightening process step are included in a series of graphite producing steps is described. a) a carbonization step, b) graphitization step, and c) a straightening process step may be included.

a) The carbonization step is a step of pre-heating a polymer film to a temperature of at least 800° C., and is a step of obtaining a carbonized film through thermolysis of the polymer film. Examples of a method for holding a polymer film include: a method for holding a polymer film by cutting it into a sheet and placing it under a plate or sheet in a rectangular jig; a method for holding an elongated polymer film by winding it around an inner core jig; etc. It is preferable that a jig that is used for such a method be made of a heat-resistant material such as a graphite material. Further, it is preferable that the inner core around which a polymer film is wound be in the shape of a cylinder. Another example of such a method is a method in which a film wound around a roll is fired while being rewound around another roll.

The resulting carbonized film is a glass-like film that weights about ⅙ of the polymer film.

b) The graphitization step is a step of preparing a raw material polymer film by heating, at a temperature of not lower than 1800° C., either the carbonized film prepared in the carbonization step or a polymer film. The maximum graphitization temperature is not lower than 1800° C., more preferably not lower than 2000° C., more preferably not lower than 2200° C., even more preferably not lower than 2400° C., still even more preferably not lower than 2600° C., or especially preferably not lower than 2800° C. With a temperature of not lower than 1800° C., the graphitization sufficiently progresses, so that the resulting raw graphite film is small in change in dimensions and easily improves in flatness in the subsequent straightening process step. Especially in a case where the straightening process is carried out by winding a raw graphite film around the inner core and utilizing a difference in thermal expansion between the inner core and the raw graphite film, a small change in dimensions of the raw graphite film makes it easy for the raw graphite film to be pushed wide by the inner core, so that the straightening effect is easily brought about. Further, with a temperature of not lower than 1800° C., the resulting graphitized film is high in strength, flexible, and hard to tear, so that rewinding work is easily carried out.

Either the carbonization step and the graphitization step may be carried out in a sequential way, or the graphitization step may be carried out alone after the carbonization step is finished. It should be noted that a graphite film finished with the graphitization step but not with the straightening step is called "raw graphite film".

c) In a case where the straightening process step is added, it may be performed on a raw graphite film obtained by carrying out the graphitization step. Either the straightening process step and the graphitization step may be carried out in a sequential way, or the straightening process step may be carried out alone after the graphitization step is finished.

<Method for Straightening Raw Graphite Film by Treating the Raw Graphite Film with Heat with the Raw Graphite Film Wound Around Inner Core and Utilizing Thermal Expansion of the Inner Core>

In the third embodiment of the present invention, the straightening process step is preferably achieved by a method for straightening a raw graphite film by treating the raw graphite film with heat with the raw graphite film wound around an inner core. According to this method, in the course of heat treatment, thermal expansion of the inner core as shown in FIG. 27 causes the raw graphite film, which is low in thermal expandability, to be pushed wide and straightened. This method makes it possible to obtain a large-area and highly flat graphite film in a limited space.

(Inner Core)

In the third embodiment of the present invention, the shape of the inner core around which a raw graphite film is wound around may be, but is not particularly limited to, a cylindrical shape, a polygonal columnar shape, etc. A cylindrical inner core is preferred because it can uniformly transmit power to the raw graphite film in the straightening process so that a good quality graphite film is obtained.

The outer perimeter of the inner core that is used in the third embodiment of the present invention is not particularly limited, but is preferably not less than 62.8000 mm, more preferably 157.0000 mm, or even more preferably not less than 251.2000 mm. If the inner core has a diameter of 62.8000 mm, the amount of expansion of the inner core is so sufficient that the raw graphite film is pushed wide and straightened. This also allows the graphite film to be less curly and be easily drawable.

The coefficient of thermal expansion of the inner core that is used in the third embodiment of the present invention is not particularly limited, but is preferable not less than $0.3 \times 10^{-6}$/K and not more than $7.5 \times 10^{-6}$/K, more preferably not less than $0.7 \times 10^{-6}$/K and not more than $6.5 \times 10^{-6}$/K, or even more preferably not less than $2.0 \times 10^{-6}$/K and not more than $5.0 \times 10^{-6}$/K. If the inner core has a coefficient of thermal expansion of not less than $0.3 \times 10^{-6}$/K, the amount of expansion of the inner core is so sufficient that the raw graphite film is pushed wide and straightened. Further, if the inner core has a coefficient of thermal expansion of not more than $7.5 \times 10^{-6}$/K, the raw graphite film will not be torn by being pushed too wide. Especially, if the inner core has a coefficient of thermal expansion of not less than $2.0 \times 10^{-6}$/K and not more than $5.0 \times 10^{-6}$/K, it is possible to sufficiently straighten sag without causing the film to suffer from a tearing defect.

In terms of heat resistance, it is preferable that the inner core be made of graphite, in particular an extrusion molded product, a molded product, a CIP molded product, or the like.

(Accuracy of the Diameter of the Inner Core)

The accuracy of the diameter of the inner core can be expressed by the following equation:

Accuracy of Diameter (%)=(Maximum Value of Outer Perimeter−Minimum Value of Outer Perimeter)/Minimum Value of Outer Perimeter×100 where the maximum and minimum values of the outer perimeter of the inner core are each a value of the outer perimeter of the inner core around which the raw graphite film is being wound.

A method for measuring the outer perimeter of the inner core is such that measurements are performed by a method capable of measurements with such accuracy as a resolution of not more than 0.2 μm. For example, high-accuracy measurements are possible with a three-dimensional measuring machine (Model: UPMC 850 CARAT Ultra) available from Tokyo Seimitsu Co., Ltd.

The accuracy of the diameter of the inner core that is used in the third embodiment of the present invention is not more than 0.0426%, preferably not more than 0.0107%, more preferably not more than 0.0027%, even more preferably not more than 0.0006%, or especially preferable 0.0000%. If the accuracy of the diameter is not more than 0.0426%, the resulting graphite film is flack with sag of 20 mm or less.

(Rewinding Step)

In the execution of the straightening process step with a raw graphite film wound around the inner core, it is preferable that the raw graphite film be tightly wound around the inner core. Therefore, in the third embodiment of the present invention, a rewinding step of winding a raw graphite film around the inner core be included prior to the execution of the straightening process. In the rewinding step, a rewinding apparatus can be used. In the rewinding step, it is preferable that the raw graphite film be wound with its ends aligned, because doing so allows force from the inner core to be evenly transmitted in the straightening process. This leaves no place on the film where the pressure is not transmitted, thus enhancing the effect of the straightening process. It is possible to align the ends by using an edge position control (control apparatus which automatically carries out an operation of uniformly aligning film edges, so-called "ends").

Figure 28:
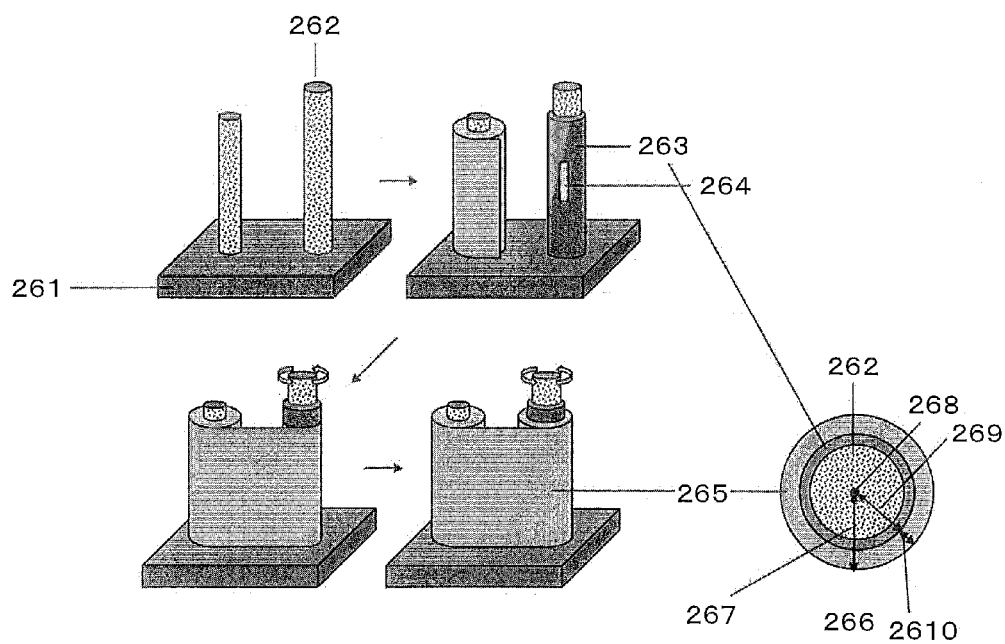
FIG. 28 shows one example of a rewinding step.

Alternatively, as shown in FIG. 28, it is also possible to use a vertical rewinding apparatus to rewind the film with its ends aligned. The rewinding work is facilitated by fixing the raw graphite film onto the inner core with a double-sided adhesive tape and then starting to wind the raw graphite film.

The strength of tight winding in the third embodiment of the present invention is the product of the torque of the rotating shaft of the core and the outermost radius of a roll of raw graphite film (see FIG. 28). The raw graphite film is tightly wound until the stoppage of rotation of the rotating shaft by rotating the rotating shaft at a predetermined torque with the raw graphite film fixed so that the outermost circumference does not move. For example, if the radius of the inner core of the raw graphite film of FIG. 28 is 50 mm, the winding thickness 2610 of the raw graphite film is 5 mm, and the torque of the rotating shaft 4N·m, the strength of tight winding is 220 N·m/m.

The strength of tight winding in the rewinding step in the third embodiment of the present invention is not less than 1 N·m/m, preferably not less than 5 N·m/m, more preferably not less than 10 N·m/m, even more preferably not less than 100 N·m/m, or especially preferably not less than 200 N·m/m. With a strength of tight winding of not less than 1 N·m/m, the force of expansion of the inner core is transmitted to the outer circumference of the roll of raw graphite film, so that the resulting graphite film has improved flatness. In particular, with a strength of tight winding of not less than 200 N·m/m, the resulting graphite film has sufficiently improved flatness.

(Method for Fixing Ends)

In a case where the straightening process is carried out with a raw graphite film wound around the inner core, the straightening effect is hardly brought about if the raw graphite film is loosened from the inner core during the heat treatment. Therefore, it is necessary to fixedly wind a raw graphite film so that the raw graphite film is not loosened. A possible example of doing so is to prevent loosening by placing on the outermost circumference of a raw graphite film wound around the inner core. Another possible example is to simply placing a wound raw graphite film sideways so that the raw graphite film is fixed by its own weight in a way that it does not get loosened. Still another possible example is to fix a raw graphite film by stretching it by the outermost peripheral ends. Furthermore, an effective example is to suppress loosening while controlling the pressure under which a raw graphite film is fixed. Any fixing method may be employed unless the winding gets loosened.

<Length and Widths of a Graphite Film>

The width of a graphite film means the length of a shorter side of a continuous sheet of graphite film. The width of a graphite film in the third embodiment of the present invention is not particularly limited. However, with a greater width, the effect of sag control by the straightening process step can be remarkably exhibited, as a greater width makes it more difficult to control sag. The width of a graphite film in the third embodiment of the present invention is preferably not less than 100 mm, more preferably not less than 200 mm, or even more preferably not less than 400 mm. With a width of not less than 100 mm, the effect of sag control in the third embodiment of the present invention can be remarkably exhibited.

The length of a graphite film means the length of a longer side of a continuous sheet of graphite film. The length of a raw graphite film in the third embodiment of the present invention is not particularly limited. However, it is preferable to have a continuity of not less than 4.0 m, more preferably not less than 10.0 m, or even more preferably not less than 20.0 m. A continuity of not less than 4.0 m makes it easy to carry out lamination, rewinding, etc.

Further, the continuity of graphite films having two different sagging shapes may be preferably not less than 2.0 m, more preferably not less than 5.0 mm, or even more preferably 10.0 mm. A continuity of not less than 2.0 mm makes it easy to carry out lamination, rewinding, etc.

<Polymer Film>

An example of a polymer film that is used in the third embodiment of the present invention is, but is not particularly limited to, a film of a polymer selected from the group consisting of polyimide (PI), polyamide (PA), polyoxadiazole (POD), polybenzooxazole (PBO), polybenzobisoxazole (PBBO), polythiazole (PT), polybenzothiazole (PBT), polybenzobisthiazole (PBBT), polyparaphenylenevinylene (PPV), polybenzoimidazole (PBI), and polybenzobisimidazole (PBBI). Use of at least one of these polymers makes it easy to obtain a raw graphite film and a graphite film that are excellent in crystallinity, thermal diffusivity, and thermal conductivity. Use of polyimide is especially preferred. It should be noted that a polymer film taken as an example in the third embodiment of the present invention can of course be used in the first and second embodiments of the present invention.

Thus far, the first to third embodiments of the present invention have been described. The term "sag" as used in the present invention is defined below with reference to the drawings.

Figure 40:
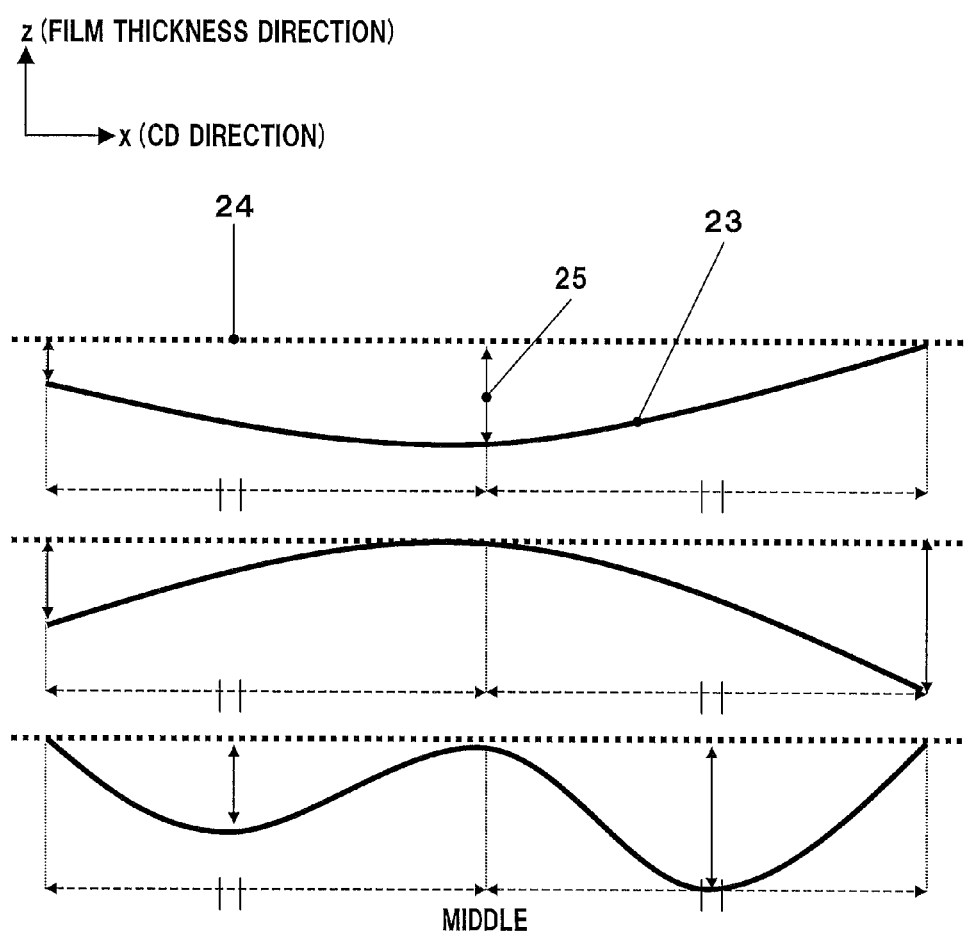
FIG. 40 is a view of a graphite film having bilaterally asymmetric sag.

As shown in FIG. 40, the term "bilaterally asymmetric sag" refers to sag formed in a shape such that the graphite film has two different halves with respect to a widthwise middle portion thereof.

Figure 41:
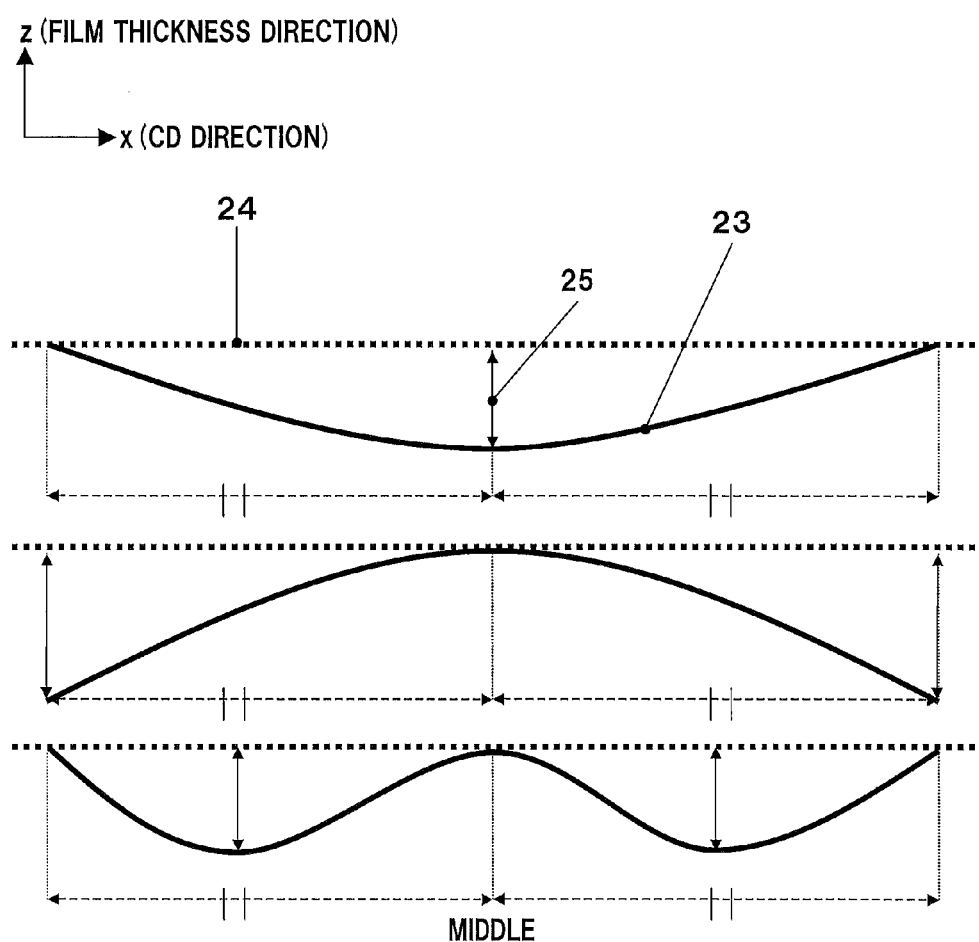
FIG. 41 is a view of a graphite film having bilaterally symmetric sag.

As shown in FIG. 41, the term "bilaterally symmetric sag" refers to sag formed in a shape such that the graphite film has two equal halves with respect to a widthwise middle portion thereof.

Figure 42:
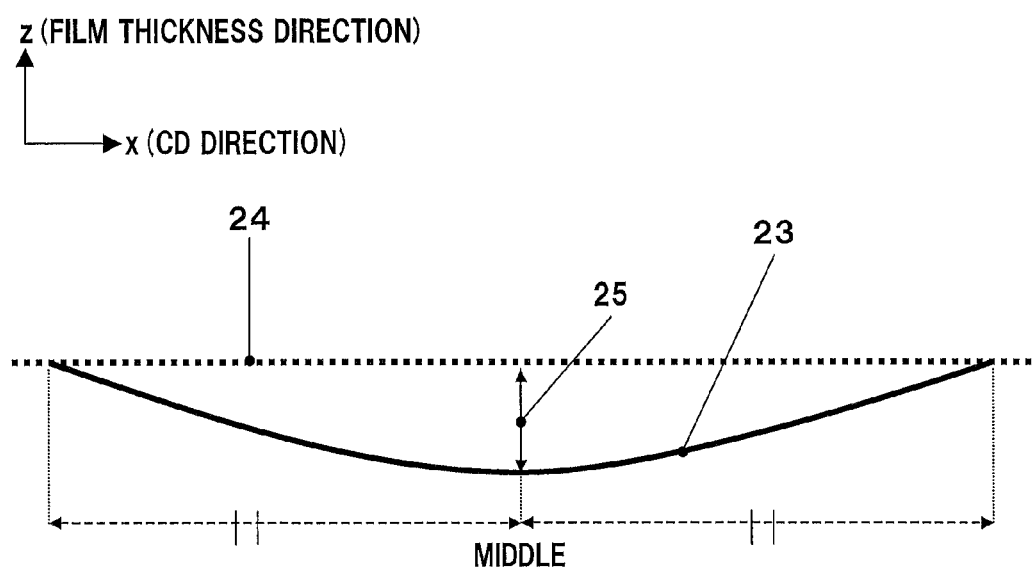
FIG. 42 is a view of a graphite film having a sag in a middle portion thereof.

As shown in FIG. 42, the term "sag in a middle portion" refers to sag formed in a shape such that a graphite film is more sagging in the widthwise middle portion than at the widthwise ends.

Figure 43:
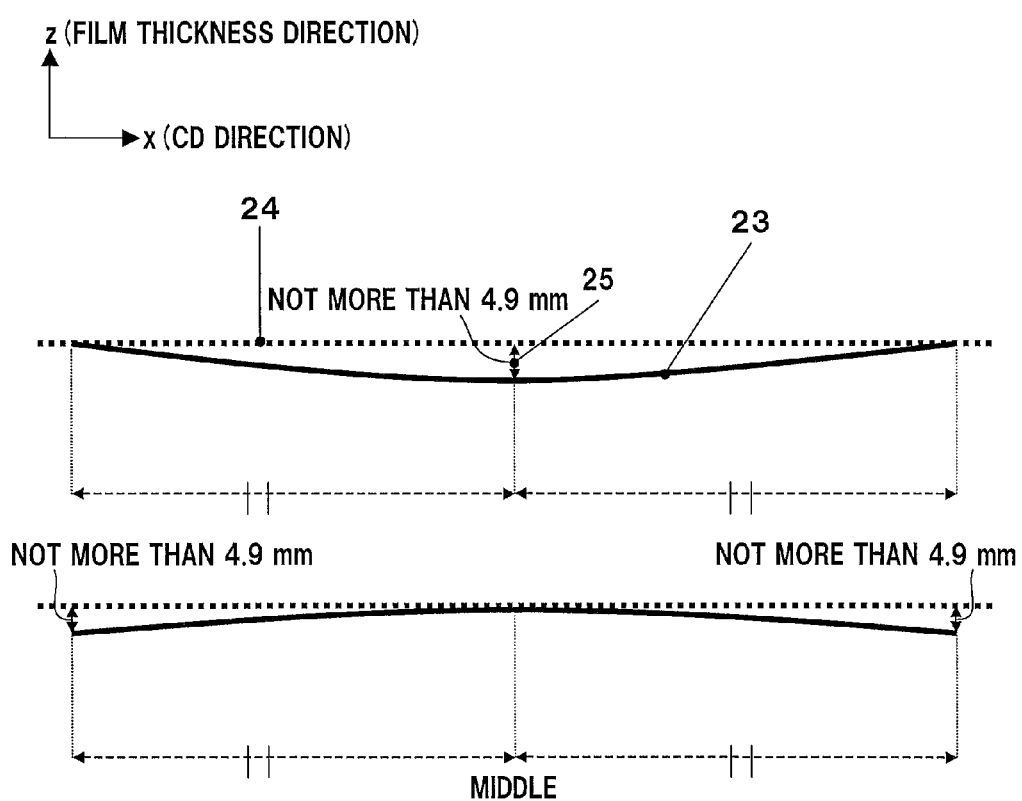
FIG. 43 is a view of a graphite film having a sag of not more than 4.9 mm.

As shown in FIG. 43, the term "sag of not more than 4.9 mm" refers to sag in a shape such that the deepest sag in the whole area extending across the width of the graphite film is not more than 4.9 mm.

Figure 44:
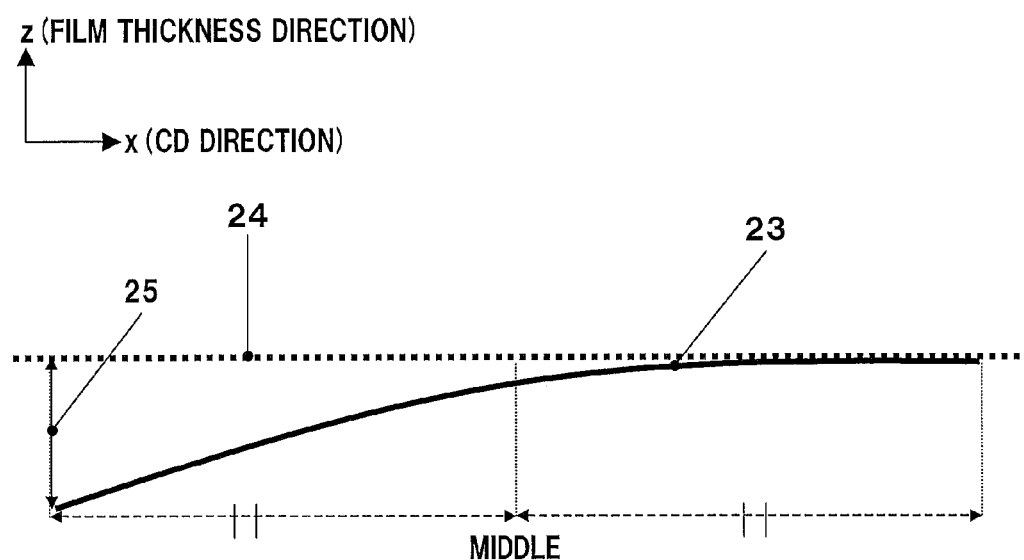
FIG. 44 is a view of a graphite film having a sag at one end thereof.

As shown in FIG. 44, the term "sag lying at one end" refers to a sag in a shape such that the graphite film has a sag lying at one widthwise end thereof.

Figure 45:
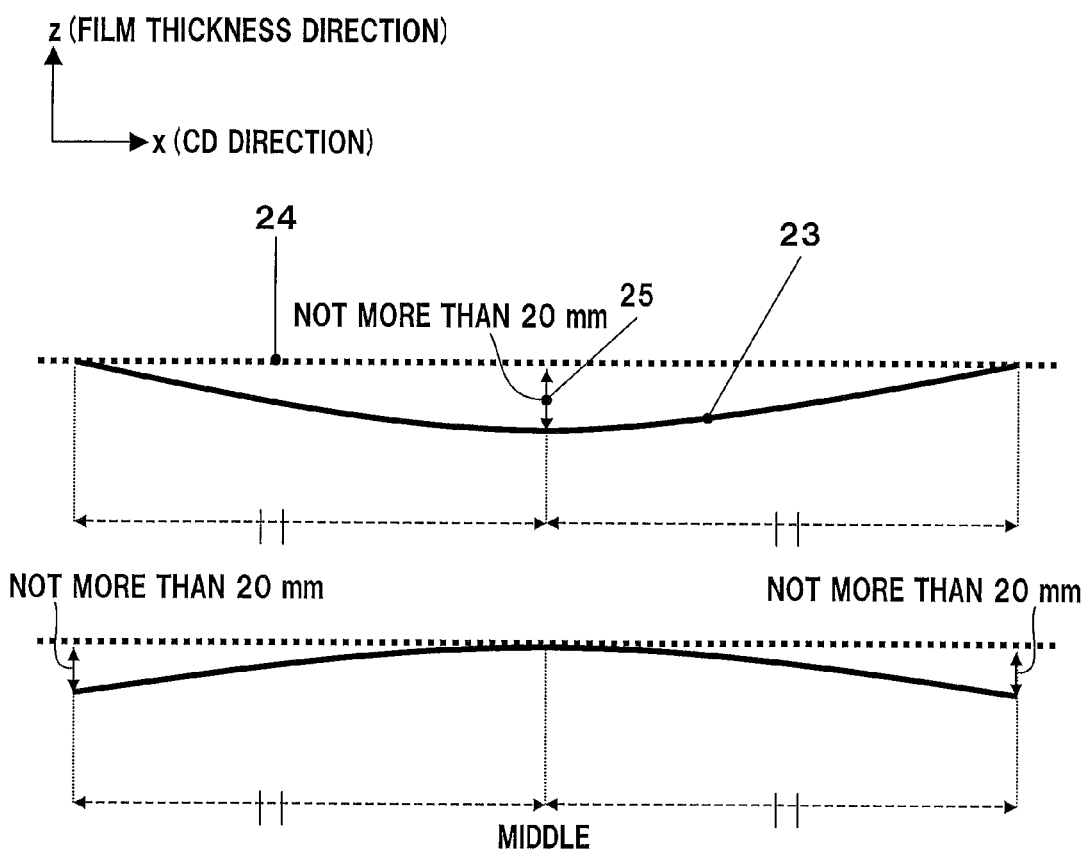
FIG. 45 is a view of a graphite film having a sag of not more than 20 mm.

As shown in FIG. 45, the term "sag of not more than 20 mm" refers to sag in a shape such that the largest sag in the whole area extending across the width of the graphite film is not more than 20 mm.

The present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

The following description will discuss various Examples of the present invention and several Comparative Examples.

Examples A According to First Embodiment

<Conditions for Measurement of Various Physical Properties>
<Physical Properties of Polymer Film>
<Birefringence>

A birefringence of each polymer film was measured by using a Metricon's refractive index and film thickness measuring system (Model: 2010 PRISM COUPLER). The measurement was carried out by measuring refractive indices of the polymer film in TE and TM modes, respectively, with use of a light source at a wavelength of 594 nm in an atmosphere having a temperature of 23° C. and a humidity of 50% and obtaining the value of TE−TM as the birefringence.

<Physical Properties of Polymer Film after Sag Controlling Step>
<Cracking (Paper Tube Wrap-Around Test)>

Evaluation was carried out to determine how each polymer film having been subjected to the sag controlling step was prone to cracking. The evaluation was carried out in the following manner: (i) a polymer film having been subjected to the sag controlling step was kept in an atmosphere having a temperature of 23° C. and a humidity of 50% for 24 hours, (ii) after that, the polymer film was wrapped around paper tubes of various diameters five turns each with a tensile strength of 30 kgf/cm$^2$ in an atmosphere having a temperature of 23° C. and a humidity of 50%, and (iii) whether the polymer film cracked or not was checked. The evaluation criteria are as follows. The polymer film was rated as: "A" if it did not crack even when wrapped around a 1-in. diameter paper tube; "B" if it cracked when wrapped around a 1-in. diameter paper tube but did not crack when wrapped around a 1.5-in. diameter paper tube; "C" if it cracked when wrapped around a 1.5-in. diameter paper tube but did not crack when wrapped around a 2-in. diameter paper tube; "D" if it cracked when wrapped around a 2-in. diameter paper tube but did not crack when wrapped around a 3-in. diameter paper tube; and "E" if it cracked even when wrapped around a 3-in. diameter paper tube.

<Weight Loss Rate, Weight Retention Rate>

The actual weight loss rate and weight retention rate, which are represented by the following equations, of each polymer film immediately after the sag controlling step were measured. A polymer film, and a polymer film immediately after the sag controlling step, were each cut into a piece of 50 mm, and allowed to stand for 24 hours in an environment having a temperature of 23° C. and a humidity of 50%, and their weights were measured with the use of Aspro electronic balance (model no.: ASP213, available from AS ONE Corporation) in an environment having a temperature of 23° C. and a humidity of 50%. The weight loss rate and the weight retention rate were calculated from the following equations:

Weight loss rate (%)=(Initial Weight of polymer film−Weight of polymer film immediately after sag controlling step)/Initial Weight of polymer film×100

Weight retention rate (%)=100−Weight loss rate (%)

<Total Transmittance>

The total transmittances of a polymer film and of a polymer film having been subjected to the sag controlling step were measured in the following manner: (i) each polymer film was kept in an atmosphere having a temperature of 23° C. and a humidity of 50% for 24 hours and thereafter (ii) the total transmittance was measured in an atmosphere having a temperature of 23° C. and a humidity of 50% with the use of Haze Meter (model: NDH-300A available from NIPPON DENSHOKU. The measurement was carried out three times and the mean was found, which is shown in Tables.

<Physical Properties of Graphite Film>
<Measuring Sag in Graphite Film in Accordance with JIS C2151>

Sag in each graphite film was evaluated by measuring the depth of sag on the basis of the film windability evaluation in accordance with JIS C2151, in the following manner: (i) each film was kept in an atmosphere having a temperature of 23° C. and a humidity of 50% for 24 hours and thereafter (ii) the depth of sag was measured in an atmosphere having a temperature of 23° C. and a humidity of 50%.

(Test Piece) A fresh test piece having a length of approximately 2 m drawn from a roll of a graphite film is used. In this process, the test piece is taken from around the center of the wound roll of the film. For example, in the case of a roll of 10 m, a test piece is taken from around 5 m away from the roll end.

(Apparatuses) Apparatuses employed will be described in the following (FIG. 2).

a) Mount Equipped with Rolls

The apparatus includes two freely-rotatable metallic rolls and a rigid mount that supports the two rolls in parallel. Each of the rolls has a diameter of 100 mm±10 mm, and has a length to such an extent that a maximum width of the film to be tested can be sufficiently placed on the rolls. Axes of the two rolls are aligned in one horizontal plane and are fixed in parallel at a spacing of 1500 mm±15 mm within 0.1 degree (i.e. within 1.8 mm per meter of the roll's length). Each of the rolls has a cylindrical shape having a cylindricity of not greater than 0.1 mm, and has a surface subjected to appropriate pearskin finishing (not subjected to abrasive finishing).

b) Device for Applying Tensile Force to Film

The apparatus enables the film freely hanging down from a second roll (roll 2) to be fixed to a weight or a spring-joint clamp at an opposite end of the mount. The apparatus enables a load of 50 g per cm of the width of the film to be applied with the weight or spring, and adjusts a tensile force to be applied as uniformly as possible in the widthwise direction of the film. Alternatively, the film may be wrapped around a tension roll, and a uniform tensile force of 50 g per cm of the width may be applied thereto.

c) Tools for Measuring Dimension

Tools used here are those by which a distance from a plane between the two rolls to the film sagged downward is measured at a midpoint between the two rolls along a line parallel to the rolls. The tools for use in the measurement are a steel straightedge ruler having a length of not less than 1525 mm and a steel graduated ruler having a length of 150 mm and being marked with 1 mm increments. Alternatively, a complex device may be used that indicates the position of the film automatically or semiautomatically.

(Measurement Procedure) As shown in FIG. 2, a test piece is placed in a length direction on two rolls of the apparatus. A tensile force (50 g per cm as described earlier) is applied to the free end of the film. A final position of the film that passes over the roll 2 is adjusted such that the film becomes nearly level in the middle of the two rolls.

Using the steel straightedge ruler and the steel graduated ruler, the film is checked along the widthwise direction at the midpoint between the two rolls.

(Results) The film was visually checked to find which portion had the deepest sag, and that portion was measured for depth of sag. The obtained value was used as sag Zgs. This result is shown in Tables.

<How to Measure Sag a-Value at End>

Figure 9:
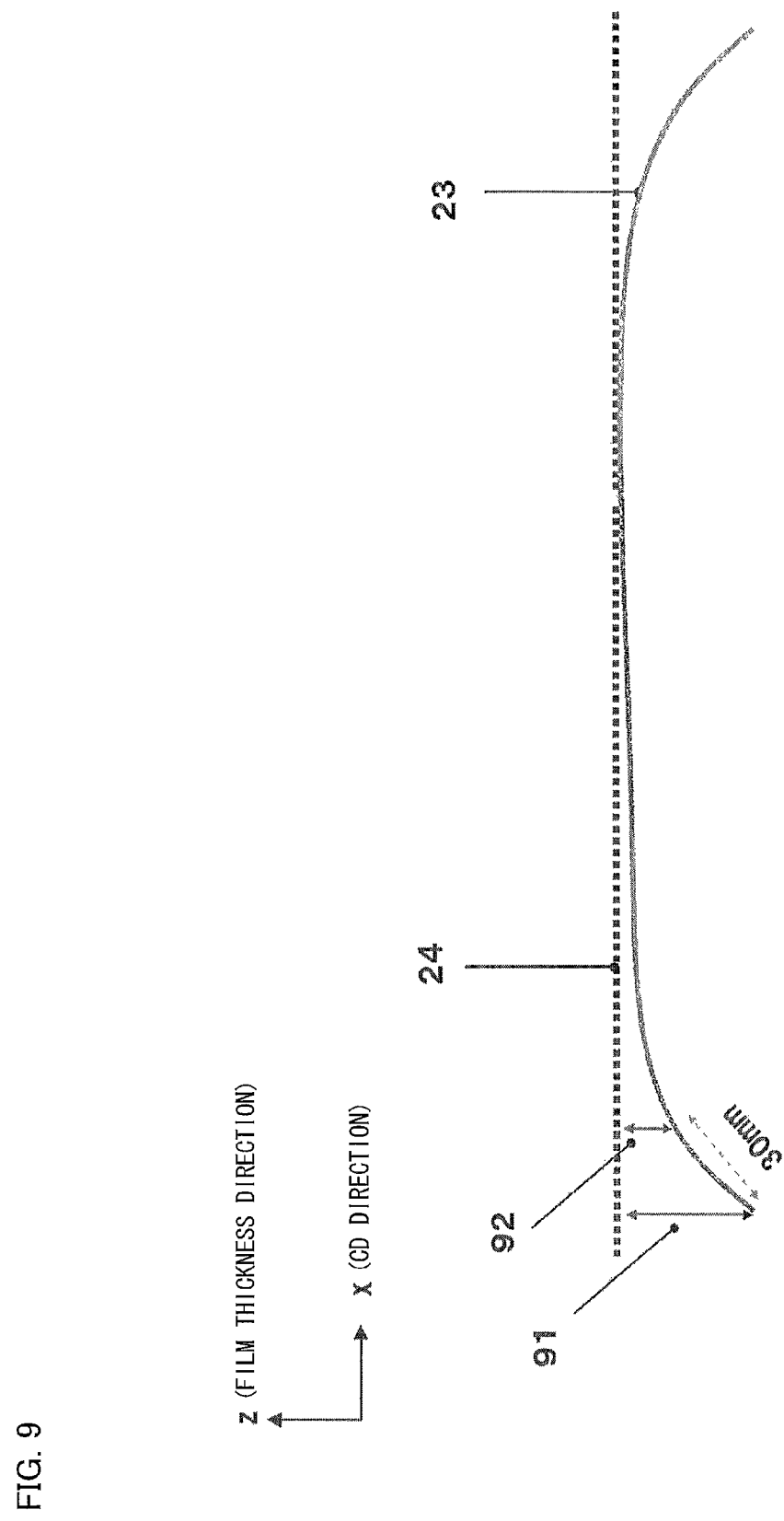
FIG. 9 is a schematic view showing a a-value.

The measurement of the sag a-value of each graphite film at its edges was also carried out after the film was set in the same state as in the above-described sag measurement in accordance with JIS C2151. As shown in FIG. 9, a depth of sag at the outer edge of the film from a suspended line was measured, and a depth of sag at the point 30 mm away from the outer edge of the film from the suspended line was then measured. Thereafter, (a depth of sag at the point 30 mm away from the outer edge) was subtracted from (a depth of sag at the outer edge). For the right and left edges of the film, the same measurement was carried out, and the mean of the obtained two measurements for the right and left edges was used as a measured value. Measured values are shown in Tables.

<How to Measure Sag b-Value in Middle Portion>

Figure 10:
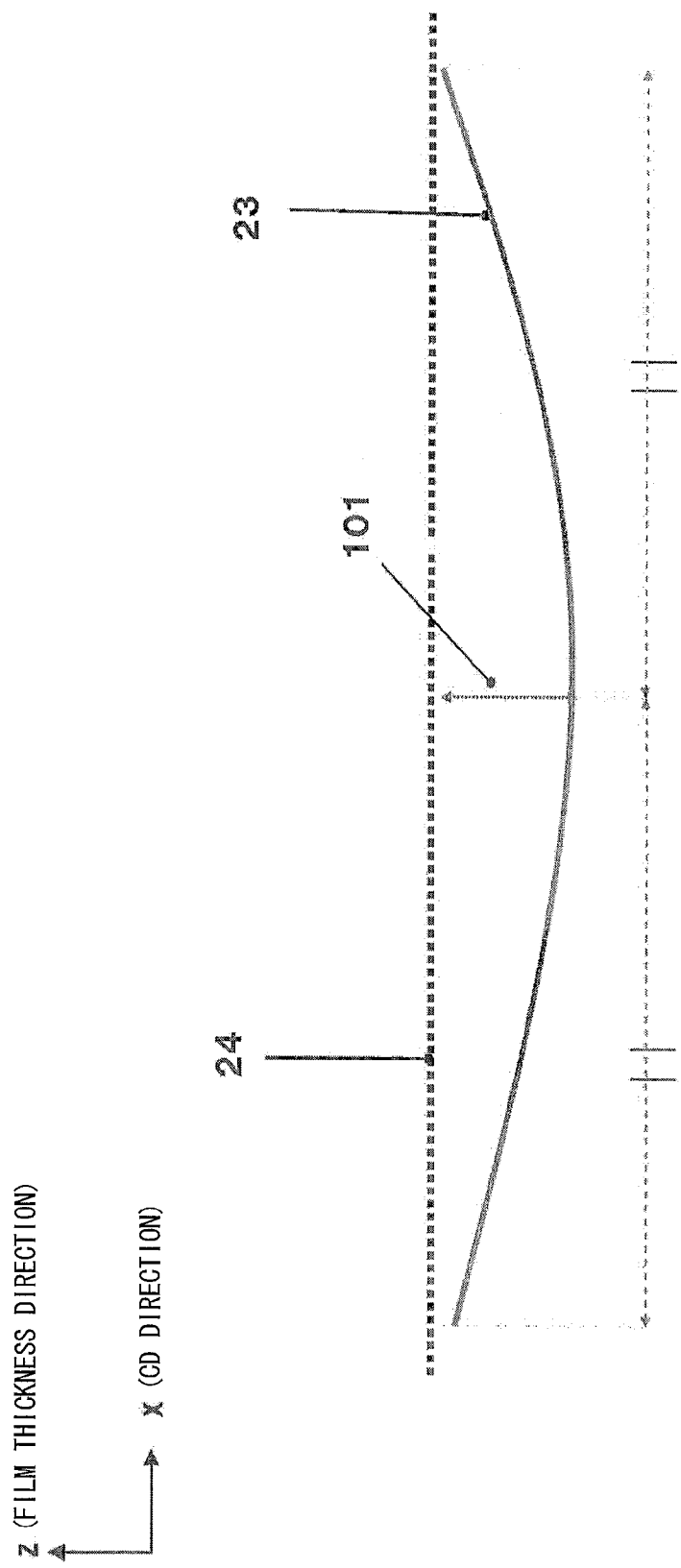
FIG. 10 is a schematic view showing a b-value.

The measurement of the sag b-value of each graphite film in a middle portion was also carried out after the film was set in the same state as in the above-described sag measurement in accordance with JIS C2151. As illustrated in FIG. 10, sag in a widthwise middle portion of each graphite film was measured, and the obtained values are shown in Tables.

<Measurement of Camber of Graphite Film in Accordance with JIS C2151>

Camber of each graphite film was evaluated by measuring the degree of camber on the basis of the film windability evaluation in accordance with JIS C2151, in the following manner: (i) each film was kept in an atmosphere having a temperature of 23° C. and a humidity of 50% for 24 hours and thereafter (ii) the degree of camber was measured in an atmosphere a temperature of 23° C. and a humidity of 50%. The film in a given length is unrolled and placed on a plane, and each deviation from the straight line is measured for both edges of the film.

Figure 11:
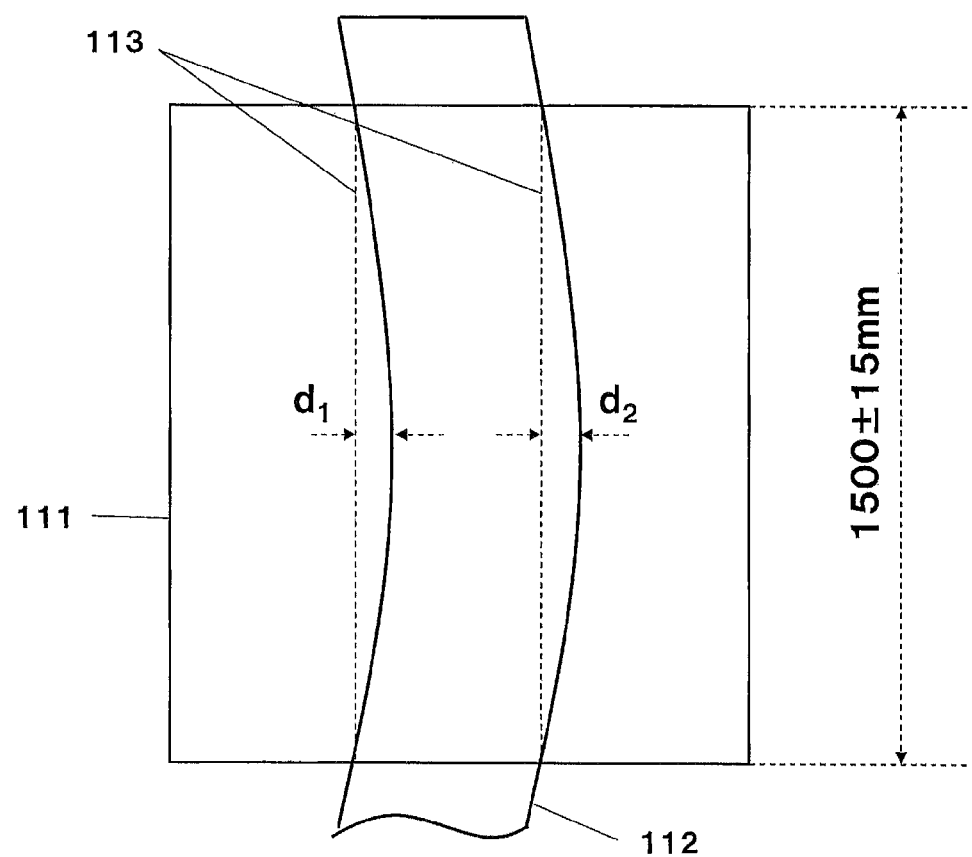
FIG. 11 is a schematic view showing camber measurement described in JIS C2151.

(Apparatus) Apparatuses employed will be described in the following (FIG. 11).

a) Table

The table employed has a width sufficiently greater than the maximum width of the film to be tested, a length of 1500 mm±15 mm, and a degree of parallelization at both ends being not greater than 0.1 degree (or not greater than 1.8 mm/m of the width of the table). The surface should be flat and horizontal which has been subjected to pearskin finishing with an appropriate material (not subjected to abrasive finishing). When the table has a greater length than that defined, two parallel reference lines with an interval of 1500 mm±15 mm should be clearly marked on the surface of the table. The degree of parallelization of the reference lines is to be not greater than 0.1 degree (i.e., not greater than 1.8 mm/m of the length of the reference line).

b) Brush

A soft brush for flattening the film placed on the surface of the table.

c) Straightedge Ruler

A steel ruler having a length of not less than 1525 mm.

d) Graduated Ruler

A steel graduated ruler having a length of 150 mm and being marked with 1 mm increments.

(Test Piece) A fresh test piece having a length of approximately 2 m drawn from a roll of a graphite film is used. In this process, the test piece is taken from around the center of the wound roll of the film. More specifically, in the case of a roll of 10 m, a test piece is taken from around 5 m away from the roll end.

(Measurement Procedure) The test piece is placed on the table along a longitudinal direction as shown in FIG. 11. The film is gently brushed with weak force from one end to allow the test piece to be in close contact with the table such that trapped air does not remain as far as possible.

An edge of the straightedge ruler is placed along one edge of the film such that the deviation of the film edge from the straight line can be well observed. The steel straightedge ruler is adjusted so as to agree with the edges of the film at both ends of the table (or on reference line). Nearly in the middle between the reference positions, deviation $d_1$ of the film edge from the steel straightedge ruler is measured at a minimum scale of 1 mm using the steel graduated ruler. Deviation $d_2$ of the other edge of the film from the straightedge ruler is also measured in the same way.

The camber value of the test piece is determined as the sum ($d_1+d_2$) of deviations of the film edge from the edge of the straightedge ruler represented by millimeters at both ends of the film in the middle of the interval between the reference lines.

(Result) The sum ($d_1+d_2$) of the deviations is used as a characteristic value of camber. The values are shown in Tables.

<Sag Reproducibility>

Sag reproducibility was evaluated. In each of Examples, Comparative Examples and Reference Examples, five samples were measured for their sag Zgs so that the number of evaluations was n=5. The difference between the maximum and minimum values of the sag Zgs was found. When the difference between the maximum and minimum values of the sag Zgs was less than 10 mm, then the sag Zgs was rated as "A". When the difference was not less than 10 mm and less than 20 mm, then the sag Zgs was rated as "B". When the difference was not less than 20 mm and less than 30 mm, then the sag Zgs was rated as "C". When the difference was not less than 30 mm and less than 40 mm, then the sag Zgs was rated as "D". When the difference was equal to or greater than 40 mm, then the sag Zgs was rated as "E".

<Resistance to Tearing>

Figure 12:
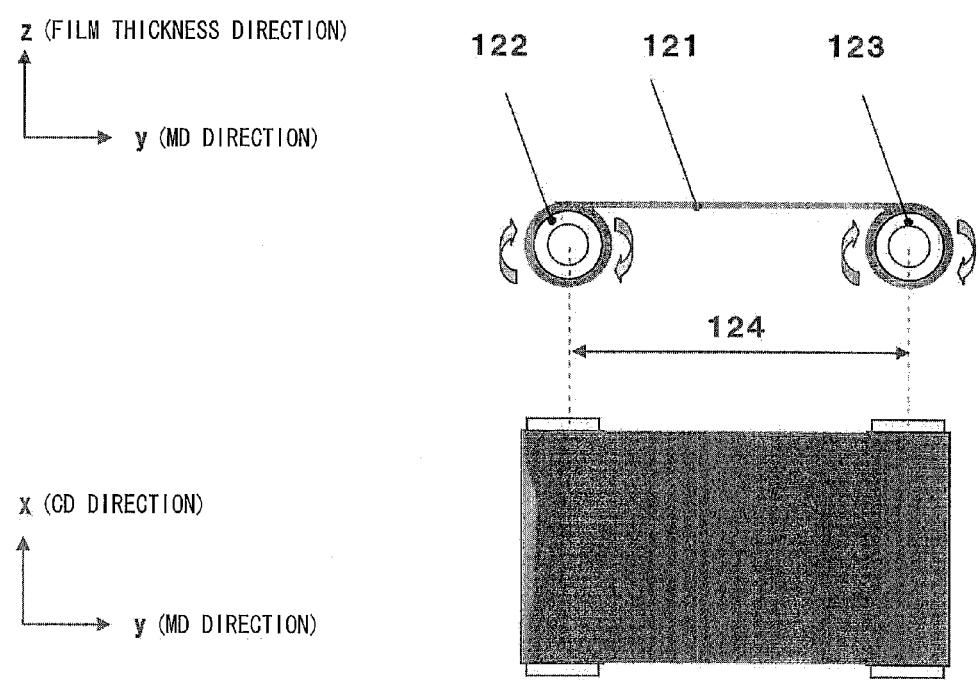
FIG. 12 is a schematic view of a test of resistance to tearing.

A rewinding test was carried out to evaluate tears that may occur during the test. The rewinding test was carried out in the following manner: a graphite film wrapped around a 3-in. diameter first paper tube was rewound around a 3-in. diameter second paper tube placed in parallel with the first paper tube (see FIG. 12). The distance between the first and second paper tubes was 300 mm. The tensile force to be applied in the MD direction of the graphite film was 30 g/cm, and the rewinding speed was 1 m/min.

The following describes a method for evaluating tears of graphite films in the rewinding test. After the rewinding test, across the whole area of the film, tears of not less than 5 mm were counted and converted as the number of visible tears across the width of the film per unit longitudinal length (1 m). The graphite films were rated as: "A" when the number of tears per meter was 0; "B" when the number of tears per meter was greater than 0 and less than 0.05; "C" when the number of tears per meter was not less than 0.05 and less than 0.2; "D" when the number of tears per meter was not less than 0.2 and less than 1; and "E" when the number of tears per meter was not less than 1.

The results are expressed as "best evaluation value–worst evaluation value". In a case where the best and worst evaluations are the same, the result is shown as a single evaluation value.

<Lamination Property>

Figure 13:
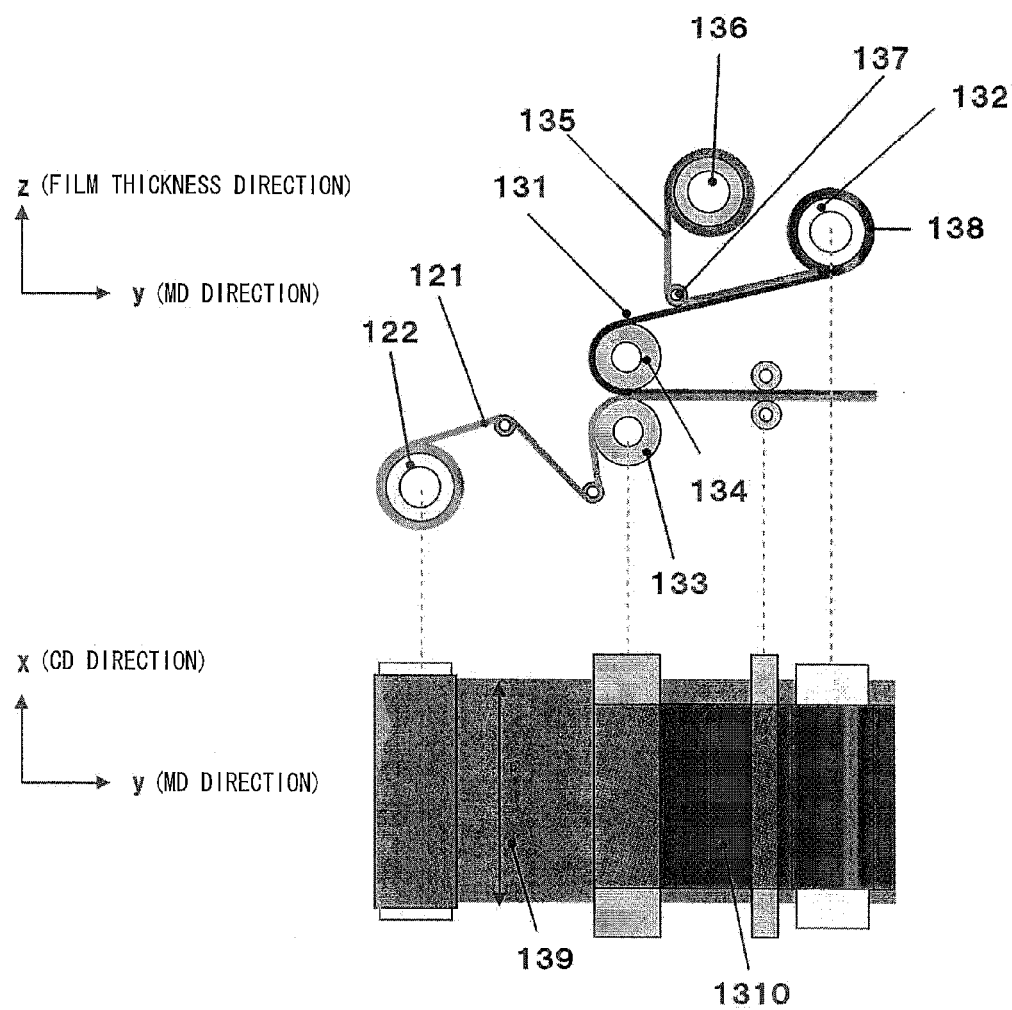
FIG. 13 is a schematic view of a test of lamination property.

A laminating test as illustrated in FIG. 13 was carried out. More specifically, each graphite film, which was wrapped around a 3-in. diameter paper tube, was bonded to PET tape 10 μm in thickness and 150 mm in width by continuously supplying the graphite film between a first roll having an outer diameter of 50 mm and a length of 635 mm and a second roll of the same size which was parallel to the first roll. The graphite film was continuously supplied between the first roll and the second roll so that the angle formed by a line connecting (the starting point of contact between the first roll and the graphite film) and (the center point of the first roll) and a line connecting (the center point of the first roll) and (the point of contact between the first roll and the second roll) was 120 degrees (see FIG. 14). The PET tape was 633K available from Teraoka Seisakusho Co., Ltd. The PET tape was supplied to the second roll so that the angle formed by a line connecting (the starting point of contact between the second roll and the PET tape) and (the center point of the second roll) and a line connecting (the center point of the second roll) and (the point of contact between the first roll and the second roll) was 120 degrees. The tensile force to be applied in the MD direction of the graphite film was 30 g/cm, and the rewinding speed was 1 m per minute.

Figure 15:
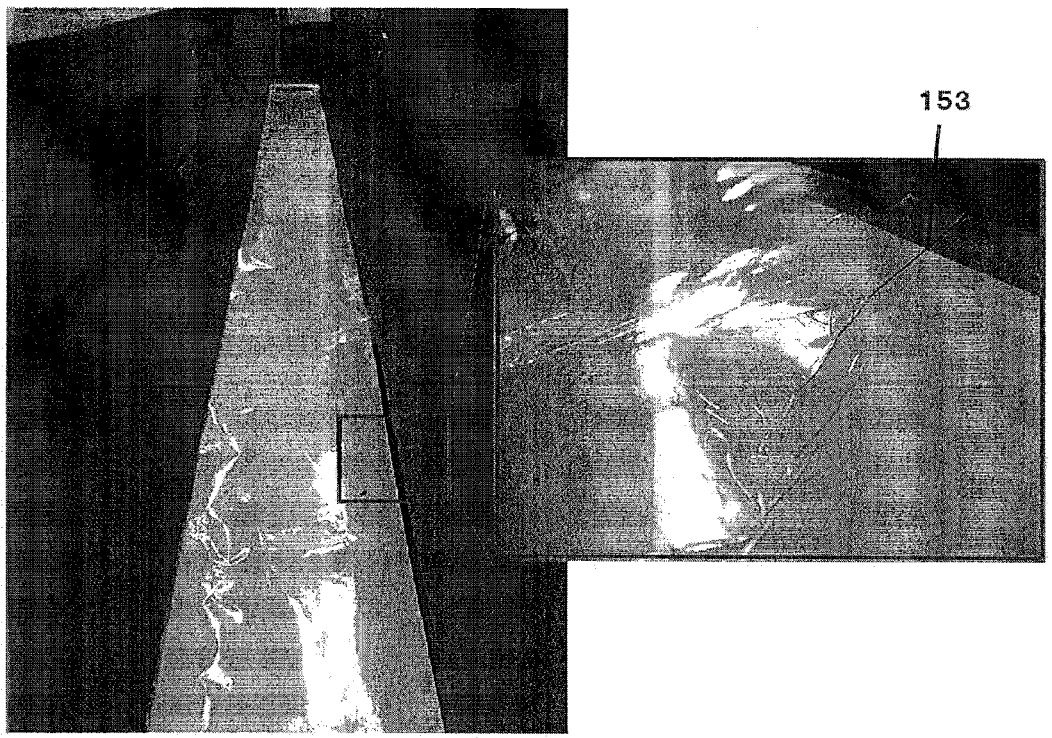
FIG. 15 is a photograph showing an appearance of laminating wrinkles.

Wrinkles (as shown in FIG. 15) of the graphite films after the completion of the laminating test were evaluated as follows. Across the whole area of a roll of the film, wrinkles of not less than 5 mm in length were counted and converted as the number of visible wrinkles across the width of the film per unit longitudinal length (1 m). The graphite films were rated as: "A" when the number of wrinkles per meter was 0; "B" when the number of wrinkles per meter was greater than 0 and less than 0.05; "C" when the number of wrinkles per meter was not less than 0.05 and less than 0.2; "D" when the number of wrinkles per meter was not less than 0.2 and less than 1; and "E" when the number of wrinkles per meter was not less than 1.

The results are expressed as "best evaluation value–worst evaluation value". In a case where the best and worst evaluations are the same, the result is shown as a single evaluation value.

Example 1A

A polymer film used here was a polyimide film Apical NPI (available from Kaneka Corporation) having a birefringence of 0.14, thickness of 75 μm, width of 200 mm and length of 10 m. In Apical NPI, temperatures corresponding to the weight loss rates 1.0%, 1.1%, 2.8%, 10.0%, 15.0% and 20.0% in the measurement method of the present invention are 500° C., 520° C., 550° C., 580° C., 600° C., 630° C. and 655° C., respectively. The polymer film was set to a rewinding apparatus as illustrated in FIG. 8, and the sag controlling step was carried out while the polymer film was continuously supplied to a heat treatment apparatus. The length of the heat treatment apparatus along the MD direction was 60 cm and the length along the TD direction was 30 cm. The temperature in a widthwise middle portion of the polymer film was controlled such that (i) the temperature at an entrance of the heat treatment apparatus was 500° C. (corresponding to the starting temperature of thermal decomposition of the polymer film used in the present example), (ii) the temperature in a position 50 cm away from the entrance was the maximum temperature 580° C. (corresponding to the sag controlling temperature for the polymer film used in the present example), and (iii) the temperature at an exit, which is 10 cm away from the position of the maximum temperature, was 500° C. A linear temperature gradient was given so that the widthwise middle portion of the polymer film had a temperature distribution along the lengthwise direction of the polymer film as shown in FIG. 8. The line speed was controlled so that the actual temperature of the polymer film would increase at 80° C. per minute (equivalent to a line speed of 50 cm per minute) in the 500° C.-580° C. range. Furthermore, a linear temperature gradient was given also along the widthwise direction so that (i) each of the temperatures at both widthwise ends (each of which is 10 cm away from the widthwise middle portion) of the polymer film was 1° C. higher than the temperature in the widthwise middle portion of the polymer film and (ii) the polymer film had a temperature distribution along the widthwise direction of the polymer film as shown in FIG. 8. The temperature gradient along the widthwise direction was measured in four positions, i.e., the positions where the temperatures in the widthwise middle portion of the polymer film were 500° C., 530° C., 560° C. and 580° C., respectively. It was confirmed that, in each of the four positions, each of the temperatures at the widthwise ends was 1° C. higher than the temperature in the widthwise middle portion.

The polymer film was conveyed while a tensile force was applied to the film with a tensile strength of 30 kgf/cm². In the heat treatment apparatus, the film was conveyed through a gap between graphite jigs placed above and below the film (see FIG. 8). A pressure of 2 g/cm² was applied to the film in its thickness direction. After the sag controlling step, the film was evaluated for cracking and was measured for the weight retention rate, weight loss rate, and total transmittance.

Figure 16:
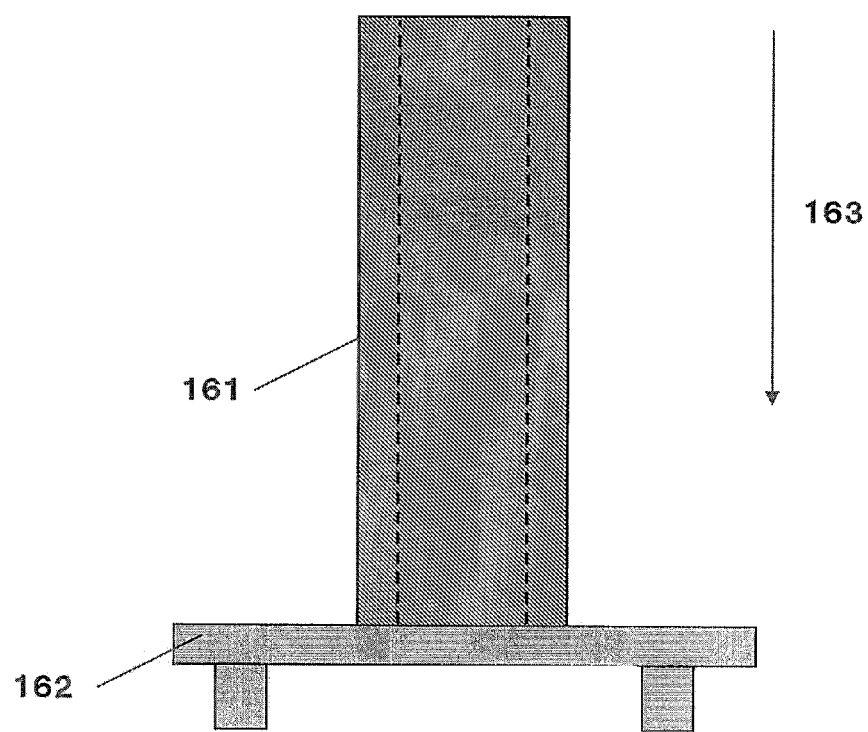
FIG. 16 shows how a film is set in the carbonization step and in the graphitization step in Examples and Comparative Examples.

Next, the film having been subjected to the sag controlling step was cooled to room temperature (23° C.), was wound into a roll having an inner diameter of 100 mm, and was set in a carbonizing furnace such that the widthwise direction of the film was parallel to the vertical direction (see FIG. 16). The film was carbonized by heat treatment while raising the temperature in the carbonizing furnace from room temperature to 1400° C. at a temperature rise rate of 2° C. per minute without particular control of the temperatures at the both widthwise ends of the film and the temperature in the widthwise middle portion of the film.

Next, the carbonized film was cooled to room temperature, was set in a graphitization furnace in the same manner as in the carbonization, and was graphitized by heat treatment while raising the temperature in the graphitization furnace from room temperature to 2900° C. at 0.5° C. per minute without particular control of the temperatures at the both widthwise ends of the film and the temperature in the widthwise middle portion of the film.

Next, the graphitized film was cooled to room temperature, and compressed with a pressure of 10 MPa at room temperature.

Five films were produced in the same manner so that the number of evaluations was n=5, and were evaluated for their sag reproducibility, sag Zgs, a-value, b-value, camber, resistance to tearing, and lamination property. As for the sag Zgs, a-value, b-value and camber, their maximum and minimum values of the five (n=5) evaluations are shown in Tables 1A, 2A, 3A and 4A. The resistance to tearing and lamination property are shown in Tables 1A, 2A, 3A and 4A as "best evaluation value–worst evaluation value". It should be noted that, in a case where the best and worst evaluations are the same, the result is shown as a single evaluation value.

Example 2A

A graphite film was produced in the same manner as that described in Example 1A, except that a linear temperature gradient along the widthwise direction was such that each of the temperatures at both widthwise ends of a polymer film was 3° C. higher than the temperature in a widthwise middle portion of the polymer film. The various properties of the graphite film were evaluated. The results are shown in Tables 1A, 2A, 3A and 4A.

Example 3A

A graphite film was produced in the same manner as that described in Example 1A, except that a linear temperature gradient along the widthwise direction was such that each of the temperatures at both widthwise ends of a polymer film was 5° C. higher than the temperature in a widthwise middle portion of the polymer film. The various properties of the graphite film were evaluated. The results are shown in Tables 1A, 2A, 3A and 4A.

Example 4A

A graphite film was produced in the same manner as that described in Example 1A, except that a linear temperature gradient along the widthwise direction was such that each of the temperatures at both widthwise ends of a polymer film was 10° C. higher than the temperature in a widthwise middle portion of the polymer film. The various properties of the graphite film were evaluated. The results are shown in Tables 1A, 2A, 3A and 4A.

Example 5A

A graphite film was produced in the same manner as that described in Example 1A, except that a linear temperature gradient along the widthwise direction was such that each of the temperatures at both widthwise ends of a polymer film was 20° C. higher than the temperature in a widthwise middle portion of the polymer film. The various properties of the graphite film were evaluated. The results are shown in Tables 1A, 2A, 3A and 4A.

Example 6A

A graphite film was produced in the same manner as that described in Example 3A, except that a linear temperature gradient along the widthwise direction was such that the temperature at an end 1, which is one of both widthwise ends of a polymer film, was 5° C. higher than the temperature in a widthwise middle portion of the polymer film and the temperature at an end 2, which is the other of the both widthwise ends, was 3° C. higher than the temperature in the widthwise middle portion of the polymer film. The various properties of the graphite film were evaluated. The results are shown in Tables 1A, 2A, 3A and 4A.

Example 7A

A graphite film was produced in the same manner as that described in Example 3A, except that, in the sag controlling step, the maximum temperature in the heat treatment apparatus was 555° C. and the length of the furnace and the line speed were adjusted so that the temperature rise rate was 80° C. per minute. The various properties of the graphite film were evaluated. The results are shown in Tables 1A, 2A, 3A and 4A.

Example 8A

A graphite film was produced in the same manner as that described in Example 3A, except that, in the sag controlling step, the maximum temperature in the heat treatment apparatus was 605° C. and the length of the furnace and the line speed were adjusted so that the temperature rise rate was 80° C. per minute. The various properties of the graphite film were evaluated. The results are shown in Tables 1A, 2A, 3A and 4A.

Example 9A

A graphite film was produced in the same manner as that described in Example 3A, except that, in the sag controlling step, the maximum temperature in the heat treatment apparatus was 630° C. and the length of the furnace and the line speed were adjusted so that the temperature rise rate was 80° C. per minute. The various properties of the graphite film were evaluated. The results are shown in Tables 1A, 2A, 3A and 4A.

Example 10A

A graphite film was produced in the same manner as that described in Example 3A, except that, in the sag controlling step, the maximum temperature in the heat treatment apparatus was 655° C. and the length of the furnace and the line speed were adjusted so that the temperature rise rate was 80° C. per minute. The various properties of the graphite film were evaluated. The results are shown in Tables 1A, 2A, 3A and 4A.

Example 11A

A graphite film was produced in the same manner as that described in Example 3A, except that (i) in the sag controlling step, the maximum temperature in the heat treatment apparatus was 700° C. (sag controlling temperature was 655° C.) and the length of the furnace and the line speed were adjusted so that the temperature rise rate was 80° C. per minute and (ii) the carbonization step was not carried out. The various properties of the graphite film were evaluated. The results are shown in Tables 1A, 2A, 3A and 4A.

Example 12A

A graphite film was produced in the same manner as that described in Example 3A, except that (i) in the sag controlling step, the maximum temperature in the heat treatment apparatus was 900° C. (sag controlling temperature was 655° C.) and the length of the furnace and the line speed were adjusted so that the temperature rise rate was 80° C. per minute and (ii) the carbonization step was not carried out. The various properties of the graphite film were evaluated. The results are shown in Tables 1A, 2A, 3A and 4A.

Example 13A

A graphite film was produced in the same manner as that described in Example 3A, except that the raw material for the graphite film was a polyimide film Apical AH (available from Kaneka Corporation) having a birefringence of 0.10, thickness of 75 μm, width of 200 mm and length of 10 m in which the temperatures corresponding to the weight loss rates 1.0%, 1.1%, 2.8%, 10.0%, 15.0% and 20.0% in the measurement method of the present invention were 500° C., 520° C., 550° C., 580° C., 600° C., 630° C. and 655° C., respectively. The various properties of the graphite film were evaluated. The results are shown in Tables 1A, 2A, 3A and 4A.

Example 14A

A polyimide film Apical NPI (available from Kaneka Corporation) having a birefringence of 0.14, thickness of 75 μm, width of 200 mm and length of 2 m was wrapped around a graphite jig having an outer diameter of 100 mm (see FIG. 7), the rolled polyimide film was set in a heat treatment apparatus horizontally, and the sag controlling step was carried out. A heat treatment was carried out under the condition in which (i) a linear temperature gradient along the widthwise direction was given so that each of the temperatures at both widthwise ends (each of which is 10 cm away from the widthwise middle portion) of the polymer film was 5° C. higher than the temperature in a widthwise middle portion of the polymer film (see FIG. 7) and (ii) the temperature in the widthwise middle portion of the polymer film was controlled so as to increase at 2° C. per minute in the 500° C.-580° C. range. The temperature gradient along the widthwise direction was measured when the temperature in the widthwise middle portion of the polymer film was 500° C., 530° C., 560° C. and 580° C. Both the temperatures at the widthwise ends of the film and the temperature in the widthwise middle portion of the film were measured in four positions, which are angularly displaced 90 degrees from each other, of the polymer film rolled in a cylindrical form (see FIG. 7). It was confirmed that each of the temperatures at the widthwise ends was 5° C. higher than the temperature in the widthwise middle portion, in any of the four positions under any of the four different temperature conditions.

A graphite film was produced in the same manner as that described in Example 3A, except for the above conditions. The various properties of the graphite film were evaluated. The results are shown in Tables 1A, 2A, 3A and 4A.

Example 15A

A graphite film was produced in the same manner as that described in Example 14A, except that the raw material for the graphite film was a polyimide film Apical AH (available from Kaneka Corporation) having a birefringence of 0.10, thickness of 75 μm, width of 200 mm and length of 10 m. The various properties of the graphite film were evaluated. The results are shown in Tables 1A, 2A, 3A and 4A.

Example 16A

As illustrated in FIG. 6, a polyimide film Apical NPI (available from Kaneka Corporation) having a birefringence of 0.14, thickness of 75 μm, width of 200 mm and length of 0.7 m was placed on a graphite hearth, and a heavy graphite plate was placed on the film so that a load of 5 g/cm$^2$ was imposed on the film. As illustrated in FIG. 6, thermocouples were provided along the lengthwise direction at intervals of 100 mm. A heat treatment was carried out under the condition in which (i) a linear temperature gradient along the widthwise direction was given so that each of the temperatures at both widthwise ends of the film was 5° C. higher than the temperature in a widthwise middle portion of the polymer film as shown in FIG. 6 and (ii) the temperature in the widthwise middle portion of the polymer film was controlled so as to increase at the temperature rise rate of 2° C. per minute in the 500° C.-580° C. range. The temperature gradient along the widthwise direction was measured when the temperature in the widthwise middle portion of the polymer film was 500° C., 530° C., 560° C. and 580° C. It was confirmed that each of the temperatures at the both widthwise ends of the film was 5° C. higher than the temperature in the widthwise middle portion of the film, in any of seven positions under any of the four different temperature conditions. A graphite film was produced in the same manner as that described in Example 14A, except that the carbonization step and the graphitization step were carried out by holding the film in the same manner as in the sag controlling step of the present example. The various properties of the graphite film were evaluated. The results are shown in Tables 1A, 2A, 3A and 4A.

Example 17A

A graphite film was produced in the same manner as that described in Example 16A, except that the raw material for the graphite film was the polyimide film Apical AH (available from Kaneka Corporation) having a birefringence of 0.10, thickness of 75 μm, width of 200 mm and length of 10 m. The various properties of the graphite film were evaluated. The results are shown in Tables 1A, 2A, 3A and 4A.

Example 18A

A graphite film was produced in the same manner as that described in Example 1A, except that the linear temperature gradient along the widthwise direction was such that each of the temperatures at both widthwise ends of a polymer film was 40° C. higher than the temperature in a widthwise middle portion of the polymer film. The various properties of the graphite film were evaluated. The results are shown in Tables 1A, 2A, 3A and 4A.

Example 19A

A graphite film was produced in the same manner as that described in Example 3A, except that (i) only for the sag controlling temperature 580° C., a linear temperature gradient along the widthwise direction was given so that each of the temperatures at both widthwise ends of a polymer film was 5° C. higher than the temperature in a widthwise middle portion of the polymer film and (ii) in the other three positions, the temperatures at the both widthwise ends and the temperature in the widthwise middle portion were the same. The various properties of the graphite film were evaluated. The results are shown in Tables 1A, 2A, 3A and 4A.

Example 20A

A graphite film was produced in the same manner as that described in Example 3A, except that (i) only for the position of 530° C., a linear temperature gradient along the widthwise direction was given so that each of the temperatures at both widthwise ends of a polymer film was 5° C. higher than the temperature in a widthwise middle portion of the polymer film and (ii) in the other three positions, the temperatures at the both widthwise ends and the temperature in the widthwise middle portion were the same. The various properties of the graphite film were evaluated. The results are shown in Tables 1A, 2A, 3A and 4A.

Example 21A

A graphite film was produced in the same manner as that described in Example 1A, except that a linear temperature gradient along the widthwise direction was such that each of the temperatures at both widthwise ends of a polymer film was 0.5° C. higher than the temperature in a widthwise middle portion of the polymer film. The various properties of the graphite film were evaluated. The results are shown in Tables 1A, 2A, 3A and 4A.

Example 22A

A graphite film was produced in the same manner as that described in Example 3A, except that the compression after the graphitization was not carried out. The various properties of the graphite film were evaluated. The results are shown in Tables 1A, 2A, 3A and 4A.

TABLE 1A

| | Raw Material Film | | | |
|---|---|---|---|---|
| | Type | Birefringence | Thickness μm | Width mm | Length m |
| Example 1A | NPI | 0.14 | 75 | 200 | 10 |
| Example 2A | NPI | 0.14 | 75 | 200 | 10 |
| Example 3A | NPI | 0.14 | 75 | 200 | 10 |
| Example 4A | NPI | 0.14 | 75 | 200 | 10 |

TABLE 1A-continued

| | Raw Material Film | | | |
|---|---|---|---|---|
| | Type | Birefringence | Thickness μm | Width mm | Length m |
| Example 5A | NPI | 0.14 | 75 | 200 | 10 |
| Example 6A | NPI | 0.14 | 75 | 200 | 10 |
| Example 7A | NPI | 0.14 | 75 | 200 | 10 |
| Example 8A | NPI | 0.14 | 75 | 200 | 10 |
| Example 9A | NPI | 0.14 | 75 | 200 | 10 |
| Example 10A | NPI | 0.14 | 75 | 200 | 10 |
| Example 11A | NPI | 0.14 | 75 | 200 | 10 |
| Example 12A | NPI | 0.14 | 75 | 200 | 10 |
| Example 13A | AH | 0.10 | 75 | 200 | 10 |
| Example 14A | NPI | 0.14 | 75 | 200 | 2 |
| Example 15A | AH | 0.10 | 75 | 200 | 2 |
| Example 16A | NPI | 0.14 | 75 | 200 | 0.7 |
| Example 17A | AH | 0.10 | 75 | 200 | 0.7 |
| Example 18A | NPI | 0.14 | 75 | 200 | 10 |
| Example 19A | NPI | 0.14 | 75 | 200 | 10 |
| Example 20A | NPI | 0.14 | 75 | 200 | 10 |
| Example 21A | NPI | 0.14 | 75 | 200 | 10 |
| Example 22A | NPI | 0.14 | 75 | 200 | 10 |

TABLE 2A

| | | Sag Controlling Step | | | | | | | |
|---|---|---|---|---|---|---|---|---|---|
| | | Starting Temp of Thermal Decomposition | | | Sag Controlling Temp | | | Temp Gradient | | Max Temp |
| | Method | End 1 | Middle ° C. | End 2 | End 1 | Middle ° C. | End 2 | Max | Min ° C./m | in Heat Treatment |
| Example 1A | CLFPM*1 | 501 | 500 | 501 | 581 | 580 | 581 | 5 | 5 | 580 |
| Example 2A | CLFPM*1 | 503 | 500 | 503 | 583 | 580 | 583 | 15 | 15 | 580 |
| Example 3A | CLFPM*1 | 505 | 500 | 505 | 585 | 580 | 585 | 25 | 25 | 580 |
| Example 4A | CLFPM*1 | 510 | 500 | 510 | 590 | 580 | 590 | 50 | 50 | 580 |
| Example 5A | CLFPM*1 | 520 | 500 | 520 | 600 | 580 | 600 | 100 | 100 | 580 |
| Example 6A | CLFPM*1 | 505 | 500 | 505 | 585 | 580 | 583 | 25 | 15 | 580 |
| Example 7A | CLFPM*1 | 505 | 500 | 505 | 560 | 555 | 560 | 25 | 25 | 555 |
| Example 8A | CLFPM*1 | 505 | 500 | 505 | 610 | 605 | 610 | 25 | 25 | 605 |
| Example 9A | CLFPM*1 | 505 | 500 | 505 | 635 | 630 | 635 | 25 | 25 | 630 |
| Example 10A | CLFPM*1 | 505 | 500 | 505 | 660 | 655 | 660 | 25 | 25 | 655 |
| Example 11A | CLFPM*1 | 505 | 500 | 505 | 660 | 655 | 660 | 25 | 25 | 700 |
| Example 12A | CLFPM*1 | 505 | 500 | 505 | 660 | 655 | 660 | 25 | 25 | 900 |
| Example 13A | CLFPM*1 | 505 | 500 | 505 | 585 | 580 | 585 | 25 | 25 | 580 |
| Example 14A | CBM*2 | 505 | 500 | 505 | 585 | 580 | 585 | 25 | 25 | 580 |
| Example 15A | CBM*2 | 505 | 500 | 505 | 585 | 580 | 585 | 25 | 25 | 580 |
| Example 16A | SBM*3 | 505 | 500 | 505 | 585 | 580 | 585 | 25 | 25 | 580 |
| Example 17A | SBM*3 | 505 | 500 | 505 | 585 | 580 | 585 | 25 | 25 | 580 |
| Example 18A | CLFPM*1 | 540 | 500 | 540 | 620 | 580 | 620 | 200 | 200 | 580 |
| Example 19A | CLFPM*1 | Starting Temp of Thermal Decomposition: 500° C.; Sag Controlling Temp: 580° C.; Only for 580° C., each end is 5° C. higher than middle portion. | | | | | | 25 | 25 | 580 |
| Example 20A | CLFPM*1 | Starting Temp of Thermal Decomposition: 500° C.; Sag Controlling Temp: 580° C.; Only for 530° C., each end is 5° C. higher than middle portion. | | | | | | 25 | 25 | 580 |
| Example 21A | CLFPM*1 | 500.5 | 500 | 500.5 | 580.5 | 580 | 580.5 | 2.5 | 2.5 | 580 |
| Example 22A | CLFPM*1 | 505 | 500 | 505 | 585 | 580 | 585 | 25 | 25 | 580 |

| | Sag Controlling Step | | | |
|---|---|---|---|---|
| | Number of Measurement Positions | Number of Measurement Positions Satisfying Conditions | Pulling Strength kgf/cm2 | Load g/cm2 | Temp Rise Rate ° C./min |
| Example 1A | 4 | 4 | 30 | 2 | 80 |
| Example 2A | 4 | 4 | 30 | 2 | 80 |
| Example 3A | 4 | 4 | 30 | 2 | 80 |
| Example 4A | 4 | 4 | 30 | 2 | 80 |
| Example 5A | 4 | 4 | 30 | 2 | 80 |

TABLE 2A-continued

|  | | | | | | |
|---|---|---|---|---|---|---|
| Example 6A | 4 | 4 | 30 | 2 | 80 |
| Example 7A | 3 | 3 | 30 | 2 | 80 |
| Example 8A | 5 | 5 | 30 | 2 | 80 |
| Example 9A | 6 | 6 | 30 | 2 | 80 |
| Example 10A | 7 | 7 | 30 | 2 | 80 |
| Example 11A | 7 | 7 | 30 | 2 | 80 |
| Example 12A | 7 | 7 | 30 | 2 | 80 |
| Example 13A | 4 | 4 | 30 | 2 | 80 |
| Example 14A | 4 | 4 | Not Available | Not Available | 2 |
| Example 15A | 4 | 4 | Not Available | Not Available | 2 |
| Example 16A | 4 | 4 | Not Available | 5 | 2 |
| Example 17A | 4 | 4 | Not Available | 5 | 2 |
| Example 18A | 4 | 4 | 30 | 2 | 80 |
| Example 19A | 1 | 1 | 30 | 2 | 80 |
| Example 20A | 1 | 1 | 30 | 2 | 80 |
| Example 21A | 4 | 4 | 30 | 2 | 80 |
| Example 22A | 4 | 4 | 30 | 2 | 80 |

*1 "CLFPM" stands for "continuous long film processing method".
*2 "CBM" stands for "cylindrical batch method".
*3 "SBM" stands for "sheet batch method".

TABLE 3A

| | Physical Properties of Film After Sag Controlling Step | | | Carbonization Step | | | | Graphitization Step | | | |
|---|---|---|---|---|---|---|---|---|---|---|---|
| | Cracking (Paper Tube Wrap-around Test) | Weight Retention Rate % | Total Weight Loss Rate % | Trans-mit-tance % | Method of Setting | Max Temp ° C. | Widthwise Temp Difference of Film ° C. | Temp Rise Rate ° C./min | Method of Setting | Max Temp ° C. | Temp Rise Rate ° C./min | Compression |
| Example 1A | A | 97.2 | 2.8 | 0.20 | Cylindrical Roll | 1400 | 0 | 2 | Cylindrical Roll | 2900 | 0.5 | Carried Out |
| Example 2A | A | 97.2 | 2.8 | 0.20 | Cylindrical Roll | 1400 | 0 | 2 | Cylindrical Roll | 2900 | 0.5 | Carried Out |
| Example 3A | A | 97.2 | 2.8 | 0.20 | Cylindrical Roll | 1400 | 0 | 2 | Cylindrical Roll | 2900 | 0.5 | Carried Out |
| Example 4A | A | 97.2 | 2.8 | 0.20 | Cylindrical Roll | 1400 | 0 | 2 | Cylindrical Roll | 2900 | 0.5 | Carried Out |
| Example 5A | A | 97.2 | 2.8 | 0.20 | Cylindrical Roll | 1400 | 0 | 2 | Cylindrical Roll | 2900 | 0.5 | Carried Out |
| Example 6A | A | 97.2 | 2.8 | 0.20 | Cylindrical Roll | 1400 | 0 | 2 | Cylindrical Roll | 2900 | 0.5 | Carried Out |
| Example 7A | A | 98.8 | 1.2 | 5.50 | Cylindrical Roll | 1400 | 0 | 2 | Cylindrical Roll | 2900 | 0.5 | Carried Out |
| Example 8A | A | 90.0 | 10.0 | 0.03 | Cylindrical Roll | 1400 | 0 | 2 | Cylindrical Roll | 2900 | 0.5 | Carried Out |
| Example 9A | B | 85.0 | 15.0 | — | Cylindrical Roll | 1400 | 0 | 2 | Cylindrical Roll | 2900 | 0.5 | Carried Out |
| Example 10A | C | 80.0 | 20.0 | — | Cylindrical Roll | 1400 | 0 | 2 | Cylindrical Roll | 2900 | 0.5 | Carried Out |
| Example 11A | D | 62.0 | 38.0 | — | Not Carried Out | | | | Cylindrical Roll | 2900 | 0.5 | Carried Out |
| Example 12A | E | 52.0 | 48.0 | — | Not Carried Out | | | | Cylindrical Roll | 2900 | 0.5 | Carried Out |
| Example 13A | A | 97.2 | 2.8 | 0.20 | Cylindrical Roll | 1400 | 0 | 2 | Cylindrical Roll | 2900 | 0.5 | Carried Out |
| Example 14A | A | 97.2 | 2.8 | 0.20 | Cylindrical Roll | 1400 | 0 | 2 | Cylindrical Roll | 2900 | 0.5 | Carried Out |
| Example 15A | A | 97.2 | 2.8 | 0.20 | Cylindrical Roll | 1400 | 0 | 2 | Cylindrical Roll | 2900 | 0.5 | Carried Out |
| Example 16A | A | 97.2 | 2.8 | 0.20 | Sheet Laminate | 1400 | 0 | 2 | Sheet Laminate | 2900 | 0.5 | Carried Out |
| Example 17A | A | 97.2 | 2.8 | 0.20 | Sheet Laminate | 1400 | 0 | 2 | Sheet Laminate | 2900 | 0.5 | Carried Out |
| Example 18A | A | 97.2 | 2.8 | 0.20 | Cylindrical Roll | 1400 | 0 | 2 | Cylindrical Roll | 2900 | 0.5 | Carried Out |
| Example 19A | A | 97.2 | 2.8 | 0.20 | Cylindrical Roll | 1400 | 0 | 2 | Cylindrical Roll | 2900 | 0.5 | Carried Out |

TABLE 3A-continued

Physical Properties of Film After Sag Controlling Step

| | Cracking (Paper Tube Wrap-around Test) | Weight Retention Rate % | Weight Loss Rate % | Total Trans-mittance % | Carbonization Step | | | Graphitization Step | | | |
|---|---|---|---|---|---|---|---|---|---|---|---|
| | | | | | Method of Setting | Widthwise Max Temp °C. | Temp Difference of Film °C. | Temp Rise Rate °C./min | Method of Setting | Max Temp °C. | Temp Rise Rate °C./min | Compression |
| Example 20A | A | 97.2 | 2.8 | 0.20 | Cylindrical Roll | 1400 | 0 | 2 | Cylindrical Roll | 2900 | 0.5 | Carried Out |
| Example 21A | A | 97.2 | 2.8 | 0.20 | Cylindrical Roll | 1400 | 0 | 2 | Cylindrical Roll | 2900 | 0.5 | Carried Out |
| Example 22A | A | 97.2 | 2.8 | 0.20 | Cylindrical Roll | 1400 | 0 | 2 | Cylindrical Roll | 2900 | 0.5 | Not Carried Out |

TABLE 4A

Physical Properties of Graphitized Film

| | Sag Reproducibility | Sag Max mm | Sag Min mm | a-Value Max mm | a-Value Min mm | b-Value Max mm | b-Value Min mm | Camber Max mm | Camber Min mm | Resistance to Tearing | Lamination Property |
|---|---|---|---|---|---|---|---|---|---|---|---|
| Example 1A | A | 10 | 9 | 5 | 5 | 0 | 0 | <2 | <2 | C | A |
| Example 2A | A | 30 | 28 | 20 | 19 | 0 | 0 | <2 | <2 | B | A |
| Example 3A | A | 40 | 38 | 30 | 29 | 0 | 0 | <2 | <2 | A | A |
| Example 4A | A | 70 | 65 | 55 | 53 | 0 | 0 | <2 | <2 | A | B |
| Example 5A | A | 90 | 85 | 75 | 70 | 0 | 0 | <2 | <2 | A | C |
| Example 6A | A | 40 | 38 | 30 | 28 | 0 | 0 | 3 | <2 | A | C |
| Example 7A | B | 30 | 20 | 20 | 10 | 0 | 0 | <2 | <2 | B | A |
| Example 8A | A | 45 | 43 | 32 | 30 | 0 | 0 | <2 | <2 | A | A |
| Example 9A | A | 48 | 45 | 34 | 32 | 0 | 0 | <2 | <2 | A | A |
| Example 10A | A | 50 | 48 | 35 | 33 | 0 | 0 | <2 | <2 | A | A |
| Example 11A | A | 50 | 48 | 35 | 33 | 0 | 0 | <2 | <2 | A | A |
| Example 12A | A | 50 | 48 | 35 | 33 | 0 | 0 | <2 | <2 | A | A |
| Example 13A | A | 40 | 38 | 30 | 28 | 0 | 0 | <2 | <2 | A | A |
| Example 14A | C | 40 | 20 | 30 | 10 | 0 | 0 | 3 | <2 | A-B | C |
| Example 15A | C | 40 | 20 | 30 | 10 | 0 | 0 | 3 | <2 | A-B | C |
| Example 16A | C | 40 | 20 | 30 | 10 | 0 | 0 | Unmeasurable | Unmeasurable | A-B | C |
| Example 17A | C | 40 | 20 | 30 | 10 | 0 | 0 | Unmeasurable | Unmeasurable | A-B | C |
| Example 18A | A | 120 | 111 | 95 | 89 | 0 | 0 | <2 | <2 | A | D |
| Example 19A | B | 30 | 20 | 20 | 10 | 0 | 0 | <2 | <2 | B | A |
| Example 20A | C | 25 | 5 | 20 | 0 | 0 | 0 | <2 | <2 | B-D | A |
| Example 21A | A | 5 | 5 | 3 | 3 | 0 | 0 | <2 | <2 | D | A |
| Example 22A | A | 40 | 38 | 30 | 29 | 0 | 0 | <2 | <2 | A | A |

Comparative Example 1A

A polymer film, which had not been subjected to the sag controlling step, was carbonized in the following manner. The polymer film used here was a polyimide film Apical NPI (available from Kaneka Corporation) having a birefringence of 0.14, thickness of 75 μm, width of 200 mm and length of 10 m. In the same manner as in Example 1A, the film was wound into a roll having an inner diameter of 100 mm, was set in a carbonizing furnace so that the widthwise direction of the film was parallel to the vertical direction (see FIG. 16), and was carbonized by heat treatment while raising the temperature in the carbonizing furnace from room temperature (23° C.) to 1400° C. at 2° C./min without particular control of the temperatures at both widthwise ends of the film and the temperature in a widthwise middle portion of the film.

Next, the carbonized film was cooled to room temperature, was set in a graphitization furnace in the same manner as in the carbonization, and was graphitized by heat treatment while raising the temperature in the graphitization furnace from room temperature to 2900° C. at 0.5° C. per minute without particular control of the temperatures at the both widthwise ends of the film and the temperature in the widthwise middle portion of the film.

Next, the graphitized film was cooled to room temperature, and compressed with a pressure of 10 MPa at room temperature.

Five films were produced in the same manner so that the number of evaluations was n=5, and were evaluated for their sag reproducibility, sag Zgs, a-value, b-value, camber, resistance to tearing, and lamination property. As for the sag Zgs, a-value, b-value and camber, their maximum and minimum values of the five (n=5) evaluations are shown in Tables 5A, 6A, 7A and 8A. The resistance to tearing and lamination property are also shown in Tables 5A, 6A, 7A and 8A as "best evaluation value–worst evaluation value". It should be noted that, in a case where the best and worst evaluations are the same, the result is shown as a single evaluation value.

Comparative Example 2A

A graphite film was produced in the same manner as that described in Example 3A, except that a process similar to the sag controlling step was carried out in which the temperature at the entrance of the heat treatment apparatus was 655° C., the maximum temperature was 1400° C., and the length of the furnace and the line speed were adjusted so that the temperature rise rate was 80° C. per minute (that is, the temperature of the polymer film was suddenly raised from room temperature to 655° C., and therefore the sag controlling step was not carried out). The various properties of the graphite film were evaluated. The results are shown in Tables 5A, 6A, 7A and 8A.

Comparative Example 3A

The temperature at the entrance of the heat treatment apparatus was changed to 300° C. (corresponding to the temperature at the start of the sag controlling step), the maximum temperature was changed to 400° C., and the length of the furnace and the line speed were adjusted so that the temperature rise rate was 80° C. per minute (that is, a certain temperature gradient along the widthwise direction of the film, which was given in the sag controlling step in Examples of the present invention, was given at a temperature lower than the starting temperature of thermal decomposition).

Next, the film was cooled to room temperature (23° C.), was wound into a roll having an inner diameter of 100 mm, and was set in a carbonizing furnace so that the widthwise direction of the film was parallel to the vertical direction (see FIG. 16). The film was carbonized by heat treatment while raising the temperature in the carbonizing furnace from room temperature to 1400° C. at 2° C. per minute without particular control of the temperatures at both widthwise ends of the film and the temperature in a widthwise middle portion of the film.

Next, the carbonized film was cooled to room temperature, was set in a graphitization furnace in the same manner as in the carbonization, and was graphitized by heat treatment while raising the temperature in the graphitization furnace from room temperature (23° C.) to 2900° C. at 0.5° C. per minute without particular control of the temperatures at the both widthwise ends of the film and the temperature in the widthwise middle portion of the film.

Next, the graphitized film was cooled to room temperature, and compressed with a pressure of 10 MPa at room temperature.

Five films were produced in the same manner so that the number of evaluations was n=5, and were evaluated for their sag reproducibility, sag Zgs, a-value, b-value, camber, resistance to tearing, and lamination property. As for the sag Zgs, a-value, b-value and camber, their maximum and minimum values of the five (n=5) evaluations are shown in Tables 5A, 6A, 7A and 8A. The resistance to tearing and lamination property are also shown in Tables 5A, 6A, 7A and 8A as "best evaluation value–worst evaluation value". It should be noted that, in a case where the best and worst evaluations are the same, the result is shown as a single evaluation value.

Reference Example 1A

A graphite film was produced in the same manner as that described in Example 1A, except that the temperatures at both widthwise ends of a polymer film and the temperature in a widthwise middle portion of the polymer film were the same. The various properties of the graphite film were evaluated. The results are shown in Tables 5A, 6A, 7A and 8A.

Reference Example 2A

A graphite film was produced in the same manner as that described in Example 1A, except that a linear temperature gradient along the widthwise direction was such that each of the temperatures at both widthwise ends of a polymer film was 5° C. lower than the temperature in a middle portion of the polymer film. The various properties of the graphite film were evaluated. The results are shown in Tables 5A, 6A, 7A and 8A.

TABLE 5A

| | Raw Material Film | | | |
|---|---|---|---|---|
| | Type | Birefringence | Thickness μm | Width mm | Length m |
| Comparative Example 1A | NPI | 0.14 | 75 | 200 | 10 |
| Comparative Example 2A | NPI | 0.14 | 75 | 200 | 10 |
| Comparative Example 3A | NPI | 0.14 | 75 | 200 | 10 |
| Reference Example 1A | NPI | 0.14 | 75 | 200 | 10 |
| Reference Example 2A | NPI | 0.14 | 75 | 200 | 10 |

TABLE 6A

| | Sag Controlling Step | | | | | | | | | |
|---|---|---|---|---|---|---|---|---|---|---|
| | | Starting Temp of Thermal Decomposition | | | Sag Controlling Temp | | | Temp Gradient | | Max Temp |
| | Method | End 1 ° C. | Middle ° C. | End 2 ° C. | End 1 ° C. | Middle ° C. | End 2 ° C. | Max ° C./m | Min ° C./m | in Heat Treatment |
| Comparative Example 1A | | | | | Not Carried Out | | | | | |
| Comparative Example 2A | CLFPM*1 | 660 | 655 | 660 | 1405 | 1400 | 1405 | 25 | 25 | 1400 |
| Comparative Example 3A | CLFPM*1 | 305 | 300 | 305 | 405 | 400 | 405 | 25 | 25 | 400 |
| Reference Example 1A | CLFPM*1 | 500 | 500 | 500 | 580 | 580 | 580 | 0 | 0 | 580 |

TABLE 6A-continued

| | | | | | | | | | | |
|---|---|---|---|---|---|---|---|---|---|---|
| Reference Example 2A | CLFPM*1 | 495 | 500 | 495 | 575 | 580 | 575 | −25 | −25 | 580 |

| | Sag Controlling Step | | | | |
|---|---|---|---|---|---|
| | Number of Measurement Positions | Number of Measurement Positions Satisfying Conditions | Pulling Strength kgf/cm2 | Load g/cm2 | Temp Rise Rate ° C./min |
| Comparative Example 1A | Not Carried Out | | | | |
| Comparative Example 2A | 4 | 4 | 30 | 2 | 80 |
| Comparative Example 3A | 4 | 4 | 30 | 2 | 80 |
| Reference Example 1A | 4 | 4 | 30 | 2 | 80 |
| Reference Example 2A | 4 | 4 | 30 | 2 | 80 |

*1"CLFPM" stands for "continuous long film processing method".

TABLE 7A

| | Physical Properties of Film After Sag Controlling Step | | | | Carbonization Step | | | | Graphitization Step | | | |
|---|---|---|---|---|---|---|---|---|---|---|---|---|
| | Cracking (Paper Tube Wraparound Test) | Weight Retention Rate % | Weight Loss Rate % | Total Transmittance % | Method of Setting | Max Temp ° C. | Widthwise Temp Difference of Film ° C. | Temp Rise Rate ° C./min | Method of Setting | Max Temp ° C. | Temp Rise Rate ° C./min | Compression |
| Comparative Example 1A | No Sag Controlling Step | | | | Cylindrical Roll | 1400 | 0 | 2 | Cylindrical Roll | 2900 | 0.5 | Carried Out |
| Comparative Example 2A | E | 97.2 | 2.8 | 0.20 | Cylindrical Roll | 1400 | 0 | 2 | Cylindrical Roll | 2900 | 0.5 | Carried Out |
| Comparative Example 3A | E | 97.2 | 2.8 | 0.20 | Cylindrical Roll | 1400 | 0 | 2 | Cylindrical Roll | 2900 | 0.5 | Carried Out |
| Reference Example 1A | A | 97.2 | 2.8 | 0.20 | Cylindrical Roll | 1400 | 0 | 2 | Cylindrical Roll | 2900 | 0.5 | Carried Out |
| Reference Example 2A | A | 97.2 | 2.8 | 0.20 | Cylindrical Roll | 1400 | 0 | 2 | Cylindrical Roll | 2900 | 0.5 | Carried Out |

TABLE 8A

| | Physical Properties of Graphitized Film | | | | | | | | | |
|---|---|---|---|---|---|---|---|---|---|---|
| | | Sag | | a-Value | | b-Value | | Camber | | |
| | Sag Reproducibility | Max mm | Min mm | Max mm | Min mm | Max mm | Min mm | Max mm | Min mm | Resistance to Tearing | Lamination Property |
| Comparative Example 1A | E | 140 | 50 | 100 | 0 | 50 | 0 | 10 | <2 | A-E | E |
| Comparative Example 2A | E | 135 | 45 | 100 | 0 | 45 | 0 | 10 | <2 | A-E | E |
| Comparative Example 3A | E | 140 | 50 | 100 | 0 | 50 | 0 | 10 | <2 | A-E | E |
| Reference Example 1A | A | 0 | 0 | 0 | 0 | 0 | 0 | <2 | <2 | D | A |
| Reference Example 2A | A | 40 | 38 | 0 | 0 | 40 | 38 | <2 | <2 | E | B |

<Sag Controlling Step>

A comparison was made between Examples 1A to 21A including the sag controlling step and Comparative Example 1A including no sag controlling step. The graphite film of Comparative Example 1A including no sag controlling step had a poor sag reproducibility rated as "E" and had varying depths of sag. The resistance to tearing also greatly varied, and the worst evaluation value of the five (n=5) evaluations was "E". The lamination property of each of the five samples was also very poor and rated as "E".

The graphite films of Examples 1A to 21A including the sag controlling step had improved resistance to tearing and lamination property.

<Temperature Gradient>

A comparison was made among Examples 1A to 5A, 18A and 21A and Reference Examples 1A and 2A, which had different temperature gradients. In Examples 1A to 5A in which a temperature gradient over an area extending from the both widthwise ends of the polymer film toward the widthwise middle portion was not less than 2.5° C./m, the films had high resistance to tearing and good lamination property. In Example 3A in which a temperature gradient over an area extending from the both widthwise ends of the polymer film toward the widthwise middle portion was 25° C./m, the film had a sag with an appropriate depth at both widthwise ends thereof and had very high resistance to tearing and very good lamination property.

A comparison was made between Example 3A (in which the temperature gradient on the left side was the same as the temperature gradient on the right side) and Example 6A (in which the temperature gradient on the left side was different from the temperature gradient on the right side). It was found that the graphite film obtained in Example 6A had camber.

<Sag Controlling Temperature>

A comparison was made among Examples 3A and 7A to 10A which had different sag controlling temperatures. Higher sag controlling temperatures brought about deeper sags in both widthwise ends. In particular, the films obtained in Examples 3A, 8A, 9A and 10A had high resistance to tearing. Furthermore, the depth of sag was substantially the same between Example 10A and Examples 11A and 12A. This showed that the depth of sag would not change anymore after the sag controlling temperature reached 655° C.

Furthermore, it was found that, in Examples 3A, 7A and 8A in which the sag controlling temperature was equal to or lower than 605° C., the films after the sag controlling step had less cracks and thus were easy to handle.

Furthermore, it was found that, in Comparative Examples 2A and 3A in which a process similar to the sag controlling step was carried out outside a temperature range from the starting temperature of thermal decomposition to the sag controlling temperature, the films had poor sag reproducibility as with Comparative Example 1A in which the sag controlling step was not carried out and sag was not controlled.

<Temperature Gradient in Each Measurement Position>

A comparison was made among Examples 3A, 19A and 20A. In all of these examples, in at least part of the temperature range from the starting temperature of thermal decomposition of the polymer film to the temperature at which the weight loss rate of the polymer film reached 20.0%, (i) each of the temperatures at the both widthwise ends of the polymer film was higher than the temperature in the widthwise middle portion of the polymer film and (ii) the temperature gradient over an area extending from the both widthwise ends to the widthwise middle portion was equal to or greater than 2.5° C./m. Thus, in all of these examples, sag was controlled. Of these examples, Example 3A, which met the above conditions in all of the temperature measuring positions in the sag controlling step, best controlled sag.

Examples B According to Second Embodiment

The following description discusses conditions for the measurement of various physical properties. In the following description, only the differences between Examples A according to the first embodiment and Examples B according to the second embodiment are discussed, and those that are the same between both examples are omitted. In Examples B according to the second embodiment, the maximum and minimum values of five (n=5) evaluations are shown in Tables.

<Evaluation of Cambering Property>

Evaluation of cambering property was carried out on the basis of the camper measurement in accordance with JIS C2151. The cambering property was rated as: "A" when camper was 30 mm or greater; "B" when camper was not less than 20 mm and less than 30 mm; "C" when camper was not less than 15 mm and less than 20 mm; "D" when camper was not less than 11 mm and less than 15 mm; and "E" when camper was less than 11. The results are expressed as "best evaluation value–worst evaluation value". In a case where the best and worst evaluations are the same, the result is shown as a single evaluation value.

<Evaluation of Rolling Property>

Figure 22:
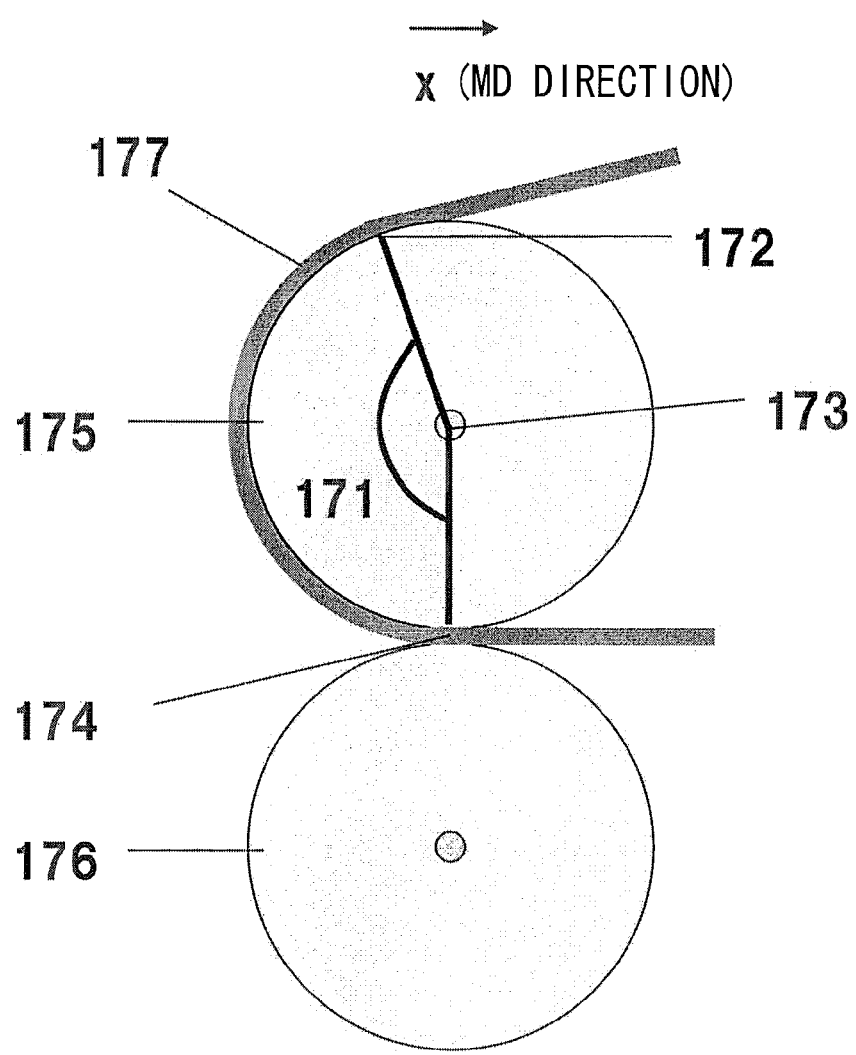
FIG. 22 is a view schematically showing a rolling process.
Figure 23:
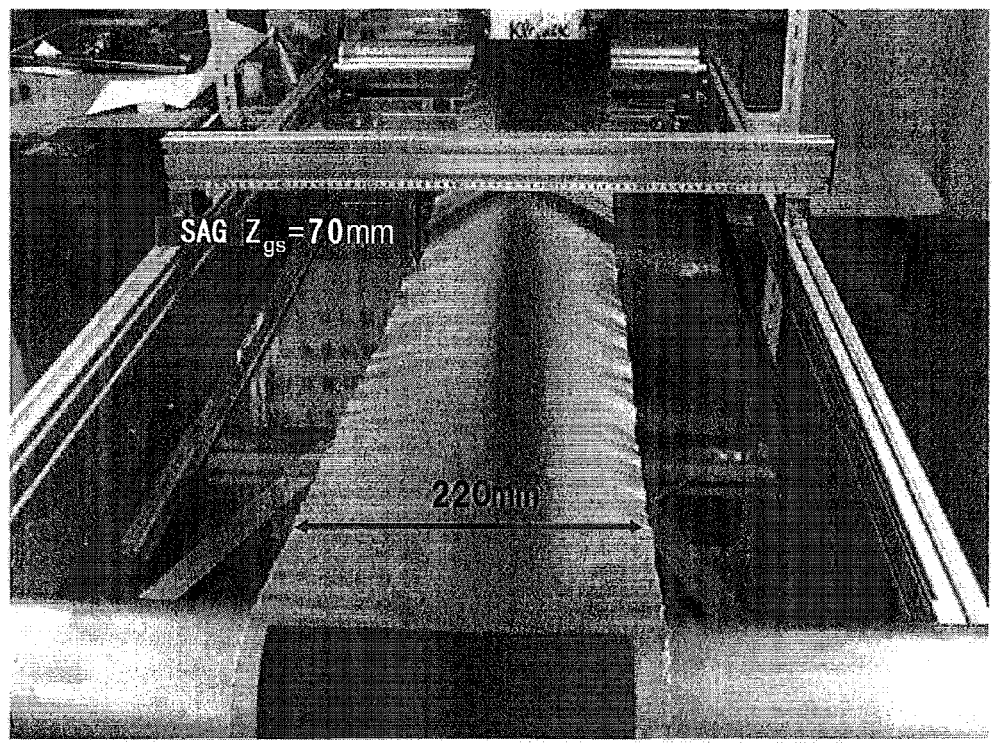
FIG. 23 is a view showing one example of sag of a graphite film.

The rolling property of a graphite film was evaluated as illustrated in FIG. 22. More specifically, GS3 having a size of 200 mm in width×5 m was rolled spread with the use of 2-ton Precision Roll Press (clearance display system) available from Thank Metal Co., LTD. A lower rolling-mill roll used here was a metallic roll made of SKD11 (having a hardness of greater than D95) having a size of 200 mm in diameter×250 mm in width, and an upper rolling-mill roll used here was an urethane roll having a hardness of D77 and a size of 200 mm in diameter×250 mm in width. The evaluation was carried out under the following condition: the clearance between the rolling-mill rolls was adjusted to −200 µm; a tensile force of 30 g/cm was applied to the graphite film in the MD direction; the graphite film was continuously supplied between the upper rolling-mill roll and the lower rolling-mill roll so that the angle formed by a line connecting (the starting point of contact between the upper rolling-mill roll and the graphite film) and (the center point of the upper rolling-mill roll) and a line connecting (the center point of the upper rolling-mill roll) and (the point of contact between the upper rolling-mill roll and the lower rolling-mill roll) was 120 degrees (FIG. 22); and the line speed was 2 m per minute.

Figure 17:
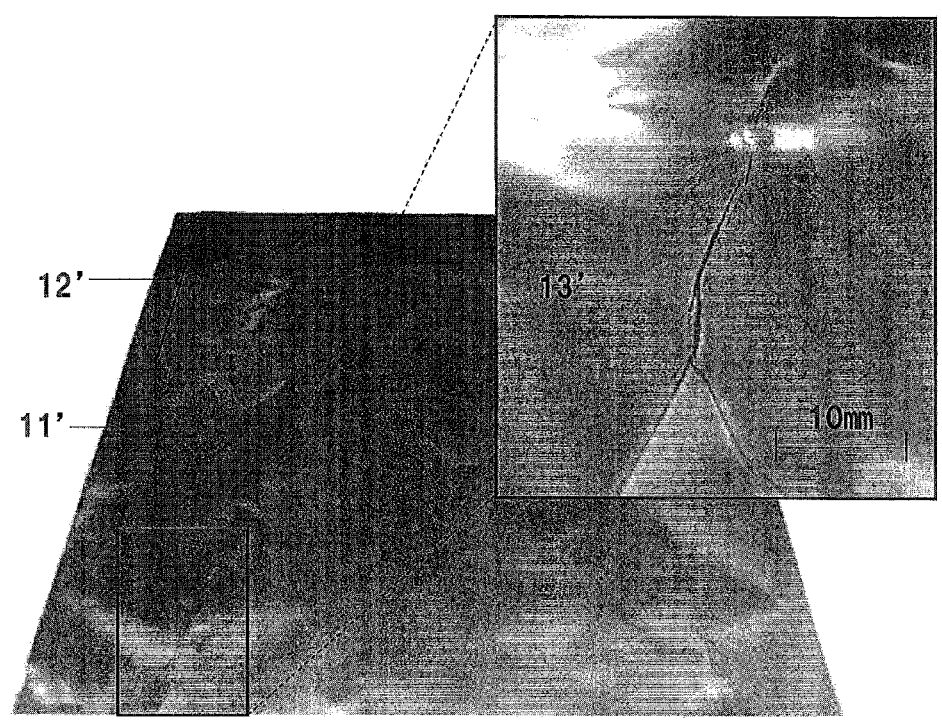
FIG. 17 is a photograph showing an appearance of folding wrinkles of a graphite film which wrinkles occur during the rolling process.

After the rolling property test, wrinkles as shown in FIG. 17 were evaluated in the following manner. Across the whole area of the roll, wrinkles of not less than 5 mm in length were counted and converted as the number of visible wrinkles across the width of the film per unit longitudinal length (1 m). The graphite films were rated as: "A" when the number of wrinkles per meter was 0; "B" when the number of wrinkles per meter was greater than 0 and less than 0.05; "C" when the number of wrinkles per meter was not less than 0.05 and less than 0.2; "D" when the number of wrinkles per meter was not less than 0.2 and less than 1; and "E" when the number of wrinkles per meter was not less than 1.

The results are expressed as "best evaluation value–worst evaluation value". In a case where the best and worst evaluations are the same, the result is shown as a single evaluation value.

<Evaluation of Lamination Property to Copper Foil Tape>

Figure 14:
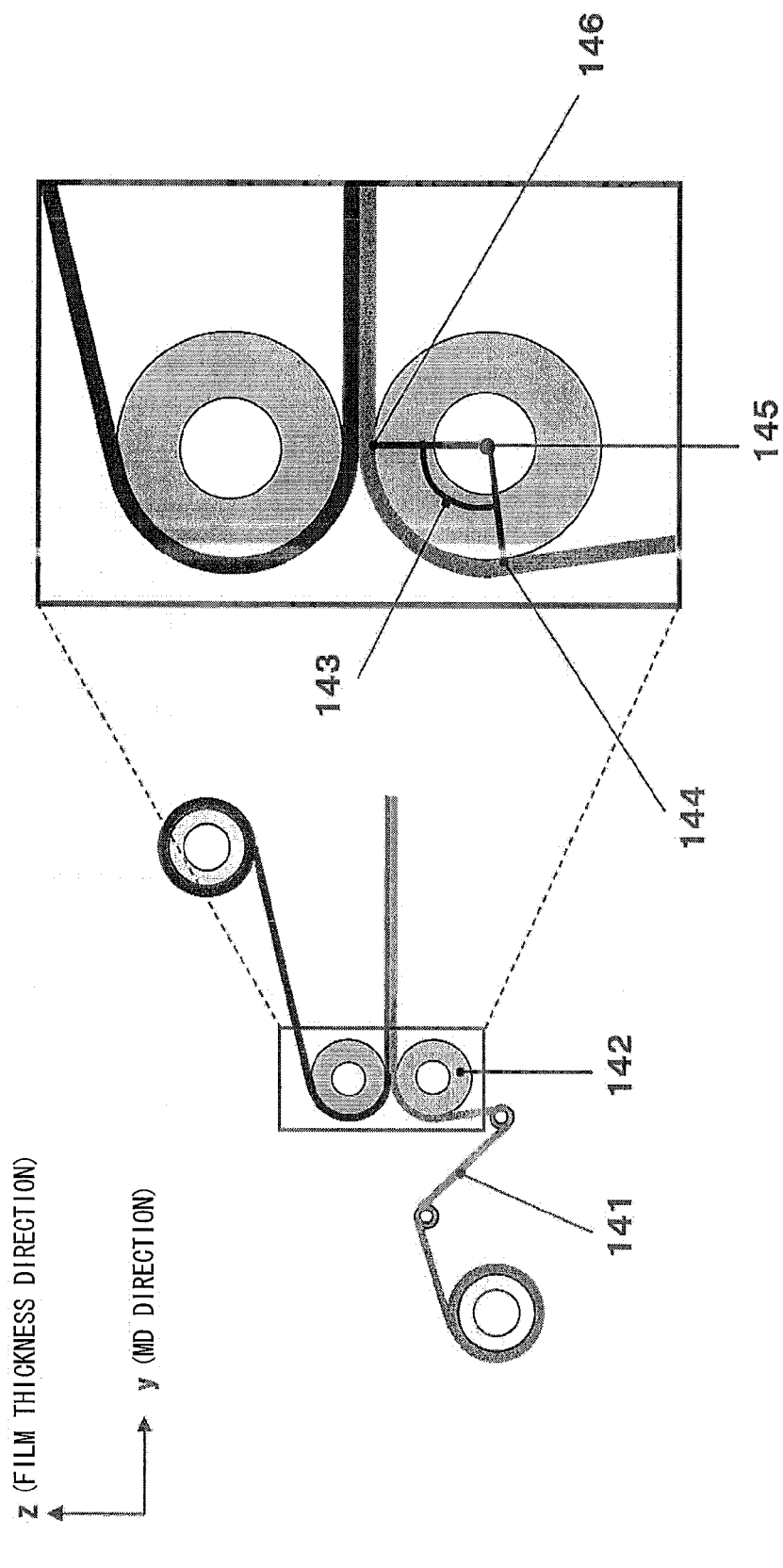
FIG. 14 is an explanatory view of an angle formed by a line connecting (the starting point of contact between the first roll and the graphite film) and (the center point of the first roll) and a line connecting (the center point of the first roll) and (the point of contact between the first roll and the second roll).

The graphite film was supplied between the first roll and the second roll such that the angle formed by a line connecting (the starting point of contact between the first roll and the graphite film) and (the center point of the first roll) and a line connecting (the center point of the first roll) and (the point of contact between the first roll and the second roll) was 120 degrees (see FIG. 14). The PET tape was E-1100LC available from DIC. The PET tape was supplied to the second roll so that the angle formed by a line connecting (the starting point of contact between the second roll and the copper foil tape) and (the center point of the second roll) and a line connecting (the center point of the second roll) and (the point of contact between the first roll and the second roll) was 120 degrees. A tensile force to be applied in the MD direction of the graphite film was 30 g/cm, and the rewinding speed was 1 m per minute.

Figure 21:
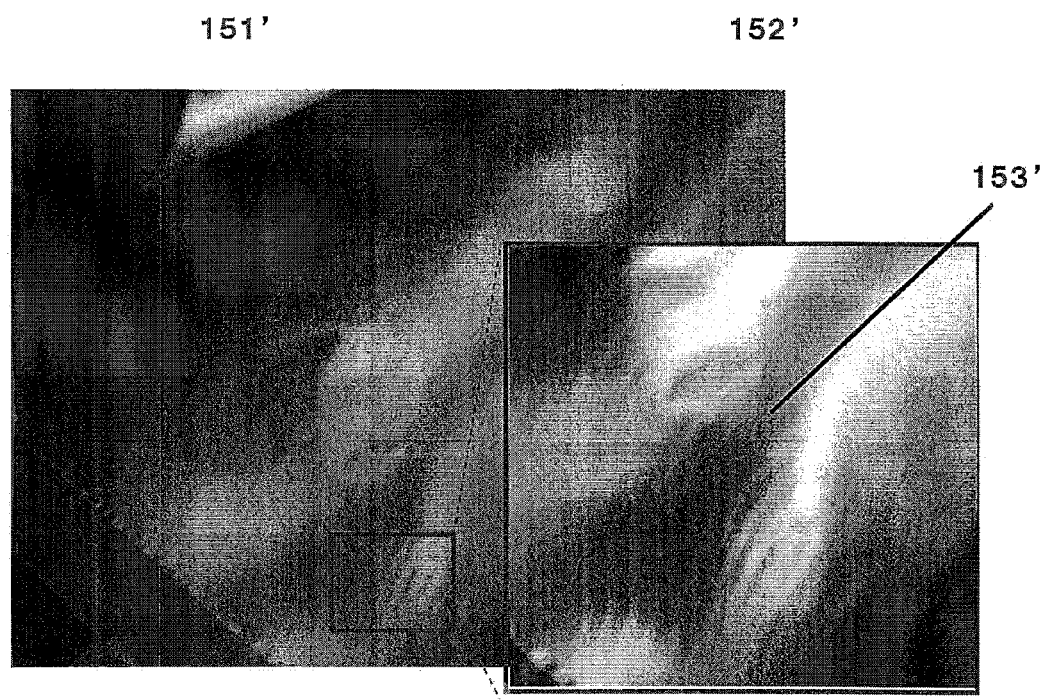
FIG. 21 is a photograph showing an appearance of laminating wrinkles.

Wrinkles (as shown in FIG. 21) of the graphite films after the completion of the laminating test were evaluated as follows. Across the whole area of the roll, wrinkles of not less than 5 mm in length were counted and converted as the number of visible wrinkles across the width of the film per unit lengthwise length (1 m). The graphite composite films were rated as: "A" when the number of wrinkles per meter was 0; "B" when the number of wrinkles per meter was greater than 0 and less than 0.05; "C" when the number of wrinkles per meter was not less than 0.05 and less than 0.2; "D" when the number of wrinkles per meter was not less than 0.2 and less than 1; and "E" when the number of wrinkles per meter was not less than 1.

The results are expressed as "best evaluation value–worst evaluation value". In a case where the best and worst evaluations are the same, the result is shown as a single evaluation value.

Example 1B

A polymer film used here was a polyimide film Apical NPI (available from Kaneka Corporation) having a birefringence of 0.14, thickness of 75 μm, width of 200 mm and length of 10 m. In Apical NPI, the temperatures corresponding to the weight loss rates 1.0%, 1.1%, 2.8%, 10.0%, 15.0% and 20.0% in the measurement method of the present invention are 500° C., 520° C., 550° C., 580° C., 600° C., 630° C. and 655° C., respectively. The polymer film was set to a rewinding apparatus as illustrated in FIG. 8, and the sag controlling step was carried out while the polymer film was continuously supplied to a heat treatment apparatus. The length of the heat treatment apparatus along the MD direction was 60 cm and the length along the TD direction was 30 cm. The temperature in a widthwise middle portion of the polymer film was controlled such that (i) the temperature at an entrance of the heat treatment apparatus was 500° C. (corresponding to the starting temperature of thermal decomposition of the polymer film used in the present example), (ii) the temperature in a position 50 cm away from the entrance was the maximum temperature 580° C. (corresponding to the sag controlling temperature for the polymer film used in the present example), and (iii) the temperature at an exit, which is 10 cm away from the position of the maximum temperature, was 500° C. A linear temperature gradient was given so that the widthwise middle portion of the polymer film had a temperature distribution along the lengthwise direction of the polymer film as shown in FIG. 8. The line speed was controlled so that the actual temperature of the polymer film would increase at 80° C. per minute (equivalent to a line speed of 50 cm per minute) in the 500° C.-580° C. range. Furthermore, a linear temperature gradient was given also along the widthwise direction so that (i) the temperature in the middle portion of the polymer film was 1° C. higher than the temperatures at both widthwise ends (each of which is 10 cm away from the widthwise middle portion) of the polymer film and (ii) the polymer film had a temperature distribution along the widthwise direction of the polymer film as shown in FIG. 8. The temperature gradient along the widthwise direction was measured in four positions, i.e., the positions where the temperatures in the widthwise middle portion of the polymer film were 500° C., 530° C., 560° C. and 580° C. It was confirmed that, in each of the four positions, the temperature in the widthwise middle portion was 1° C. higher than that at each of the widthwise ends.

The polymer film was conveyed while a tensile force was applied to the film with a tensile strength of 30 kgf/cm². In the heat treatment apparatus, the film was conveyed through a gap between graphite jigs placed above and below the film (see FIG. 8). A pressure of 2 g/cm² was applied to the film in its thickness direction. After the sag controlling step, the film was evaluated for cracks and was measured for the weight retention rate, weight loss rate and total transmittance.

Next, the film having been subjected to the sag controlling step was cooled to room temperature (23° C.), was wound into a roll having an inner diameter of 100 mm, and was set in a carbonizing furnace so that the widthwise direction of the film was parallel to the vertical direction (see FIG. 16). The film was carbonized by heat treatment while raising the temperature in the carbonizing furnace from room temperature to 1400° C. at 2° C. per minute without particular control of the temperatures at the both widthwise ends of the film and the temperature in the widthwise middle portion of the film.

Next, the carbonized film was cooled to room temperature (23° C.), was set in a graphitization furnace in the same manner as in the carbonization, and was graphitized by heat treatment while raising the temperature in the graphitization furnace from room temperature to 2900° C. at 0.5° C. per minute without particular control of the temperatures at the both widthwise ends of the film and the temperature in the widthwise middle portion of the film.

Next, the graphitized film was cooled to room temperature, and compressed with a pressure of 10 MPa at room temperature.

Five films were produced in the same manner so that the number of evaluations was n=5, and were evaluated for their sag reproducibility, sag Zgs, a-value, b-value, camber, rolling property, and lamination property to copper foil tape. As for the sag Zgs, a-value, b-value and camber, the maximum and minimum values of the five (n=5) evaluations are shown in Table 4B. The rolling property, lamination property to copper foil tape, and cambering property are also shown in Tables 1B, 2B, 3B and 4B as "best evaluation value–worst evaluation value". It should be noted that, in a case where the best and worst evaluations are the same, the result is shown as a single evaluation value.

Example 2B

A graphite film was produced in the same manner as that described in Example 1B, except that a linear temperature gradient along the widthwise direction was such that the temperature in the widthwise middle portion of a polymer film was 3° C. higher than each of the temperatures at the both widthwise ends of the polymer film. The various properties of the graphite film were evaluated. The results are shown in Tables 1B, 2B, 3B and 4B.

Example 3B

A graphite film was produced in the same manner as that described in Example 1B, except that a linear temperature gradient along the widthwise direction was such that the temperature in the widthwise middle portion of a polymer film was 5° C. higher than each of the temperatures at the both widthwise ends of the polymer film. The various properties of the graphite film were evaluated. The results are shown in Tables 1B, 2B, 3B and 4B.

Example 4B

A graphite film was produced in the same manner as that described in Example 1B, except that a linear temperature gradient along the widthwise direction was such that the temperature in the widthwise middle portion of a polymer film was 10° C. higher than each of the temperatures at the both widthwise ends of the polymer film. The various properties of the graphite film were evaluated. The results are shown in Tables 1B, 2B, 3B and 4B.

Example 5B

A graphite film was produced in the same manner as that described in Example 1B, except that a linear temperature gradient along the widthwise direction was such that the temperature in the widthwise middle portion of a polymer film was 20° C. higher than each of the temperatures at the both widthwise ends of the polymer film. The various properties of the graphite film were evaluated. The results are shown in Tables 1B, 2B, 3B and 4B.

Example 6B

A graphite film was produced in the same manner as that described in Example 3B, except that, in the sag controlling step, the maximum temperature in the heat treatment apparatus was 555° C. and the length of the furnace and the line speed were adjusted so that the temperature rise rate was 80° C. per minute. The various properties of the graphite film were evaluated. The results are shown in Tables 1B, 2B, 3B and 4B.

Example 7B

A graphite film was produced in the same manner as that described in Example 3B, except that, in the sag controlling step, the maximum temperature in the heat treatment apparatus was 605° C. and the length of the furnace and the line speed were adjusted so that the temperature rise rate was 80° C. per minute. The various properties of the graphite film were evaluated. The results are shown in Tables 1B, 2B, 3B and 4B.

Example 8B

A graphite film was produced in the same manner as that described in Example 3B, except that, in the sag controlling step, the maximum temperature in the heat treatment apparatus was 630° C. and the length of the furnace and the line speed were adjusted so that the temperature rise rate was 80° C. per minute. The various properties of the graphite film were evaluated. The results are shown in Tables 1B, 2B, 3B and 4B.

Example 9B

A graphite film was produced in the same manner as that described in Example 3B, except that, in the sag controlling step, the maximum temperature in the heat treatment apparatus was 655° C. and the length of the furnace and the line speed were adjusted so that the temperature rise rate was 80° C. per minute. The various properties of the graphite film were evaluated. The results are shown in Tables 1B, 2B, 3B and 4B.

Example 10B

A graphite film was produced in the same manner as that described in Example 1B, except that a linear temperature gradient along the widthwise direction was such that the temperature in the widthwise middle portion of a polymer film was 0.5° C. higher than each of the temperatures at both widthwise ends of the polymer film. The various properties of the graphite film were evaluated. The results are shown in Tables 1B, 2B, 3B and 4B.

Comparative Example 1B

A polymer film, which had not been subjected to the sag controlling step, was carbonized in the following manner. The polymer film used here was a polyimide film Apical NPI (available from Kaneka Corporation) having a birefringence of 0.14, thickness of 75 µm, width of 200 mm and length of 10 m. In the same manner as in Example 1B, each film was wound into a roll having an inner diameter of 100 mm, was set in a carbonizing furnace so that the widthwise direction of the film was parallel to the vertical direction (see FIG. 16), and was carbonized by heat treatment while raising the temperature in the carbonizing furnace from room temperature to 1400° C. at 2° C. per minute without particular control of the temperatures at both widthwise ends of the film and the temperature in a widthwise middle portion of the film.

Next, the carbonized film was cooled to room temperature (23° C.), was set in a graphitization furnace in the same manner as in the carbonization, and was graphitized by heat treatment while raising the temperature in the graphitization furnace from room temperature to 2900° C. at 0.5° C. per minute without particular control of the temperatures at the both widthwise ends of the film and the temperature in the widthwise middle portion of the film.

Next, the graphitized film was cooled to room temperature (23° C.), and compressed with a pressure of 10 MPa at room temperature.

Five films were produced in the same manner so that the number of evaluations was n=5, and were evaluated for their sag reproducibility, sag Zgs, a-value, b-value, camber, rolling property, lamination property to copper foil tape, and cambering property. As for the sag Zgs, a-value, b-value and camber, the maximum and minimum values of the five (n=5) evaluations are shown in Table 4B. The rolling property, lamination property to copper foil tape, and cambering property are also shown in Tables 1B to 12B as "best evaluation value–worst evaluation value". It should be noted that, in a case where the best and worst evaluations are the same, the result is shown as a single evaluation value.

Comparative Example 2B

A graphite film was produced in the same manner as that described in Example 3B, except that a process similar to the sag controlling step was carried out in the following condition: the temperature at the entrance of the heat treatment apparatus was 655° C., the maximum temperature was 1400° C., and the length of the furnace and the line speed were adjusted so that the temperature rise rate was 80° C. per minute (that is, the temperature of the polymer film was suddenly raised from room temperature to 655° C., and therefore the sag controlling step was not carried out). The various properties of the graphite film were evaluated. The results are shown in Tables 1B, 2B, 3B and 4B.

Comparative Example 3B

A process similar to the sag controlling step was carried out in the following condition: the temperature at the entrance of the heat treatment apparatus was 300° C. (corresponding to the temperature at the start of the sag controlling step), the maximum temperature was 400° C., and the length of the furnace and the line speed were adjusted so that the temperature rise rate was 80° C. per minute (that is, a certain temperature gradient along the widthwise direction of the film, which was given in the sag controlling step in Examples of the present invention, was given at a temperature lower than the starting temperature of thermal decomposition).

Next, the film was cooled to room temperature (23° C.), was wound into a roll having an inner diameter of 100 mm, and was set in a carbonizing furnace so that the widthwise direction of the film was parallel to the vertical direction (see FIG. 16). The film was carbonized by heat treatment while raising the temperature in the carbonizing furnace from room temperature to 1400° C. at 2° C. per minute without particular control of the temperatures at the both widthwise ends of the film and the temperature in the widthwise middle portion of the film.

Next, the carbonized film was cooled to room temperature, was set in a graphitization furnace in the same manner as in the carbonization, and was graphitized by heat treatment while raising the temperature in the graphitization furnace from room temperature (23° C.) to 2900° C. at 0.5° C. per minute without particular control of the temperatures at the both widthwise ends of the film and the temperature in the widthwise middle portion of the film.

Next, the graphitized film was cooled to room temperature, and compressed with a pressure of 10 MPa at room temperature.

Five films were produced in the same manner so that the number of evaluations was n=5, and were evaluated for their sag reproducibility, sag Zgs, a-value, b-value, camber, rolling property, lamination property to copper foil tape and cambering property. As for the sag Zgs, a-value, b-value and camber, the maximum and minimum values of the five (n=5) evaluations are shown in Table 4B. The rolling property, lamination property to copper foil tape, and cambering property are also shown in Tables 1B, 2B, 3B and 4B as "best evaluation value–worst evaluation value". It should be noted that, in a case where the best and worst evaluations are the same, the result is shown as a single evaluation value.

TABLE 1B

| | Raw Material Film | | | |
|---|---|---|---|---|
| | Type | Birefringence | Thickness μm | Width mm | Length m |
| Example 1B | NPI | 0.14 | 75 | 200 | 10 |
| Example 2B | NPI | 0.14 | 75 | 200 | 10 |
| Example 3B | NPI | 0.14 | 75 | 200 | 10 |
| Example 4B | NPI | 0.14 | 75 | 200 | 10 |
| Example 5B | NPI | 0.14 | 75 | 200 | 10 |
| Example 6B | NPI | 0.14 | 75 | 200 | 10 |
| Example 7B | NPI | 0.14 | 75 | 200 | 10 |
| Example 8B | NPI | 0.14 | 75 | 200 | 10 |
| Example 9B | NPI | 0.14 | 75 | 200 | 10 |
| Example 10B | NPI | 0.14 | 75 | 200 | 10 |
| Comparative Example 1B | NPI | 0.14 | 75 | 200 | 10 |
| Comparative Example 2B | NPI | 0.14 | 75 | 200 | 10 |
| Comparative Example 3B | NPI | 0.14 | 75 | 200 | 10 |

TABLE 2B

| | | Sag Controlling Step | | | | | | | |
|---|---|---|---|---|---|---|---|---|---|
| | | Starting Temp of Thermal Decomposition | | | Sag Controlling Temp | | | Temp Gradient between Each End and Middle Portion | |
| | Method | End 1 ° C. | Middle ° C. | End 2 ° C. | End 1 ° C. | Middle ° C. | End 2 ° C. | Max ° C./m | Min ° C./m |
| Example 1B | CLFPM*1 | 499 | 500 | 499 | 579 | 580 | 579 | −5 | −5 |
| Example 2B | CLFPM*1 | 497 | 500 | 497 | 577 | 580 | 577 | −15 | −15 |
| Example 3B | CLFPM*1 | 495 | 500 | 495 | 575 | 580 | 575 | −25 | −25 |
| Example 4B | CLFPM*1 | 490 | 500 | 490 | 570 | 580 | 570 | −50 | −50 |
| Example 5B | CLFPM*1 | 480 | 500 | 480 | 560 | 580 | 560 | −100 | −100 |
| Example 6B | CLFPM*1 | 495 | 500 | 495 | 550 | 555 | 550 | −25 | −25 |
| Example 7B | CLFPM*1 | 495 | 500 | 495 | 600 | 605 | 600 | −25 | −25 |
| Example 8B | CLFPM*1 | 495 | 500 | 495 | 625 | 630 | 625 | −25 | −25 |
| Example 9B | CLFPM*1 | 495 | 500 | 495 | 650 | 655 | 650 | −25 | −25 |
| Example 10B | CLFPM*1 | 499.5 | 500 | 499.5 | 579.5 | 580 | 579.5 | −2.5 | −2.5 |
| Comparative Example 1B | | | | | Not Carried Out | | | | |
| Comparative Example 2B | CLFPM*1 | 650 | 655 | 650 | 1395 | 1400 | 1395 | −25 | −25 |
| Comparative Example 3B | CLFPM*1 | 295 | 300 | 295 | 395 | 400 | 395 | −25 | −25 |

TABLE 2B-continued

| | Sag Controlling Step | | | | | |
|---|---|---|---|---|---|---|
| | Max Temp in Heat Treatment | Number of Measurement Positions | Number of Measurement Positions Satisfying Conditions | Puling Strength kgf/cm2 | Load g/cm2 | Temp Rise Rate °C./min |
| Example 1B | 580 | 4 | 4 | 30 | 2 | 80 |
| Example 2B | 580 | 4 | 4 | 30 | 2 | 80 |
| Example 3B | 580 | 4 | 4 | 30 | 2 | 80 |
| Example 4B | 580 | 4 | 4 | 30 | 2 | 80 |
| Example 5B | 580 | 4 | 4 | 30 | 2 | 80 |
| Example 6B | 555 | 3 | 3 | 30 | 2 | 80 |
| Example 7B | 605 | 5 | 5 | 30 | 2 | 80 |
| Example 8B | 630 | 6 | 6 | 30 | 2 | 80 |
| Example 9B | 655 | 7 | 7 | 30 | 2 | 80 |
| Example 10B | 580 | 4 | 4 | 30 | 2 | 80 |
| Comparative Example 1B | | Not Carried Out | | | | |
| Comparative Example 2B | 1400 | 4 | 4 | 30 | 2 | 80 |
| Comparative Example 3B | 400 | 4 | 4 | 30 | 2 | 80 |

*1"CLFPM" stands for "continuous long film processing method".

TABLE 3B

| | Physical Properties of Film After Sag Controlling Step | | | | Carbonization Step | | | | Graphitization Step | | |
|---|---|---|---|---|---|---|---|---|---|---|---|
| | Cracking (Paper Tube Wrap-around Test) | Weight Reten-tion Rate % | Weight Loss Rate % | Total Transmit-tance % | Method of Setting | Max Temp °C. | Widthwise Temp Difference of Film °C. | Temp Rise Rate °C./min | Method of Setting | Max Temp °C. | Temp Rise Rate °C./min |
| Example 1B | A | 97.2 | 2.8 | 0.20 | Cylindrical Roll | 1400 | 0 | 2 | Cylindrical Roll | 2900 | 0.5 |
| Example 2B | A | 97.2 | 2.8 | 0.20 | Cylindrical Roll | 1400 | 0 | 2 | Cylindrical Roll | 2900 | 0.5 |
| Example 3B | A | 97.2 | 2.8 | 0.20 | Cylindrical Roll | 1400 | 0 | 2 | Cylindrical Roll | 2900 | 0.5 |
| Example 4B | A | 97.2 | 2.8 | 0.20 | Cylindrical Roll | 1400 | 0 | 2 | Cylindrical Roll | 2900 | 0.5 |
| Example 5B | A | 97.2 | 2.8 | 0.20 | Cylindrical Roll | 1400 | 0 | 2 | Cylindrical Roll | 2900 | 0.5 |
| Example 6B | A | 98.8 | 1.2 | 5.50 | Cylindrical Roll | 1400 | 0 | 2 | Cylindrical Roll | 2900 | 0.5 |
| Example 7B | A | 90.0 | 10.0 | 0.03 | Cylindrical Roll | 1400 | 0 | 2 | Cylindrical Roll | 2900 | 0.5 |
| Example 8B | B | 85.0 | 15.0 | — | Cylindrical Roll | 1400 | 0 | 2 | Cylindrical Roll | 2900 | 0.5 |
| Example 9B | C | 80.0 | 20.0 | — | Cylindrical Roll | 1400 | 0 | 2 | Cylindrical Roll | 2900 | 0.5 |
| Example 10B | A | 97.2 | 2.8 | 0.20 | Cylindrical Roll | 1400 | 0 | 2 | Cylindrical Roll | 2900 | 0.5 |
| Comparative Example 1B | | No Sag Controlling Step | | | Cylindrical Roll | 1400 | 0 | 2 | Cylindrical Roll | 2900 | 0.5 |
| Comparative Example 2B | E | 97.2 | 2.8 | 0.20 | Cylindrical Roll | 1400 | 0 | 2 | Cylindrical Roll | 2900 | 0.5 |
| Comparative Example 3B | E | 97.2 | 2.8 | 0.20 | Cylindrical Roll | 1400 | 0 | 2 | Cylindrical Roll | 2900 | 0.5 |

TABLE 4B

Physical Properties of Graphitized Film

|  | Sag Reproducibility | Sag Zgs Max mm | Sag Zgs Min mm | a-Value Max mm | a-Value Min mm | b-Value Max mm | b-Value Min mm | Camber Max mm | Camber Min mm | Evaluation of Rolling Property | Evaluation of Lamination Property to Copper Foil |
|---|---|---|---|---|---|---|---|---|---|---|---|
| Example 1B | A | 10 | 9 | 0 | 0 | 10 | 9 | <2 | <2 | A | B |
| Example 2B | A | 30 | 28 | 0 | 0 | 30 | 28 | <2 | <2 | A | C |
| Example 3B | A | 40 | 38 | 0 | 0 | 40 | 38 | <2 | <2 | A | D |
| Example 4B | A | 70 | 65 | 0 | 0 | 70 | 65 | <2 | <2 | B | E |
| Example 5B | A | 90 | 85 | 0 | 0 | 90 | 85 | <2 | <2 | B | E |
| Example 6B | B | 30 | 20 | 0 | 0 | 30 | 20 | <2 | <2 | A | C |
| Example 7B | A | 45 | 43 | 0 | 0 | 45 | 43 | <2 | <2 | A | D |
| Example 8B | A | 48 | 45 | 0 | 0 | 48 | 45 | <2 | <2 | A | D |
| Example 9B | A | 50 | 48 | 0 | 0 | 50 | 48 | <2 | <2 | A | D |
| Example 10B | A | 5 | 5 | 0 | 0 | 5 | 5 | <2 | <2 | B | B |
| Comparative Example 1B | E | 140 | 50 | 100 | 0 | 50 | 0 | 10 | <2 | A-E | E |
| Comparative Example 2B | E | 135 | 45 | 100 | 0 | 45 | 0 | 10 | <2 | A-E | E |
| Comparative Example 3B | E | 140 | 50 | 100 | 0 | 50 | 0 | 10 | <2 | A-E | E |

Example 11B

A graphite film was produced in the same manner as that described in Example 6B, except that, for the sag controlling temperature, (i) the temperature at one widthwise end was the same as the temperature in the widthwise middle portion and (ii) only the temperature at the other widthwise end was 0.2° C. higher than the temperature in the widthwise middle portion. The various properties of the graphite film were evaluated. The results are shown in Tables 5B, 6B, 7B and 8B.

Example 12B

A graphite film as produced in the same manner as that described in Example 3B, except that, for the sag controlling temperature, (i) the temperature at one widthwise end was the same as the temperature in the widthwise middle portion and (ii) only the temperature at the other widthwise end was 0.4° C. higher than the temperature in the widthwise middle portion. The various properties of the graphite film were evaluated. The results are shown in Tables 5B, 6B, 7B and 8B.

Example 13B

A graphite film as produced in the same manner as that described in Example 7B, except that the temperatures at the both widthwise ends of the polymer film were the same as the temperature in the widthwise middle portion of the polymer film. The various properties of the graphite film were evaluated. The results are shown in Tables 5B, 6B, 7B and 8B.

Example 14B

A graphite film as produced in the same manner as that described in Example 8B, except that, for the sag controlling temperature, (i) the temperature at one widthwise end was the same as the temperature in the widthwise middle portion and (ii) only the temperature at the other widthwise end was 0.4° C. higher than the temperature in the widthwise middle portion. The various properties of the graphite film were evaluated. The results are shown in Tables 5B, 6B, 7B and 8B.

Example 15B

A graphite film as produced in the same manner as that described in Example 9B, except that the temperatures at the both widthwise ends of the polymer film were the same as the temperature in the widthwise middle portion. The various properties of the graphite film were evaluated. The results are shown in Tables 5B, 6B, 7B and 8B.

Comparative Example 4B

A graphite film as produced in the same manner as that described in Comparative Example 2B, except that the temperatures at the both widthwise ends of the polymer film were the same as the temperature in the widthwise middle portion of the polymer film. The various properties of the graphite film were evaluated. The results are shown in Tables 5B, 6B, 7B and 8B.

Comparative Example 5B

A graphite film as produced in the same manner as that described in Comparative Example 3B, except that the temperatures at the both widthwise ends of the polymer film were the same as the temperature in the widthwise middle portion. The various properties of the graphite film were evaluated. The results are shown in Tables 5B, 6B, 7B and 8B.

TABLE 5B

| | Raw Material Film | | | |
|---|---|---|---|---|
| | Type | Birefringence | Thickness μm | Width mm | Length m |
| Example 11B | NPI | 0.14 | 75 | 200 | 10 |
| Example 12B | NPI | 0.14 | 75 | 200 | 10 |
| Example 13B | NPI | 0.14 | 75 | 200 | 10 |
| Example 14B | NPI | 0.14 | 75 | 200 | 10 |
| Example 15B | NPI | 0.14 | 75 | 200 | 10 |

TABLE 5B-continued

| | Raw Material Film | | | | |
|---|---|---|---|---|---|
| | Type | Birefringence | Thickness μm | Width mm | Length m |
| Comparative Example 1B | NPI | 0.14 | 75 | 200 | 10 |
| Comparative Example 4B | NPI | 0.14 | 75 | 200 | 10 |
| Comparative Example 5B | NPI | 0.14 | 75 | 200 | 10 |

TABLE 6B

| | | Sag Controlling Step | | | | | | | |
|---|---|---|---|---|---|---|---|---|---|
| | | Starting Temp of Thermal Decomposition | | | Sag Controlling Temp | | | Temp Gradient between Each End and Middle Portion | |
| | | End 1 | Middle | End 2 | End 1 | Middle | End 2 | Max | Min |
| | Method | °C. | | | °C. | | | °C./m | |
| Example 11B | CLFPM*1 | 500.2 | 500 | 500 | 555.2 | 555 | 555 | 1 | 1 |
| Example 12B | CLFPM*1 | 500.4 | 500 | 500 | 580.4 | 580 | 580 | 2 | 2 |
| Example 13B | CLFPM*1 | 500 | 500 | 500 | 605 | 605 | 605 | 0 | 0 |
| Example 14B | CLFPM*1 | 500.4 | 500 | 500 | 630.4 | 630 | 630 | 2 | 2 |
| Example 15B | CLFPM*1 | 500 | 500 | 500 | 655 | 655 | 655 | 0 | 0 |
| Comparative Example 1B | | Not Carried Out | | | | | | | |
| Comparative Example 4B | CLFPM*1 | 655 | 655 | 655 | 1400 | 1400 | 1400 | 0 | 0 |
| Comparative Example 5B | CLFPM*1 | 300 | 300 | 300 | 400 | 400 | 400 | 0 | 0 |

| | Sag Controlling Step | | | | | |
|---|---|---|---|---|---|---|
| | Max Temp in Heat Treatment | Number of Measurement Positions | Number of Measurement Positions Satisfying Conditions | Pulling Strength kgf/cm2 | Load g/cm2 | Temp Rise Rate °C./min |
| Example 11B | 555 | 3 | 3 | 30 | 2 | 80 |
| Example 12B | 580 | 4 | 4 | 30 | 2 | 80 |
| Example 13B | 605 | 5 | 5 | 30 | 2 | 80 |
| Example 14B | 630 | 6 | 6 | 30 | 2 | 80 |
| Example 15B | 655 | 7 | 7 | 30 | 2 | 80 |
| Comparative Example 1B | | Not Carried Out | | | | |
| Comparative Example 4B | 1400 | 4 | 4 | 30 | 2 | 80 |
| Comparative Example 5B | 400 | 4 | 4 | 30 | 2 | 80 |

*1"CLFPM" stands for "continuous long film processing method".

TABLE 7B

| | Physical Properties of Film After Sag Controlling Step | | | | Carbonization Step | | | Graphitization Step | | |
|---|---|---|---|---|---|---|---|---|---|---|
| | Cracking (Paper Tube Wrap-around Test) | Weight Retention Rate % | Weight Loss Rate % | Total Transmittance % | Method of Setting | Max Temp °C. | Widthwise Temp Difference of Film °C. | Temp Rise Rate °C./min | Method of Setting | Max Temp °C. | Temp Rise Rate °C./min |
| Example 11B | A | 98.8 | 1.2 | 5.50 | Cylindrical Roll | 1400 | 0 | 2 | Cylindrical Roll | 2900 | 0.5 |
| Example 12B | A | 97.2 | 2.8 | 0.20 | Cylindrical Roll | 1400 | 0 | 2 | Cylindrical Roll | 2900 | 0.5 |
| Example 13B | A | 90.0 | 10.0 | 0.03 | Cylindrical Roll | 1400 | 0 | 2 | Cylindrical Roll | 2900 | 0.5 |
| Example 14B | B | 85.0 | 15.0 | — | Cylindrical Roll | 1400 | 0 | 2 | Cylindrical Roll | 2900 | 0.5 |

TABLE 7B-continued

| | Physical Properties of Film After Sag Controlling Step | | | | Carbonization Step | | | | Graphitization Step | | |
|---|---|---|---|---|---|---|---|---|---|---|---|
| | Cracking (Paper Tube Wrap-around Test) | Reten-tion Rate % | Weight Loss Rate % | Total Transmit-tance % | Method of Setting | Widthwise Max Temp °C. | Temp Difference of Film °C. | Temp Rise Rate °C./min | Method of Setting | Max Temp °C. | Temp Rise Rate °C./min |
| Example 15B | C | 80.0 | 20.0 | — | Cylindrical Roll | 1400 | 0 | 2 | Cylindrical Roll | 2900 | 0.5 |
| Comparative Example 1B | No Sag Controlling Step | | | | Cylindrical Roll | 1400 | 0 | 2 | Cylindrical Roll | 2900 | 0.5 |
| Comparative Example 4B | E | 97.2 | 2.8 | 0.20 | Cylindrical Roll | 1400 | 0 | 2 | Cylindrical Roll | 2900 | 0.5 |
| Comparative Example 5B | E | 97.2 | 2.8 | 0.20 | Cylindrical Roll | 1400 | 0 | 2 | Cylindrical Roll | 2900 | 0.5 |

TABLE 8B

| | Physical Properties of Graphitized Film | | | | | | | | | |
|---|---|---|---|---|---|---|---|---|---|---|
| | Sag Reproducibility | Sag Zgs Max mm | Sag Zgs Min mm | a-Value Max mm | a-Value Min mm | b-Value Max mm | b-Value Min mm | Camber Max mm | Camber Min mm | Evaluation of Rolling Property | Evaluation Lamination Property to Copper Foil |
| Example 11B | B | 4 | 3 | 4 | 3 | 0 | 0 | <2 | <2 | C | A |
| Example 12B | A | 3 | 2 | 3 | 2 | 0 | 0 | <2 | <2 | C | A |
| Example 13B | A | 2 | 2 | 2 | 2 | 0 | 0 | <2 | <2 | C | A |
| Example 14B | A | 2 | 1 | 2 | 1 | 0 | 0 | <2 | <2 | C | A |
| Example 15B | A | 1 | 1 | 1 | 1 | 0 | 0 | <2 | <2 | C | A |
| Comparative Example 1B | E | 140 | 50 | 100 | 0 | 50 | 0 | 10 | <2 | A-E | E |
| Comparative Example 4B | E | 135 | 45 | 100 | 0 | 45 | 0 | 10 | <2 | A-E | E |
| Comparative Example 5B | E | 140 | 50 | 100 | 0 | 50 | 0 | 10 | <2 | A-E | E |

Example 16B

A graphite film was produced in the same manner as that described in Example 1B, except that a linear temperature gradient along the widthwise direction was such that a temperature B of a widthwise middle portion of the polymer film was 0.5° C. higher than a temperature C of one widthwise end of the polymer film and a temperature A of the other widthwise end of the polymer film was 0.5° C. higher than the temperature B of the widthwise middle portion. The various properties of the graphite film were evaluated. Further, a cambering property was also evaluated. The results are shown in Tables 9B, 10B, 11B, and 12B.

Example 17B

A graphite film was produced in the same manner as that described in Example 1B, except that a linear temperature gradient along the widthwise direction was such that a temperature B of a widthwise middle portion of the polymer film was 1.5° C. higher than a temperature C of one widthwise end of the polymer film and a temperature A of the other widthwise end of the polymer film was 1.5° C. higher than the temperature B of the widthwise middle portion. The various properties of the graphite film were evaluated. Further, a cambering property was also evaluated. The results are shown in Tables 9B, 10B, 11B, and 12B.

Example 18B

A graphite film was produced in the same manner as that described in Example 1B, except that a linear temperature gradient along the widthwise direction was such that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

Example 19B

A graphite film was produced in the same manner as that described in Example 1B, except that a linear temperature gradient along the widthwise direction was such that a temperature B of a widthwise middle portion of the polymer film was 5° C. higher than a temperature C of one widthwise end of the polymer film and a temperature A of the other widthwise end of the polymer film was 5° C. higher than the temperature B of the widthwise middle portion. The various properties of the graphite film were evaluated. Further, a cambering property was also evaluated. The results are shown in Tables 9B, 10B, 11B, and 12B.

Example 20B

A graphite film was produced in the same manner as that described in Example 1B, except that a linear temperature gradient along the widthwise direction was such that a temperature B of a widthwise middle portion of the polymer film was 10° C. higher than a temperature C of one widthwise end of the polymer film and a temperature A of the other widthwise end of the polymer film was 10° C. higher than the temperature B of the widthwise middle portion. The various properties of the graphite film were evaluated. Further, a cambering property was also evaluated. The results are shown in Tables 9B, 10B, 11B, and 12B.

Example 21B

A graphite film was produced in the same manner as that described in Example 3B, except that in the sag controlling step, the maximum temperature in a heat treatment apparatus was changed to 555° C., the length of the furnace and the line speed were adjusted so that the temperature rise rate was 80° C. per minute, and a linear temperature gradient was given to a polymer film widthwise so that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

Example 22B

A graphite film was produced in the same manner as that described in Example 3B, except that in the sag controlling step, the maximum temperature in a heat treatment apparatus was changed to 605° C., the length of the furnace and the line speed were adjusted so that the temperature rise rate was 80° C. per minute, and a linear temperature gradient along the widthwise direction was such that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

Example 23B

A graphite film was produced in the same manner as that described in Example 3B, except that in the sag controlling step, the maximum temperature in a heat treatment apparatus was changed to 630° C., the length of the furnace and the line speed were adjusted so that the temperature rise rate was 80° C. per minute, and a linear temperature gradient along the widthwise direction was such that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

Example 24B

A graphite film was produced in the same manner as that described in Example 3B, except that in the sag controlling step, the maximum temperature in a heat treatment apparatus was changed to 655° C., the length of the furnace and the line speed were adjusted so that the temperature rise rate was 80° C. per minute, and a linear temperature gradient along the widthwise direction was such that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

Example 25B

A graphite film was produced in the same manner as that described in Example 1B, except that a linear temperature gradient along the widthwise direction was such that a temperature B of a widthwise middle portion of the polymer film was 0.25° C. higher than a temperature C of one widthwise end of the polymer film and a temperature A of the other widthwise end of the polymer film was 0.25° C. higher than the temperature B of the widthwise middle portion. The various properties of the graphite film were evaluated. Further, a cambering property was also evaluated. The results are shown in Tables 9B, 10B, 11B, and 12B.

Comparative Example 6B

A graphite film was produced in the same manner as that described in Comparative Example 2B, except that a linear temperature gradient along the widthwise direction was such that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

Comparative Example 7B

A graphite film was produced in the same manner as that described in Comparative Example 3B, except that a linear temperature gradient along the widthwise direction was such that a temperature B of a widthwise middle portion of the polymer film was 2.5° C. higher than a temperature C of one widthwise end of the polymer film and a temperature A of the other widthwise end of the polymer film was 2.5° C. higher than the temperature B of the widthwise middle portion. The various properties of the graphite film were evaluated. Further, a cambering property was also evaluated. The results are shown in Tables 9B, 10B, 11B, and 12B.

TABLE 9B

| | Raw Material Film | | | |
|---|---|---|---|---|
| | Type | Birefringence | Thickness μm | Width mm | Length m |
| Example 16B | NPI | 0.14 | 75 | 200 | 10 |
| Example 17B | NPI | 0.14 | 75 | 200 | 10 |
| Example 18B | NPI | 0.14 | 75 | 200 | 10 |

TABLE 9B-continued

| | Raw Material Film | | | | |
|---|---|---|---|---|---|
| | Type | Birefringence | Thickness μm | Width mm | Length m |
| Example 19B | NPI | 0.14 | 75 | 200 | 10 |
| Example 20B | NPI | 0.14 | 75 | 200 | 10 |
| Example 21B | NPI | 0.14 | 75 | 200 | 10 |
| Example 22B | NPI | 0.14 | 75 | 200 | 10 |
| Example 23B | NPI | 0.14 | 75 | 200 | 10 |
| Example 24B | NPI | 0.14 | 75 | 200 | 10 |
| Example 25B | NPI | 0.14 | 75 | 200 | 10 |
| Comparative Example 1B | NPI | 0.14 | 75 | 200 | 10 |
| Comparative Example 6B | NPI | 0.14 | 75 | 200 | 10 |
| Comparative Example 7B | NPI | 0.14 | 75 | 200 | 10 |

TABLE 10B

| | | Sag Controlling Step | | | | | | | |
|---|---|---|---|---|---|---|---|---|---|
| | | Starting Temp of Thermal Decomposition | | | Sag Controlling Temp | | | Temp Gradient between Temp A and Temp C | |
| | | Temp A | Temp B | Temp C | Temp A | Temp B | Temp C | Max | Min |
| | Method | ° C. | | | ° C. | | | ° C./m | |
| Example 16B | CLFPM*1 | 500.5 | 500 | 499.5 | 580.5 | 580 | 579.5 | −5 | −5 |
| Example 17B | CLFPM*1 | 501.5 | 500 | 498.5 | 581.5 | 580 | 578.5 | −15 | −15 |
| Example 18B | CLFPM*1 | 502.5 | 500 | 497.5 | 582.5 | 580 | 577.5 | −25 | −25 |
| Example 19B | CLFPM*1 | 505 | 500 | 495 | 585 | 580 | 575 | −50 | −50 |
| Example 20B | CLFPM*1 | 510 | 500 | 490 | 590 | 580 | 570 | −100 | −100 |
| Example 21B | CLFPM*1 | 502.5 | 500 | 497.5 | 557.5 | 555 | 552.5 | −25 | −25 |
| Example 22B | CLFPM*1 | 502.5 | 500 | 497.5 | 607.5 | 605 | 602.5 | −25 | −25 |
| Example 23B | CLFPM*1 | 502.5 | 500 | 497.5 | 632.5 | 630 | 627.5 | −25 | −25 |
| Example 24B | CLFPM*1 | 502.5 | 500 | 497.5 | 657.5 | 655 | 652.5 | −25 | −25 |
| Example 25B | CLFPM*1 | 500.25 | 500 | 499.75 | 580.25 | 580 | 579.75 | −2.5 | −2.5 |
| Comparative Example 1B | | Not Carried Out | | | | | | | |
| Comparative Example 6B | CLFPM*1 | 657.5 | 655 | 652.5 | 1402.5 | 1400 | 1397.5 | −25 | −25 |
| Comparative Example 7B | CLFPM*1 | 302.5 | 300 | 297.5 | 402.5 | 400 | 397.5 | −25 | −25 |

| | Sag Controlling Step | | | | |
|---|---|---|---|---|---|
| | Max Temp in Heat Treatment | Number of Measurement Positions | Number of Measurement Positions Satisfying Conditions | Pulling Strength kgf/cm2 | Load g/cm2 | Temp Rise Rate ° C./min |
| Example 16B | 580 | 4 | 4 | 30 | 2 | 80 |
| Example 17B | 580 | 4 | 4 | 30 | 2 | 80 |
| Example 18B | 580 | 4 | 4 | 30 | 2 | 80 |
| Example 19B | 580 | 4 | 4 | 30 | 2 | 80 |
| Example 20B | 580 | 4 | 4 | 30 | 2 | 80 |
| Example 21B | 555 | 3 | 3 | 30 | 2 | 80 |
| Example 22B | 605 | 5 | 5 | 30 | 2 | 80 |
| Example 23B | 630 | 6 | 6 | 30 | 2 | 80 |
| Example 24B | 655 | 7 | 7 | 30 | 2 | 80 |
| Example 25B | 580 | 4 | 4 | 30 | 2 | 80 |
| Comparative Example 1B | | Not Carried Out | | | | |
| Comparative Example 6B | 1400 | 4 | 4 | 30 | 2 | 80 |
| Comparative Example 7B | 400 | 4 | 4 | 30 | 2 | 80 |

*1"CLFPM" stands for "continuous long film processing method".

TABLE 11B

| | Cracking (Paper Tube Wrap-around Test) | Weight Retention Rate % | Weight Loss Rate % | Total Transmittance % | Carbonization Step | | | | Graphitization Step | | |
|---|---|---|---|---|---|---|---|---|---|---|---|
| | | | | | Method of Setting | Max Temp °C. | Widthwise Temp Difference of Film °C. | Temp Rise Rate °C./min | Method of Setting | Max Temp °C. | Temp Rise Rate °C./min |
| | Physical Properties of Film After Sag Controlling Step | | | | | | | | | | |
| Example 16B | A | 97.2 | 2.8 | 0.20 | Cylindrical Roll | 1400 | 0 | 2 | Cylindrical Roll | 2900 | 0.5 |
| Example 17B | A | 97.2 | 2.8 | 0.20 | Cylindrical Roll | 1400 | 0 | 2 | Cylindrical Roll | 2900 | 0.5 |
| Example 18B | A | 97.2 | 2.8 | 0.20 | Cylindrical Roll | 1400 | 0 | 2 | Cylindrical Roll | 2900 | 0.5 |
| Example 19B | A | 97.2 | 2.8 | 0.20 | Cylindrical Roll | 1400 | 0 | 2 | Cylindrical Roll | 2900 | 0.5 |
| Example 20B | A | 97.2 | 2.8 | 0.20 | Cylindrical Roll | 1400 | 0 | 2 | Cylindrical Roll | 2900 | 0.5 |
| Example 21B | A | 98.8 | 1.2 | 5.50 | Cylindrical Roll | 1400 | 0 | 2 | Cylindrical Roll | 2900 | 0.5 |
| Example 22B | A | 90.0 | 10.0 | 0.03 | Cylindrical Roll | 1400 | 0 | 2 | Cylindrical Roll | 2900 | 0.5 |
| Example 23B | B | 85.0 | 15.0 | — | Cylindrical Roll | 1400 | 0 | 2 | Cylindrical Roll | 2900 | 0.5 |
| Example 24B | C | 80.0 | 20.0 | — | Cylindrical Roll | 1400 | 0 | 2 | Cylindrical Roll | 2900 | 0.5 |
| Example 25B | A | 97.2 | 2.8 | 0.20 | Cylindrical Roll | 1400 | 0 | 2 | Cylindrical Roll | 2900 | 0.5 |
| Comparative Example 1B | No Sag Controlling Step | | | | Cylindrical Roll | 1400 | 0 | 2 | Cylindrical Roll | 2900 | 0.5 |
| Comparative Example 6B | E | 97.2 | 2.8 | 0.20 | Cylindrical Roll | 1400 | 0 | 2 | Cylindrical Roll | 2900 | 0.5 |
| Comparative Example 7B | E | 97.2 | 2.8 | 0.20 | Cylindrical Roll | 1400 | 0 | 2 | Cylindrical Roll | 2900 | 0.5 |

TABLE 12B

Physical Properties of Graphitized Film

| | Sag Reproducibility | Sag Zgs | | Sag of End at Temp A | | Sag of End at Temp C | | b-Value | | Camber | | Evaluation of Rolling Property | Evaluation of Lamination Property to Copper Foil | Evaluation of Cambering Property |
|---|---|---|---|---|---|---|---|---|---|---|---|---|---|---|
| | | Max mm | Min mm | Max mm | Min mm | Max mm | Min mm | Max mm | Min mm | Max mm | Min mm | | | |
| Example 16B | A | 10 | 9 | 10 | 9 | 0 | 0 | 5 | 5 | 14 | 13 | C | C | C |
| Example 17B | A | 30 | 28 | 30 | 28 | 0 | 0 | 15 | 15 | 16 | 14 | D | D | C |
| Example 18B | A | 40 | 38 | 40 | 38 | 0 | 0 | 20 | 20 | 20 | 19 | E | E | B |
| Example 19B | A | 70 | 65 | 70 | 65 | 0 | 0 | 35 | 34 | 30 | 28 | E | E | A |
| Example 20B | A | 90 | 85 | 90 | 85 | 0 | 0 | 45 | 45 | 40 | 35 | E | E | A |
| Example 21B | B | 30 | 20 | 30 | 20 | 0 | 0 | 10 | 9 | 18 | 14 | D | D | B |
| Example 22B | A | 45 | 43 | 45 | 43 | 0 | 0 | 21 | 21 | 23 | 22 | E | E | A |
| Example 23B | A | 48 | 45 | 48 | 45 | 0 | 0 | 23 | 23 | 25 | 24 | E | E | A |
| Example 24B | A | 50 | 48 | 50 | 48 | 0 | 0 | 24 | 23 | 27 | 26 | E | E | A |
| Example 25B | A | 5 | 5 | 5 | 5 | 0 | 0 | 2 | 2 | 11 | 11 | C | C | D |
| Comparative Example 1B | E | 140 | 50 | 100 | 0 | 100 | 0 | 50 | 0 | 10 | <2 | A-E | E | C-E |
| Comparative Example 6B | E | 135 | 45 | 100 | 0 | 100 | 0 | 45 | 0 | 10 | <2 | A-E | E | C-E |
| Comparative Example 7B | E | 140 | 50 | 100 | 0 | 100 | 0 | 50 | 0 | 10 | <2 | A-E | E | C-E |

<Sag Controlling Step>

A comparison was made between Examples 1B through 25B including the sag controlling step and Comparative Example 1B including no sag controlling step. The graphite film of Comparative Example 1B including no sag controlling step had a poor sag reproducibility rated as "E" and had varying depths of sag. The graphite film of Comparative Example 1B also had a poor lamination property to copper foil tape, which was also rated as "E". Further, in regard to each of the rolling property and the cambering property, the worst evaluation value of the five (n=5) evaluations was also E.

On the other hand, the graphite films of Examples 1B through 25B including the sag controlling step each had the sag reproducibility rated as "A" or "B". As is clear from this, the sag was controlled in Examples 1B through 25B.

<Sag Controlling Temperature>
1) Regarding Graphite Films Having Sag in Middle Portion A comparison was made among Examples 3B, and 6B through 9B having respectively different sag controlling temperature conditions. The higher the sag controlling temperature, the deeper the sag in the widthwise middle portion.

In Comparative Examples 2B and 3B in which a treatment similar to that in the sag controlling step was carried out at a temperature outside the temperature range from the starting temperature of thermal decomposition to the sag controlling temperature, the graphite films each had a poor sag reproducibility as in Comparative Example 1B including no sag controlling step. As is clear from this, the sag was not controlled in Comparative Examples 2B and 3B.

2) Flat Graphite Film Having No Sag

A comparison was made among Examples 11B through 15B having respectively different sag controlling temperature conditions. The higher the sag controlling temperature became, the flatter a graphite film obtained was.

In Comparative Examples 4B and 5B in which a treatment similar to that in the sag controlling step was carried out at a temperature outside the temperature range from the starting temperature of thermal decomposition to the sag controlling temperature, the graphite films each had a poor sag reproducibility as in Comparative Example 1B including no sag controlling step. As is clear from this, the sag was not controlled in Comparative Examples 4B and 5B.

3) Graphite Film Having Sag at One Widthwise End

A comparison was made among Examples 18B, and 21B through 24B having respectively different sag control temperature conditions. The higher the sag controlling temperature became, the deeper the sag of a graphite film obtained at one widthwise end was.

In Comparative Examples 6B and 7B in which a treatment similar to that in the sag controlling step was carried out at a temperature outside the temperature range from the starting temperature of thermal decomposition to the sag controlling temperature, the graphite films each had a poor sag reproducibility as in Comparative Example 1B including no sag controlling step. As is clear from this, the sag was not controlled in Comparative Examples 6B and 7B.

<Temperature Gradient>
1) Regarding Graphite Films Having Sag in Middle Portion

A comparison was made among Examples 1B through 5B and 10B having respectively different sag controlling temperature conditions. In Examples 1B through 5B and 10B in which a temperature gradient over an area extending from both widthwise ends toward the widthwise middle portion was not more than −2.5° C./m, all the graphite films had sag in the widthwise middle portion. The smaller the temperature gradient became, the deeper the sag became.

3) Graphite Film Having Sag at One Widthwise End

A comparison was made among Examples 16B through 20B and 25B having respectively different sag controlling temperature conditions. In Examples 16B through 20B and 25B having a temperature gradient of not less than 2.5° C./m from the temperature A to the temperature C, all the graphite films had sag in the widthwise middle portion. The larger the temperature gradient became, the deeper the sag became.

Example 26B

A graphite film was produced in the same manner as that described in Example 1B, except that Apical AH manufactured by Kaneka Corporation, having a birefringence of 0.10, a thickness of 75 µm, a width of 200 mm, and a length of 10 m was employed as a polymer film. The various properties of the graphite film were evaluated. Table 13B shows the polymer film (raw material film) employed in Example 26B and Tables 14B, 15B and 16B show steps, results, etc.

Example 27B

A graphite film was produced in the same manner as that described in Example 1B, except that Kapton H manufactured by Du Pont-Toray Co., Ltd., having a birefringence of 0.12, a thickness of 75 µm, a width of 200 mm, and a length of 10 m was employed as a polymer film. The various properties of the graphite film were evaluated. Table 13B shows the polymer film (raw material film) employed in Example 27B and Tables 14B, 15B and 16B show steps, results, etc.

Example 28B

A graphite film was produced in the same manner as that described in Example 1B, except that POD (polyparaphenylene oxadiazole) having a birefringence of 0.12, a thickness of 75 µm, a width of 200 mm, and a length of 10 m was employed as a polymer film. The various properties of the graphite film were evaluated. Table 13B shows the polymer film (raw material film) employed in Example 28B and Tables 14B, 15B and 16B show steps, results, etc.

Example 28B showed that the sag control technique of the present invention can be applied to a polymer other than a polyimide film without any problem.

Example 29B

A graphite film was produced in the same manner as that described in Example 1B, except that Apical NPI, which is a polyimide film manufactured by Kaneka Corporation, having a thickness of 50 µm was employed as a polymer film. The various properties of the graphite film were evaluated. Table 13B shows the polymer film (raw material film) employed in Example 29B and Tables 14B, 15B and 16B show steps, results, etc.

Example 30B

A graphite film was produced in the same manner as that described in Example 1B, except that Apical NPI, that is a polyimide film manufactured by Kaneka Corporation, having a thickness of 125 µm was employed as a polymer film. The various properties of the graphite film were evaluated. Table 13B shows the polymer film (raw material film) employed in Example 30B and Tables 14B, 15B and 16B show steps, results, etc.

The above results showed that the smaller the thickness of the polymer film becomes, the shallower the sag becomes, and that sag reproducibility is improved. The above results also showed that when the thickness of the polymer film is in a range of 50 µm to 125 µm, the sag technique of the present invention can be applied without any problem.

Example 31B

A graphite film was produced in the same manner as that described in Example 1B, except that Apical NPI, which is a polyimide film manufactured by Kaneka Corporation, having a width of 50 mm was employed as a polymer film. The various properties of the graphite film were evaluated.

Table 13B shows the polymer film (raw material film) employed in Example 31B and Tables 14B, 15B and 16B show steps, results, etc.

Example 32B

A graphite film was produced in the same manner as that described in Example 1B, except that Apical NPI, which is a polyimide film manufactured by Kaneka Corporation, having a width of 300 mm was employed as a polymer film. The various properties of the graphite film were evaluated. Table 13B shows the polymer film (raw material film) employed in Example 32B and Tables 14B, 15B and 16B show steps, results, etc.

The above results showed that a smaller width results in a shallower sag. The above results also showed that when the polymer film has a width in a range of 50 mm to 300 mm, the sag control technique can be applied without any problem.

Example 33B

A graphite film was produced in the same manner as that described in Example 1B, except that the carbonization step was omitted. The various properties of the graphite film were evaluated. Table 13B shows the polymer film (raw material film) employed in Example 33B and Tables 14B, 15B and 16B show steps, results, etc.

The results showed that even in a case where the carbonization step is not carried out, the sag control technique of the present invention can be applied without any problem.

Note that though Examples 26B through 33B above are based on the technique according to the second embodiment of the present invention, the same applies to other sag control technique according to the first embodiment of the present invention in regard to a point that the polymer film is not limited to a polyimide film, a thickness of the polymer film, a width of the polymer film, and the presence/absence of the carbonization step.

TABLE 13B

| | Raw Material Film | | | | |
|---|---|---|---|---|---|
| | Type | Birefringence | Thickness μm | Width mm | Length m |
| Example 26B | AH | 0.10 | 75 | 200 | 10 |
| Example 27B | KAPTON H | 0.12 | 75 | 200 | 10 |
| Example 28B | POD | 0.90 | 75 | 200 | 10 |
| Example 29B | NPI | 0.14 | 50 | 200 | 10 |
| Example 30B | NPI | 0.14 | 125 | 200 | 10 |
| Example 31B | NPI | 0.14 | 75 | 50 | 10 |
| Example 32B | NPI | 0.14 | 75 | 300 | 10 |
| Example 33B | NPI | 0.14 | 75 | 200 | 10 |

TABLE 14B

| | | Sag Controlling Step | | | | | | | |
|---|---|---|---|---|---|---|---|---|---|
| | | Starting Temp of Thermal Decomposition | | | Sag Controlling Temp | | | Temp Gradient between Each End and Middle Portion | |
| | | End 1 | Middle | End 2 | End 1 | Middle | End 2 | Max | Min |
| | Method | ° C. | | | ° C. | | | ° C./m | |
| Example 26B | CLFPM*1 | 495 | 500 | 495 | 575 | 580 | 575 | −25 | −25 |
| Example 27B | CLFPM*1 | 495 | 500 | 495 | 575 | 580 | 575 | −25 | −25 |
| Example 28B | CLFPM*1 | 495 | 500 | 495 | 575 | 580 | 575 | −25 | −25 |
| Example 29B | CLFPM*1 | 495 | 500 | 495 | 575 | 580 | 575 | −25 | −25 |
| Example 30B | CLFPM*1 | 495 | 500 | 495 | 575 | 580 | 575 | −25 | −25 |
| Example 31B | CLFPM*1 | 495 | 500 | 495 | 575 | 580 | 575 | −25 | −25 |
| Example 32B | CLFPM*1 | 495 | 500 | 495 | 575 | 580 | 575 | −25 | −25 |
| Example 33B | CLFPM*1 | 495 | 500 | 495 | 575 | 580 | 575 | −25 | −25 |

| | Sag Controlling Step | | | | |
|---|---|---|---|---|---|
| | Max Temp in Heat Treatment | Number of Measurement Positions | Number of Measurement Positions Satisfying Conditions | Pulling Strength kgf/cm2 | Load g/cm2 | Temp Rise Rate ° C./min |
| Example 26B | 580 | 4 | 4 | 30 | 2 | 80 |
| Example 27B | 580 | 4 | 4 | 30 | 2 | 80 |
| Example 28B | 580 | 4 | 4 | 30 | 2 | 80 |
| Example 29B | 580 | 4 | 4 | 30 | 2 | 80 |
| Example 30B | 580 | 4 | 4 | 30 | 2 | 80 |
| Example 31B | 580 | 4 | 4 | 30 | 2 | 80 |
| Example 32B | 580 | 4 | 4 | 30 | 2 | 80 |
| Example 33B | 580 | 4 | 4 | 30 | 2 | 80 |

*1"CLFPM" stands for "continuous long film processing method".

TABLE 15B

Physical Properties of Film After Sag Controlling Step

| | Cracking (Paper Tube Wrap-around Test) | Weight Retention Rate % | Weight Loss Rate % | Total Transmittance % | Carbonization Step | | | Graphitization Step | | |
|---|---|---|---|---|---|---|---|---|---|---|
| | | | | | Method of Setting | Max Temp °C. | Widthwise Temp Difference of Film °C. | Temp Rise Rate °C./min | Method of Setting | Max Temp °C. | Temp Rise Rate °C./min |
| Example 26B | A | 97.2 | 2.8 | 0.20 | Cylindrical Roll | 1400 | 0 | 2 | Cylindrical Roll | 2900 | 0.5 |
| Example 27B | A | 97.0 | 3.0 | 0.20 | Cylindrical Roll | 1400 | 0 | 2 | Cylindrical Roll | 2900 | 0.5 |
| Example 28B | A | 95.2 | 4.8 | 0.20 | Cylindrical Roll | 1400 | 0 | 2 | Cylindrical Roll | 2900 | 0.5 |
| Example 29B | A | 97.2 | 2.8 | 0.20 | Cylindrical Roll | 1400 | 0 | 2 | Cylindrical Roll | 2900 | 0.5 |
| Example 30B | A | 97.2 | 2.8 | 0.20 | Cylindrical Roll | 1400 | 0 | 2 | Cylindrical Roll | 2900 | 0.5 |
| Example 31B | A | 97.2 | 2.8 | 0.20 | Cylindrical Roll | 1400 | 0 | 2 | Cylindrical Roll | 2900 | 0.5 |
| Example 32B | A | 97.2 | 2.8 | 0.20 | Cylindrical Roll | 1400 | 0 | 2 | Cylindrical Roll | 2900 | 0.5 |
| Example 33B | A | 97.2 | 2.8 | 0.20 | Not Carried Out | | | | Cylindrical Roll | 2900 | 0.5 |

TABLE 16B

Physical Properties of Graphitized Film

| | Sag Reproducibility | Sag Zgs Max mm | Sag Zgs Min mm | a-Value Max mm | a-Value Min mm | b-Value Max mm | b-Value Min mm | Camber Max mm | Camber Min mm | Evaluation of Rolling Property | Evaluation of Lamination Property to Copper Foil |
|---|---|---|---|---|---|---|---|---|---|---|---|
| Example 26B | A | 42 | 38 | 0 | 0 | 42 | 38 | <2 | <2 | A | D |
| Example 27B | A | 42 | 37 | 0 | 0 | 42 | 37 | <2 | <2 | A | D |
| Example 28B | A | 45 | 36 | 0 | 0 | 45 | 36 | <2 | <2 | A | D |
| Example 29B | A | 38 | 37 | 0 | 0 | 38 | 37 | <2 | <2 | A | D |
| Example 30B | A | 41 | 34 | 0 | 0 | 41 | 34 | <2 | <2 | A | D |
| Example 31B | A | 20 | 19 | 0 | 0 | 20 | 19 | <2 | <2 | A | B |
| Example 32B | A | 60 | 55 | 0 | 0 | 60 | 55 | <2 | <2 | B | D |
| Example 33B | A | 40 | 32 | 0 | 0 | 40 | 32 | <2 | <2 | A | D |

Examples C According to Third Embodiment

The following discusses conditions for measuring various physical properties in Examples C. Here, discussion of the conditions identical to those of Examples A according to the first embodiment and Examples B according to the second embodiment discussed above are omitted, and only conditions different from those of Examples A and B are discussed.

<Conditions for Measuring Various Physical Properties>

<Sag Measurement (as Specified by JIS C2151) of Raw Graphite Film and Graphite Film)>

Flatness of a raw graphite film and a graphite film was evaluated by sag measurement in accordance with film windability evaluation as specified by JIS C2151. A depth of sag was measured at a room temperature (23° C.).

(Test Piece) A fresh test piece having a length of approximately 2 m drawn from a roll is employed. In this process, the test piece is taken from around the center of a wound roll of film. More specifically, in the case of a roll of 100 m, three test pieces are taken from around 50 m away from the roll end. A sheet sample such as a sheet sample in Example 14C, from which three test pieces cannot be taken, is directly employed as a test piece and measurement is carried out only once.

Figure 31:
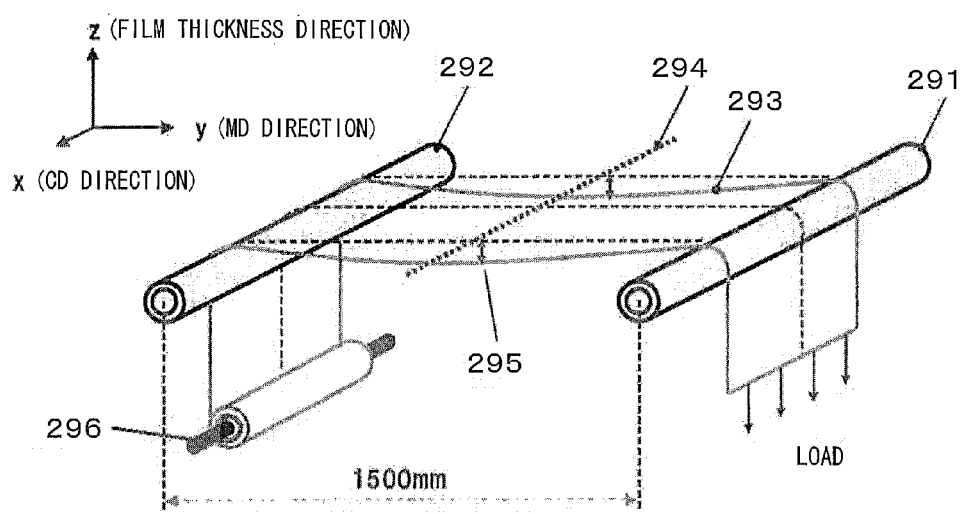
FIG. 31 is a schematic view showing sag measurement described in JIS C2151.
Figure 31:
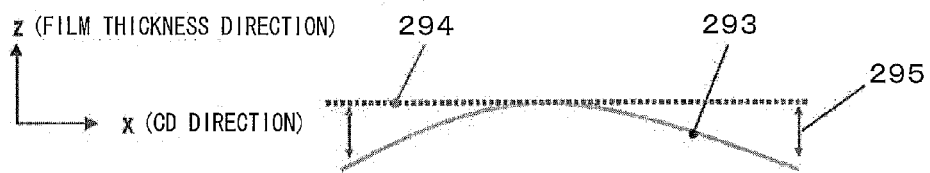
Figure 32:
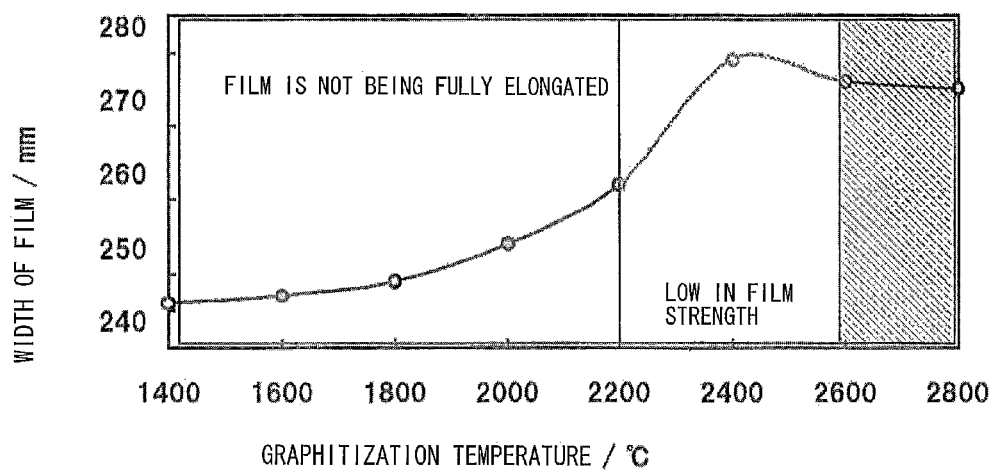
FIG. 32 shows an irreversible elongation of a film in a graphitization step.

(Apparatuses) The following describes apparatuses employed in Examples C (FIG. 31).

a) Mount Equipped with Rolls

A basic arrangement is the same as the one described above and illustrated in FIG. 2, and the explanation thereof is omitted. However, an arrangement here is different from the one illustrated in FIG. 2, in that a device (detachable shaft), like the one labeled 296 in FIG. 31, for placing a film roll to be tested is attached to the mount. A position where the device is attached to the mount is right below one roll (first roll). This device is arranged such that 1) the detachable shaft on which the film is placed is in parallel to the axis of the first roll within 1 degree and 2) a position of a lateral part of the film can be freely adjusted.

b) Device for Applying Tensile Force to Film

A basic arrangement is the same as the one described above and illustrated in FIG. 2 and the explanation thereof is omitted.

c) Tools for Measuring Dimension

A basic arrangement is the same as the one described above and illustrated in FIG. 2 and the explanation thereof is omitted.

(Measurement Procedure) A basic procedure is the same as that of Examples A described above.

(Results) The deepest sag value for each test piece was defined as sag Zgs, and a median of three measured values was taken. For a sheet sample, a result of one measurement was put in Tables 1C and 2C.

<Measurement of Thermal Diffusivity of Raw Graphite Film and Graphite Film in Direction Parallel to Film Surface>

Figure 33:
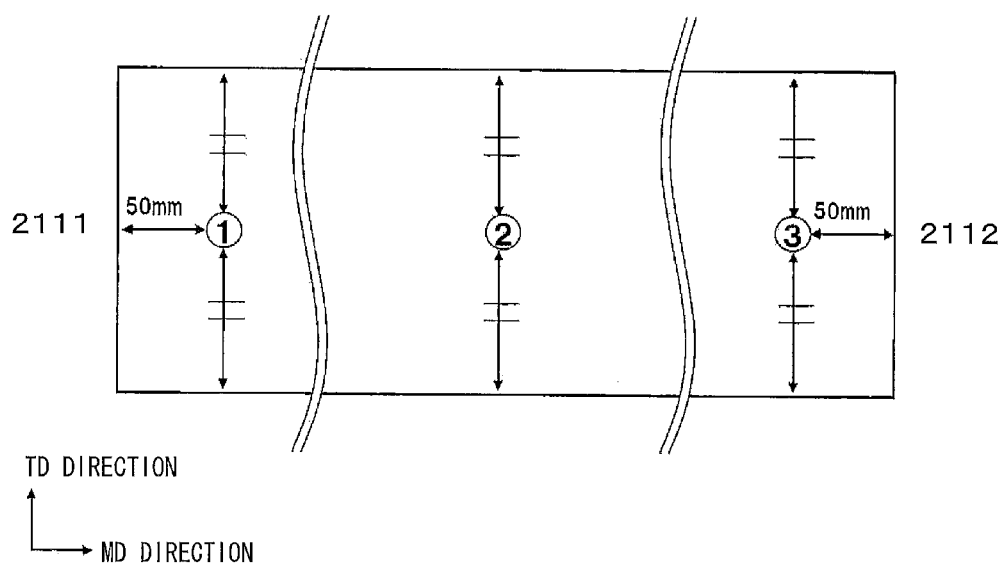
FIG. 33 shows points from which samples of a graphite film are collected for the measurement of thermal diffusivities of the samples.

A thermal diffusivity of the raw graphite film and the graphite film in a direction parallel to each film surface was measured by using an AC calorimeter Method Thermal Constant Analyzer ("LaserPIT" manufactured by ULVAC-RIKO, Inc.). In this measurement, each sample prepared by cutting a 4 mm×40 mm piece from the graphite film was measured at 10 Hz in an atmosphere of 23° C. From each of the raw graphite film and the graphite film, three test pieces were taken from points 1, 2, and 3 in FIG. 33. The point 1 is located at a position around the middle of each of the raw graphite film and the graphite film and 50 mm away from a roll start of each of the films. The point 3 is located at a position around the middle of each of the raw graphite film and the graphite film and 50 mm away from a roll end of each of the films. The point 2 is located at a midpoint between the points 1 and 3. In the case of a roll having a TD width of 200 mm, the term "the position around the middle" refers to a position around 100 mm away from respective widthwise side edges. Note that three test pieces were similarly cut from a sheet sample. Tables 1C and 2C show an average value of thermal diffusivities measured by use of the three test pieces.

<Evaluation of Lamination Property to Copper Foil Tape>

Figure 34:
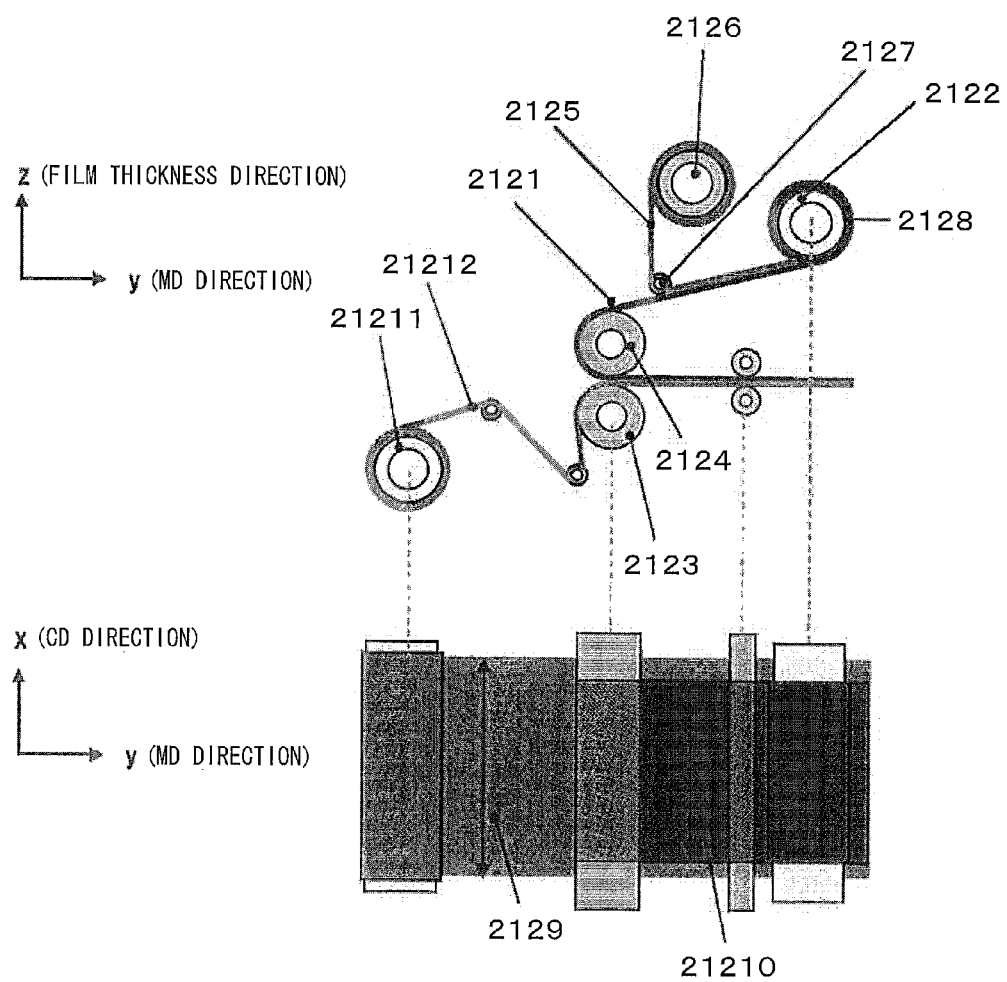
FIG. 34 is a schematic view of a test of laminating test.
Figure 35:
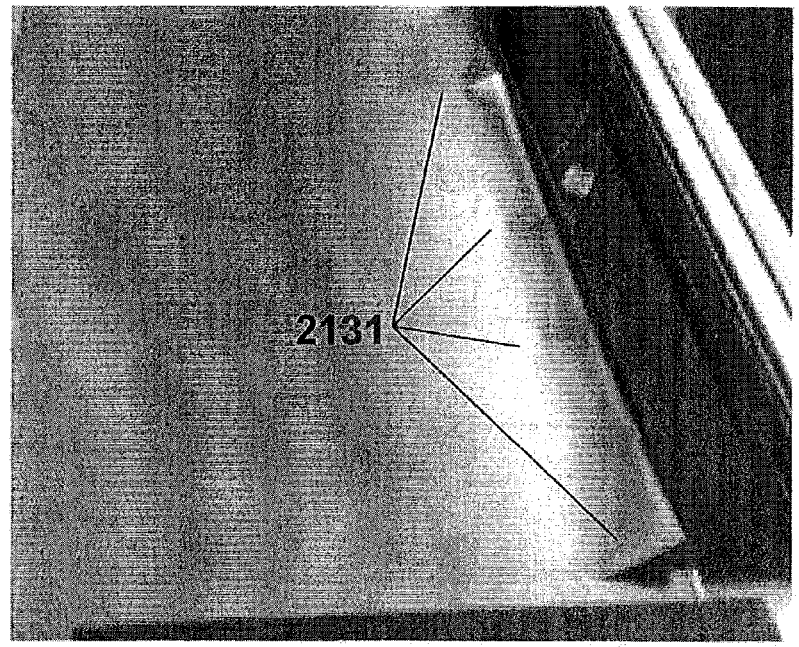
FIG. 35 shows tears of a graphite film.
Figure 36:
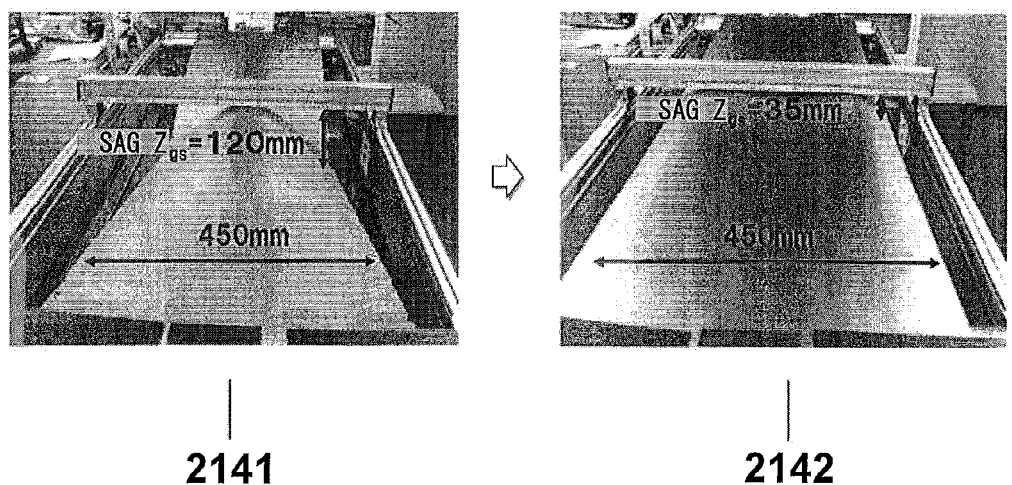
FIG. 36 is a view showing sags of the graphite films before and after having been subjected to the straightening process in Example 1C.
Figure 37:
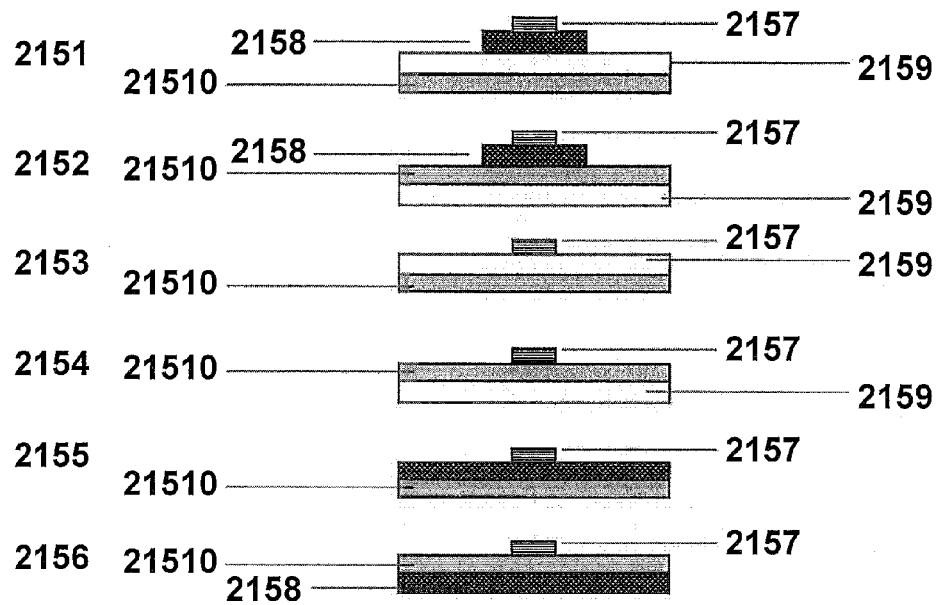
FIG. 37 shows an example of use of a graphite film according to the third embodiment of the present invention.

The laminating test as illustrated in FIG. 34 was carried out. More specifically, a graphite film wrapped around a 3-in. diameter paper tube was continuously supplied between a first roll and a second roll, which were provided in parallel with each other, each measuring 50 mm in external diameter and 635 mm in length, so that the graphite film was laminated to a copper foil tape measuring 10 μm in thickness and 430 mm in width. In this process, the graphite film was supplied such that an angle formed by a line connecting (the starting point of contact between the first roll and the graphite film) and (the center point of the first roll) and a line connecting (the center point of the first roll) and (the point of contact between the first roll and the second roll) was 120 degrees. The copper foil tape employed here was E-1100LC manufactured by DIC. This copper foil tape was supplied such that an angle formed by a line connecting (the starting point of contact between the second roll and the copper foil tape) and (the center point of the second roll) and a line connecting (the center point of the second roll) and (the point of contact between the first roll and the second roll) was 120 degrees. A tensile force to be applied in the MD direction of the graphite film was 30 g/cm, and the rewinding speed was 1 m per minute.

Figure 24:
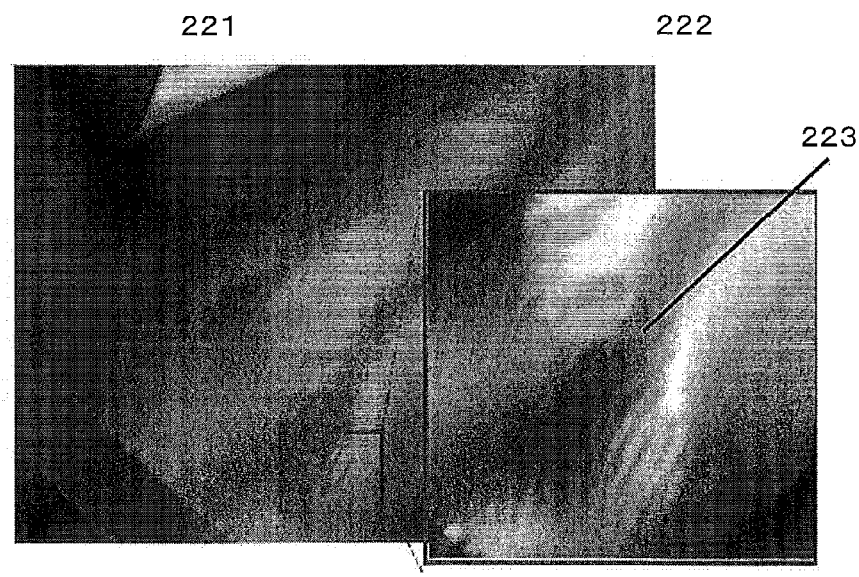
FIG. 24 is a photograph showing an appearance of laminating wrinkles with respect to copper foil tape.
Figure 25:
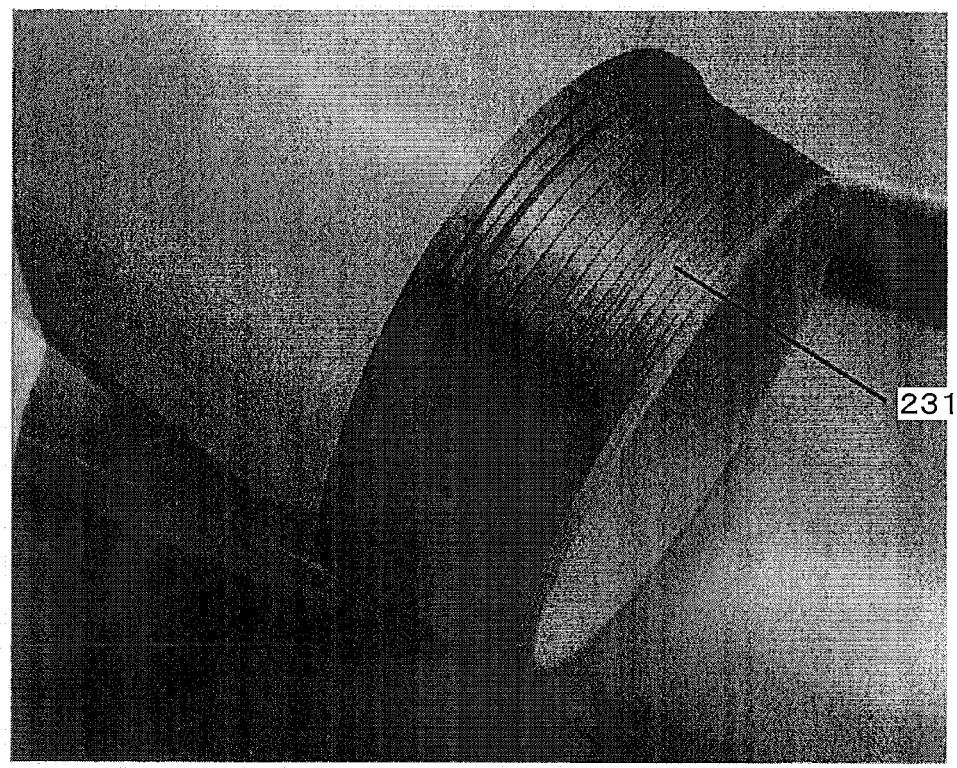
FIG. 25 is a photograph showing an appearance of winding deviation of a graphite film.

Wrinkles (as shown in FIG. 24) of the graphite films after the completion of the laminating test were evaluated as follows. Across the whole area of the roll, wrinkles of not less than 5 mm in length were counted and converted as the number of visible wrinkles across the width of the film (a width of the graphite film is 450 mm in the present Examples C, Comparative Examples C, and Reference Example C) per unit lengthwise length (1 m). The graphite composite films were rated as: "A" when the number of visible wrinkles across the width of the film per meter was 0; "B" when the number of visible wrinkles across the width of the film per meter was more than 0 and less than 0.05; "C" when the number of visible wrinkles across the width of the film per meter was not less than 0.05 and less than 0.2; "D" when the number of visible wrinkles across the width of the film per meter was not less than 0.2 and less than 1; and "E" when the number of visible wrinkles across the width of the film per meter was not less than 1.

<MIT Folding Endurance Test of Raw Graphite Film and Graphite Film>

A MIT folding endurance test of the raw graphite film and the graphite film was carried out. First, three test pieces of each of the films, having a size of 1.5 cm×10 cm, were cut from the points 1, 2, and 3 of FIG. 33. Then, the MIT folding endurance test was carried out by using MIT Type Folding Endurance Tester (Type D) manufactured by Toyo Seiki Seisaku-sho, Ltd. under the following conditions: a test load of 100 gf (0.98 N), a rate of 90 times per minute, and a folding clamp curvature radius (R) of 2 mm. In an atmosphere at 23° C., each of the test pieces was folded to the right and the left both at an angle of 135 degrees. The number of times of folding until the test piece was broken away was measured. As a result of measurement of the three test pieces, an average value was shown in Tables 1C and 2C.

<Method for Producing Polyimide Film A>

To a DMF (dimethylformamide) solution dissolving 1 equivalent of 4,4'-oxydianiline, 1 equivalent of pyromellitic dianhydride was dissolved to give a polyamic acid solution (18.5% by weight). While this solution was being cooled, 1 equivalent of acetic anhydride, 1 equivalent of isoquinoline, and an imidization catalyst including DMF relative to carboxylic acid groups included in the polyamic acid were added, and then the mixture was degassed.

The polyamic acid DMF solution prepared in the polymerization step was mixed with a curing agent (acetic anhydride and isoquinoline) in a given ratio by using a blender, and a resulting mixture was continuously flown from a T-die and applied onto an endless belt. Then, thus applied resulting mixture was dried up by hot air while the belt was rotated. When the above mixture varnish was heated, dehydration occurred in its molecules, and imidization reaction proceeded. A self-supporting film (gel film) having a remaining solvent ratio of approximately 46% at an exit of a belt chamber as a result of evaporation of the solvent was stripped from the belt, and fixed in a pin frame. The film was subjected to heat treatment for 4 minutes in total at temperatures in the range from 300° C. to 580° C. in a tenter chamber. Thereby, a polyamide film A having a thickness of 50 μm was produced. In the present study, a polyimide film (Product Name: Apical 200AV) manufactured by Kaneka Corporation was employed.

Example 1C

Figure 29:
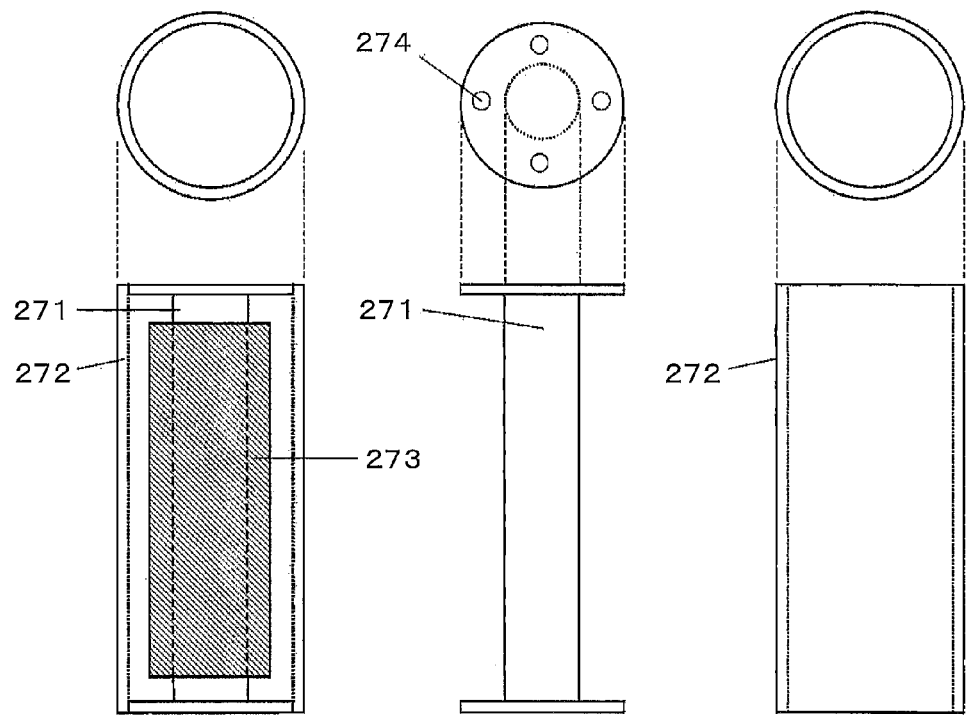
FIG. 29 shows a jig used in the carbonization process according to the third embodiment of the present invention.

The polyimide film A having a thickness of 50 μm, a width of 500 mm, and a length of 50 m was wrapped around a cylindrical graphite inner core having an external diameter of 100 mm and a length of 550 mm as illustrated in FIG. 29, and then covered with an external cylinder having an inner diameter of 130 mm. This cylinder container was transversely set in an electric furnace. Then, the carbonization step was carried out under a condition where the temperature was raised by 2° C. per minute up to 1400° C.

Figure 30:
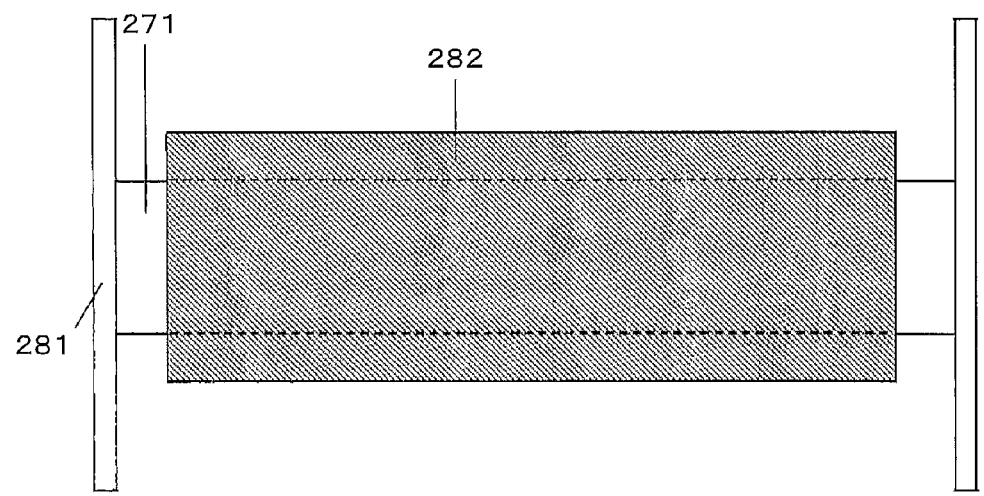
FIG. 30 is a container for performing a graphitization step in such a state that a film is arranged transversely.

Next, as shown in FIG. 30, thus obtained carbonized film in the form of a roll was set to an internal core having an external diameter of 100 mm and transversely in a graphitization furnace (at this time, the internal core is floated by an anchorage). The graphitization step was carried out under a condition where the temperature was raised by 5° C. per minute up to 2900° C. Then, the temperature was decreased to a room temperature. After the graphitization step, various physical properties of a raw graphite film were measured. Thus measured physical properties were shown in Tables 1C and 2C. Note that the graphite film that has not undergone the straightening process after the graphitization step is called a "raw graphite film".

The raw graphite film had a sag Zgs of 120 mm, a length of 45.0 m, and a width of 450 mm.

Then, thus obtained raw graphite was fixed to an inner core 1 by bonding with a double-faced tape produced by using a graphitized material (product number: MSG, linear expansion coefficient: $4.0 \times 10^{-6}$/K) available from SEC Carbon, Ltd., and then wound around the inner core 1 kept standing as illustrated in FIG. 28 so that a resultant roll had a leveled edge. The inner core 1 had a center circumference of 314.0000 mm and an end 1 circumference of 314.1338 mm, and an end 2 circumference of 314.1338 mm (the center circumference of the inner core 1 had a minimum value and the circumference of the inner core 1 gradually increased from the center circumference to the end 1 circumference and the end 2 circumference). Thereafter, while the outermost circumferential film of the raw graphite film was fixed not to move, the raw graphite film was tightened around the inner core by giving a torque of 4 N·m to a drive shaft. The rewinding step was carried out as described above.

Then, the raw graphite film tightened around the inner core was transversely placed and set in the graphitization furnace and the straightening-for-flatness process step was carried out under the condition where a temperature was raised by 5° C. per minute up to 2900° C. As a result, a graphite film thus obtained had a sag Zgs of 20.0 mm, a length of 45.0 m, and a width of 450 mm. Then, various physical properties of the graphite film were measured. The results of this measurement are shown in Tables 1C and 2C.

Example 2C

A graphite film was produced in the same manner as that described in Example 1C, except that the inner core 1 employed in Example 2C had a center circumference of 314.0000 mm and an end 1 circumference of 314.0336 mm, and an end 2 circumference of 314.0336 mm (the center circumference of the inner core 1 had a minimum value and the circumference of the inner core 1 gradually increased from the center circumference to the end 1 circumference and the end 2 circumference). As a result, thus obtained graphite film had a sag Zgs of 10.0 mm, a length of 45.0 m, and a width of 450 mm. Then, various physical properties of the graphite film were measured. The results of this measurement are shown in Tables 1C and 2C.

Example 3C

A graphite film was produced in the same manner as that described in Example 1C, except that the inner core 1 employed in Example 3C had a center circumference of 314.0000 mm and an end 1 circumference of 314.0085 mm, and an end 2 circumference of 314.0085 mm (the center circumference of the inner core 1 had a minimum value and the circumference of the inner core 1 gradually increased from the center circumference to the end 1 circumference and the end 2 circumference). As a result, thus obtained graphite film had a sag Zgs of 5.0 mm, a length of 45.0 m, and a width of 450 mm. Then, various physical properties of the graphite film were measured. The results of this measurement are shown in Tables 1C and 2C.

Example 4C

A graphite film was produced in the same manner as that described in Example 1C, except that the inner core 1 employed in Example 4C had a center circumference of 314.0000 mm and an end 1 circumference of 314.0019 mm, and an end 2 circumference of 314.0019 mm (the center circumference of the inner core 1 had a minimum value and the circumference of the inner core 1 gradually increased from the center circumference to the end 1 circumference and the end 2 circumference). As a result, thus obtained graphite film had a sag Zgs of 1.0 mm, a length of 45.0 m, and a width of 450 mm. Then, various physical properties of the graphite film were measured. The results of this measurement are shown in Tables 1C and 2C.

Example 5C

A graphite film was produced in the same manner as that described in Example 1C, except that the inner core 1 employed in Example 5C had a center circumference of 314.0000 mm and an end 1 circumference of 314.0000 mm, and an end 2 circumference of 314.0000 mm. As a result, thus obtained graphite film had a sag Zgs of 0.1 mm, a length of 45.0 m, and a width of 450 mm. Then, various physical properties of the graphite film were measured. The results of this measurement are shown in Tables 1C and 2C.

Comparative Example 1C

In the same manner as that in Example 1C, the carbonization step and the graphitization step were carried out. However, the wound film tightening step and the straightening-for-flatness process step were not carried out. As a result, thus obtained graphite film had a sag Zgs of 120 mm, a length of 45.0 m, and a width of 450 mm. Then, various physical properties of the graphite film were measured. The results of this measurement are shown in Tables 1C and 2C.

Comparative Example 2C

A graphite film was produced in the same manner as that described in Example 1C, except that the maximum temperature straightening-for-flatness process step was set at 1800° C. As a result, thus obtained graphite film had a sag Zgs of 120 mm, a length of 45.0 m, and a width of 450 mm. Then, various physical properties of the graphite film were measured. The results of this measurement are shown in Tables 1C and 2C.

Comparative Example 3C

A graphite film was produced in the same manner as that described in Example 1C, except that the inner core 1 employed in Comparative Example 3C had a center circumference of 314.0000 mm and an end 1 circumference of 319.3380 mm, and an end 2 circumference of 319.3380 mm.

As a result, thus obtained graphite film had a sag Zgs of 130 mm, a length of 45.0 m, and a width of 450 mm. Then, various physical properties of the graphite film were measured. The results of this measurement are shown in Tables 1C and 2C.

<Effects of Straightening-for-Flatness Process Step>

As shown in Tables 1C and 2C, sag could not be controlled in Comparative Example 1C where no straightening-for-flatness process was carried out. The graphite film obtained in Comparative Example 1C, had a sag Zgs of 120

TABLE 1C

| | Raw Graphite Film Properties | | | Conditions for Rewinding Step | | | | | | |
|---|---|---|---|---|---|---|---|---|---|---|
| | | | | | | Strength | Vertical | Inner Core 1 | | |
| | Sag Zgs mm | Thermal Diffusivity $cm^2/s$ | Length m | Sag Zgs mm | Torque N m | of Tight Winding N m/m | Winding or Lateral Winding | Type | Material | Linear Expansion $\times 10^{-6}/K$ |
| Example 1C | 120 | 8.300 | 45 | 120 | 4 | 220 | Vertical Winding | Cylinder | MSG | 4.00 |
| Example 2C | 120 | 8.300 | 45 | 120 | 4 | 220 | Vertical Winding | Cylinder | MSG | 4.00 |
| Example 3C | 120 | 8.300 | 45 | 120 | 4 | 220 | Vertical Winding | Cylinder | MSG | 4.00 |
| Example 4C | 120 | 8.300 | 45 | 120 | 4 | 220 | Vertical Winding | Cylinder | MSG | 4.00 |
| Example 5C | 120 | 8.300 | 45 | 120 | 4 | 220 | Vertical Winding | Cylinder | MSG | 4.00 |
| Comparative Example 1C | 120 | 8.300 | 45 | 120 | | | Not Carried Out | | | |
| Comparative Example 2C | 120 | 8.300 | 45 | 120 | 4 | 220 | Vertical Winding | Cylinder | MSG | 4.00 |
| Comparative Example 3C | 120 | 8.300 | 45 | 120 | 4 | 220 | Vertical Winding | Cylinder | MSG | 4.00 |

| | Conditions for Rewinding Step | | | | | | |
|---|---|---|---|---|---|---|---|
| | Inner Core 1 | | | | | | Vertically |
| | Center Circumference mm | End 1 Circumference mm | End 2 Circumference mm | Diameter Accuracy % | Starting Temp °C. | Max Temp °C. | Placed or Transversely Placed |
| Example 1C | 314.0000 | 314.1338 | 314.1338 | 0.0426 | 23 | 2900 | Transversely Placed |
| Example 2C | 314.0000 | 314.0336 | 314.0336 | 0.0107 | 23 | 2900 | Transversely Placed |
| Example 3C | 314.0000 | 314.0085 | 314.0085 | 0.0027 | 23 | 2900 | Transversely Placed |
| Example 4C | 314.0000 | 314.0019 | 314.0019 | 0.0006 | 23 | 2900 | Transversely Placed |
| Example 5C | 314.0000 | 314.0000 | 314.0000 | 0.0000 | 23 | 2900 | Transversely Placed |
| Comparative Example 1C | | | Not Carried Out | | | | |
| Comparative Example 2C | 314.0000 | 314.1338 | 314.1338 | 0.0426 | 23 | 1800 | Transversely Placed |
| Comparative Example 3C | 314.0000 | 319.3380 | 319.3380 | 1.7000 | 23 | 2900 | Transversely Placed |

TABLE 2C

| | Graphite Film Properties Inner Core 1 | | | | |
|---|---|---|---|---|---|
| | Sag Zgs mm | Length m | MIT Times | Thermal Diffusivity $cm^2/s$ | Lamination to Copper Foil |
| Example 1C | 20 | 45.0 | >10000 | 8.5 | C |
| Example 2C | 10 | 45.0 | >10000 | 8.5 | B |
| Example 3C | 5 | 45.0 | >10000 | 8.5 | A |
| Example 4C | 1 | 45.0 | >10000 | 8.5 | A |
| Example 5C | 0.1 | 45.0 | >10000 | 8.5 | A |
| Comparative Example 1C | 120 | 45.0 | >10000 | 8.3 | E |
| Comparative Example 2C | 120 | 45.0 | >10000 | 8.3 | E |
| Comparative Example 3C | 130 | 45.0 | >10000 | 8.5 | E | mm. On the other hand, in each of Examples 1C through 5C where the sag controlling step was carried out, the graphite film obtained was excellent in flatness and had a sag Zgs of not more than 20 mm. This is because the raw graphite film was pushed outward by the inner core in the process of heat treatment due to difference in thermal expansion coefficient between the inner core and the raw graphite film wound around the inner core and thereby the film was flattened. Further, as diameter accuracy of the inner core was increased, a sag Zgs became shallower. Accordingly, in each of Examples 4C and 5C, a very flat graphite film having a sag Zgs of not more than 1 mm could be obtained. On the other hand, in Comparative Example 3C where the inner core had a poor diameter accuracy of 1.7% in diameter, the graphite film obtained had a very deep sag, that is, a sag Zgs of 130 mm. The graphite film of Comparative Example 1C had many laminating wrinkles and had a very poor evaluation that was E in the evaluation of the lamination property to the copper foil tape. On the other hand, the flat graphite films of Examples 1C through 5C were excellent in the evaluation of the lamination property to the copper foil tape and each had an excellent evaluation that was C or higher. In particular, the flat graphite films of Examples 3C through 5C had very few laminating wrinkles and had an excellent evaluation that was A.

<Maximum Temperature in Straightening-for-Flatness Process Step>

A comparison between Example 1C and Comparative Example 2C revealed that when the maximum temperature in the straightening-for-flatness process step was higher, sag could be controlled more. This result is because the higher maximum temperature of the straightening-for-flatness process step results in larger difference in amount of expansion between the inner core and the raw graphite film wrapped around the inner core and thereby the graphite film was straightened more. The above result is obtained also because the higher temperature causes more active realignment of graphite crystallites.

INDUSTRIAL APPLICABILITY

According to the present invention, it is possible to obtain a graphite film with controlled sagging or a graphite film excellent in flatness. The present invention is therefore applicable to, for example, materials for various electronic/electric apparatuses, including heat dissipation components for dissipating heat from components that generate heat, e.g., for semiconductor elements mounted in various electronic or electric apparatuses such as computers.

REFERENCE SIGNS LIST

11 Tears of graphite film
21 Roll 1
22 Roll 2
23 Graphite film
24 Suspended line
25 Sag
31 Widthwise direction of film
32 Lengthwise direction of film
33 Length of middle portion
34 Length (W) of one of both ends
35 Graphite film
36 Length (E) of the other of both ends
41 Graphite film having a sag in a middle portion
42 Graphite film having no sag
43 Graphite film having sags at both ends thereof.
44 Sag in middle portion
45 Sag at ends
46 Graphite film having sag at one end
51 Middle portion
52 Ends
53 Temperature measurement point of end 1
54 Temperature measurement point of middle portion
55 Temperature measurement point of end 2
56 Any widthwise direction
61 Heat treatment apparatus
62 Graphite weight
63 Polymer film
64 Graphite hearth
65 Temperature measurement point
71 Graphite cylindrical container
81 Wind-off device
82 Wind-up device
91 Sag at an outer edge
92 Sag at a point 30 mm away from the outer edge
101 Sag in the middle portion
111 Table
112 Graphite film
113 Positions of a ruler
121 Graphite film
122 Wind-off paper tube
123 Wind-up paper tube
124 Distance between both paper tubes
131 Sheet having a self-adhesive layer or an adhesive layer
132 Wind-off roll for the sheet having a self-adhesive layer or an adhesive layer
133 First roll
134 Second roll
135 Separator
136 Wind-up roll for separator
137 Bar as a trigger at which peeling of the separator is started
138 PET tape with separator
139 Width of the graphite film
1310 Width of the sheet having a self-adhesive layer or an adhesive layer
141 Graphite film
142 First roll
143 Angle formed by a line connecting (the starting point of contact between the first roll and the graphite film) and (the center point of the first roll) and a line connecting (the center point of the first roll) and (the point of contact between the first roll and the second roll)
144 Starting point of contact between the first roll and the graphite film
145 Center point of the first roll
146 Point of contact between the first roll and the second roll
151 Graphite composite film
152 Enlarged view
153 Laminating wrinkles
161 Roll of a carbonized film
162 Hearth
163 Direction of gravitational force
11' Graphite film having been subjected to rolling
12' MD direction
13' Wrinkle
151' Graphite composite film
152' Enlarged view
153' Laminating wrinkles
171 Angle b formed by a line connecting a starting point of contact between the raw graphite film and an upper rolling-mill roll and a center point of the upper rolling-mill roll and a line connecting the center point of the upper rolling-mill roll and a point of contact between the upper rolling-mill roll and a lower rolling-mill roll.
172 Starting point of contact between the upper rolling-mill roll and a graphite film
173 Center point of the upper rolling-mill roll
174 Point of contact between the upper rolling-mill roll and the lower rolling-mill roll
175 Upper rolling-mill roll
176 Lower rolling-mill roll
177 Graphite film
221 Graphite composite film
222 Enlarged view
223 Laminating wrinkles
231 Winding deviation of graphite film
241 Weight
242 Raw graphite film
243 Stage
251 Room temperature 252 During heat treatment
253 Raw graphite film
254 Inner core
261 Stage
262 Drive shaft
263 Inner core
264 Double-faced tape
265 Raw graphite film
266 Cross section after rewinding
267 Outermost radius of roll of raw graphite film
268 Center of the drive shaft
269 Radius of the inner core
2610 Winding thickness of raw graphite film
271 Cylindrical inner core made of graphite
272 External cylinder
273 Polyimide film wrapped around the cylindrical inner core
274 Apertures for ventilation
281 Anchorage
282 Carbonized film
291 Roll 1
292 Roll 2
293 Polymer film
294 Suspended line
295 Sag
296 Detachable shaft on which film is placed
2111 Roll start
2112 Roll end
2121 Sheet having a self-adhesive layer or an adhesive layer
2122 Wind-off roll for the sheet having a self-adhesive layer or an adhesive layer
2123 First roll
2124 Second roll
2125 Separator
2126 Wind-up roll for separator
2127 Bar as a trigger at which peeling of the separator is started
2128 Copper foil tape with separator
2129 Width of the graphite film
21210 Width of the sheet having a self-adhesive layer or an adhesive layer
21211 Wind-off roll for graphite film
21212 Graphite film
2131 Tears
2141 Raw graphite film
2142 Graphite film having been subjected to the straightening process
2151 Structure 1
2152 Structure 2
2153 Structure 3
2154 Structure 4
2155 Structure 5
2156 Structure 6
2157 LED chip
2158 Glass epoxy substrate
2159 Metallic substrate
21510 Graphite film
2161 Expandable inner core
2162 Raw graphite film
2163 State after expanded
2171 Jig having a small coefficient of thermal expansion
2172 Jig having a large coefficient of thermal expansion
2173 Carbonized film in sheet form

The invention claimed is:

1. A graphite film having i) a sag resulting from different lengthwise lengths of the graphite film across a width of the graphite film, the sag formed in a shape such that the graphite film is continuously more sagging in a center portion of the graphite film than at each edge portion of the graphite film, and ii) camber of less than 10 mm at said each edge portion of the graphite film, in accordance with JIS C2151, wherein
the center portion of the graphite film represents a portion located at an equal distance from both of ends of the graphite film in a width direction, and the ends of the graphite film in the width direction are defined as the edge portion of the graphite film.

2. The graphite film according to claim 1, wherein a b-value of the sag in the center portion of the graphite film of the graphite film is not less than 5 mm.

* * * * *